United States Patent
Keates

(10) Patent No.: US 11,721,786 B2
(45) Date of Patent: Aug. 8, 2023

(54) MICRO LIGHT-EMITTING DIODE DISPLAYS HAVING COLOR CORRECTION FILMS APPLIED THERETO

(71) Applicant: Intel Corporation, Santa Clara, CA (US)

(72) Inventor: Andrew Keates, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 892 days.

(21) Appl. No.: 16/455,673

(22) Filed: Jun. 27, 2019

(65) Prior Publication Data

US 2020/0411717 A1 Dec. 31, 2020

(51) Int. Cl.
| | |
|---|---|
| *H01L 29/08* | (2006.01) |
| *H01L 27/32* | (2006.01) |
| *H01L 51/52* | (2006.01) |
| *H01L 33/00* | (2010.01) |
| *H01L 25/16* | (2023.01) |
| *H01L 33/24* | (2010.01) |
| *H01L 33/50* | (2010.01) |

(52) U.S. Cl.
CPC ........ *H01L 33/0095* (2013.01); *H01L 25/167* (2013.01); *H01L 33/0075* (2013.01); *H01L 33/24* (2013.01); *H01L 33/502* (2013.01); *H01L 2933/0041* (2013.01)

(58) Field of Classification Search
CPC . H01L 27/322; H01L 25/167; H01L 51/0013; H01L 27/3211; H01L 33/50
See application file for complete search history.

(56) References Cited

U.S. PATENT DOCUMENTS

| | | | |
|---|---|---|---|
| 2008/0003519 A1* | 1/2008 | Felder | B41M 5/46 430/200 |
| 2015/0270319 A1* | 9/2015 | Ishii | H01L 27/3246 257/40 |
| 2018/0329258 A1* | 11/2018 | Ajichi | G02F 1/133609 |
| 2021/0005670 A1* | 1/2021 | Cho | H01L 51/56 |

\* cited by examiner

*Primary Examiner* — Anthony Ho
*Assistant Examiner* — David J Goodwin
(74) *Attorney, Agent, or Firm* — Schwabe, Williamson & Wyatt, P.C.

(57) ABSTRACT

Micro light-emitting diode displays having color correction films applied thereto and methods of applying color correction films to a display are described. In an example, a method of fabricating a micro light emitting diode display includes applying a color correction film to a flexible transparent backing film. The method also includes placing the flexible transparent backing film over a display with the color correction film facing the display. The method also includes applying a laser to a portion of the flexible transparent backing film to eject a patch of the color correction film onto the display.

20 Claims, 44 Drawing Sheets

MICRO LIGHT-EMITTING DIODE DISPLAYS HAVING COLOR CORRECTION FILMS APPLIED THERETO

TECHNICAL FIELD

Embodiments of the disclosure are in the field of micro-LED devices and, in particular, micro light-emitting diode displays having color correction films applied thereto and methods of applying color correction films to a display.

BACKGROUND

Displays having micro-scale light-emitting diodes (LEDs) are known as micro-LED, mLED, and μLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. Such primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

DESCRIPTION OF THE EMBODIMENTS

Figure 1A:
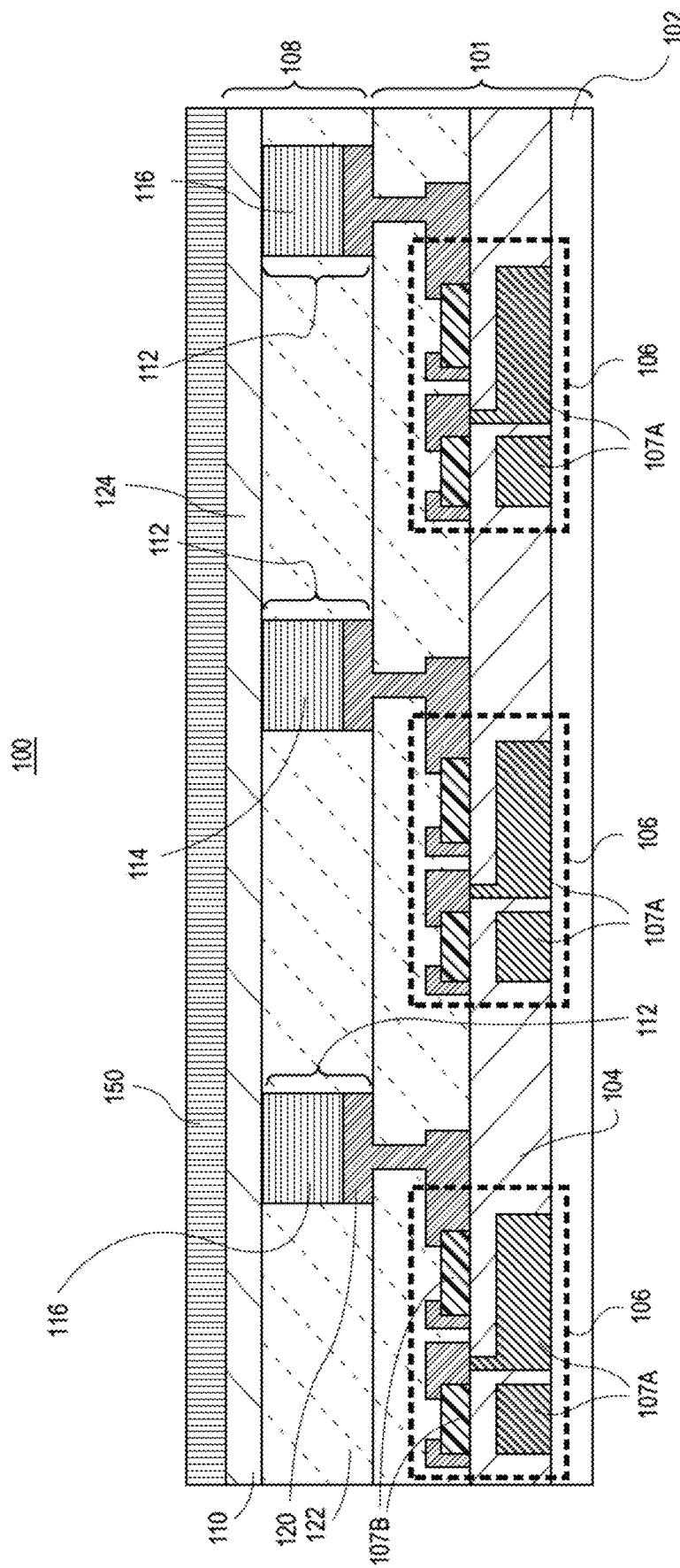
FIGS. 1A and 1B illustrate cross-sectional views of various operations in the fabrication of a pixel structure bonded to a display backplane and including a quantum dot layer.

Micro light-emitting diode displays having color correction films applied thereto and methods of applying color correction films to a display are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and architectures for micro LED displays. To provide context, displays based on inorganic micro LEDs (μLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured.

Micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide approximately 8 hours of additional battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

The "display" is the window for central processing unit (CPU) products in the PC business. Embodiments described herein may be applicable to fabricating low-power micro LED displays for use in Converged Mobility computing devices powered by CPUs. Currently, micro LED displays require improved optical design to maximize power efficiency.

In a first aspect of the present disclosure, structures for facile fabrication of micro LED displays with colloidal quantum dots are described. Graded index quantum dot films for low power micro LED displays are also described.

To provide context, micro-LED displays are expected to improve battery life by 50% compared to OLED displays in laptop devices. Micro-LED displays exhibit a great color gamut and brightness levels adequate for viewing in bright sunlight. One of the challenges of micro-LED displays is the creation of efficient red and green subpixels. In the absence of efficient red and green subpixels, an efficient blue pixel, converted to red and green by use of quantum dots, is described herein. Some embodiments described herein relate to structures that enable cost effective methods to apply quantum dots to a micro LED display.

Currently, the efficiency of red gallium nitride (GaN) based LEDs is approximately 10 times lower than desired by manufacturers. Although the efficacy of quantum dots has been demonstrated, quantum dots are expensive. Methods to deposit quantum dots on a screen have been wasteful of the depositing material, which is also expensive. Spin-coating a photoresist containing quantum dots has been described for applying quantum dots on circular wafers. Although such a process may be a reliable process, most of the expensive quantum dot material is etched away and wasted. Embodiments described herein enable the application of only as much quantum dot material as is necessary, with little to no waste.

In light of the above, state-of-the-art approaches for manufacturing displays have proven expensive due to the cost of material and inefficient material usage. The cost difference can be on the order or 10 times higher with early LED approaches. However, if no quantum dots (or other color conversion devices) are deployed, then low GaN red LED efficiency can leads to about 10 times higher power consumption than desired manufacturers. In an effort to minimize such problems, inkjet printing systems have been developed for forming the color conversion patterns on the substrates by depositing such patterns on the substrates in the form of special inks. The inkjet systems deposit the ink on the substrate through an inkjet head. However, the inkjet head includes a plurality of nozzles, and if even only one of such nozzles becomes dysfunctional, the number of passes that the inkjet printing head must make increases. For example, if the inkjet head has one hundred nozzles, and the sixtieth nozzle is damaged, only the first to fifty-ninth nozzles and the sixty-first to hundredth nozzles are available, and thus, in order to deposit ink over entire target region of the substrate, the inkjet head must be moved, or offset, by a selected interval so as to deposit ink on the region corresponding to the sixtieth nozzle. As a result, processing time and costs are substantially increased. Additionally, since all of the nozzles of the inkjet head must be kept in good operating condition, downtime increases and process stability margins deteriorate. The flat panel display industry has been attempting to employ inkjet printing to manufacture display devices and, in particular, color filters. However, one problem with effective employment of inkjet printing is that it is difficult to inkjet ink or other material accurately and precisely on a substrate while having high throughput. Embodiments described herein address such issues. In some embodiments, redundant nozzles are used in printing heads. In some embodiments, stripes (not patches) of quantum dot (QD) material are fabricated on red sub pixels to address throughput issues.

In previous approaches, quantum dots are combined with a photoresist. The resulting mixture is spin-coated or drop-cast onto a display. Photolithography is then used to pattern the quantum dot photoresist film where they need to be. In accordance with one or more embodiments described herein, a new structure and technique for the selective deposition of colloidal quantum dots on specific areas of display backplane is described which takes advantage of photocatalytic and photoinduced superhydrophilic properties of titanium dioxide ($TiO_2$). Embodiments described herein may be implemented to achieve a practical application of quantum dots in micro LED displays.

As used herein, a quantum dot (QD) can refer to a crystalline inorganic particle that is spherically or nearly spherically shaped and has diameters between 2 and 50 nm. Optical properties of QDs (e.g., emission wavelength) are exquisitely sensitive to the precise size of the particle, and thus, allow one to tune them simply by controlling their size. For a given quantum dot, the emission band is dependent on the size of the quantum dot. In an embodiment, QDs described herein are cadmium-based QD systems. With respect to Cd-free quantum dots, however, an InP-based Quantum Dot material system has been claimed to be able to match the color performance of the industry's best cadmium-based materials without requiring an exemption to the European Union's RoHS Directive. Indium phosphide (InP) is a direct gap material with a band gap of 1.27 eV, which is suitable for achieving visible emission in the quantum confinement regime. As-prepared InP QDs generally show weak luminescence because of the existence of non-radiative carrier recombination originating from surface states. However, after over coating with a ZnS shell, InP QDs become highly luminescent. InP QDs are also attractive due to the stronger covalent bond as compared with the ionic bond in CdS QDs, increasing their photostability.

In an embodiment, a conductive oxide layer, such as an indium tin oxide (ITO) layer, of a display backplane is first coated with a thin film of titanium oxide or dioxide ($TiO_x$, or $TiO_2$) using a sol-gel method, for example. The surface of the titanium oxide or dioxide film is then modified with fluoroalkylsilane by using a self-assembly method. The surface of the titanium oxide or dioxide becomes hydrophobic after the treatment with fluoroalkylsilane (i.e., the contact angle of water may be greater than) 100°. The receiving substrate is then irradiated with ultraviolet light through a photomask to create a pattern with different degrees of wettability on different areas. The irradiation changes the contact angle of water on the irradiated surface to 0°, while no change occurs for the non-irradiated surface. Not to be bound by theory, but as best understood, the change in the contact angle of the irradiated portion derives from the photocatalytic and photoinduced superhydrophilic properties of titanium oxide or dioxide, where $TiO_2$ is a unique photocatalyst that does not exhibit irreversible photocorrosion, but which does display photoinduced superhydrophilic properties.

In an embodiment, in order to selectively deposit colloidal quantum dot films on a display backplane, the display backplane is inserted or dipped into an aqueous suspension containing the quantum dots to fabricate a pattern consisting of a colloidal crystal film. The liquid surface is concave above the hydrophilic surface, while it is convex over the hydrophobic area. Colloidal crystals form over the hydrophilic areas during the lifting process, while no film or essentially no film is formed on the hydrophobic regions.

Advantages to implementing embodiments described herein may include low manufacturing cost as achieved by using a lesser amount of color conversion film(s) material (which can be very expensive), and/or low power display.

Figure 1B:
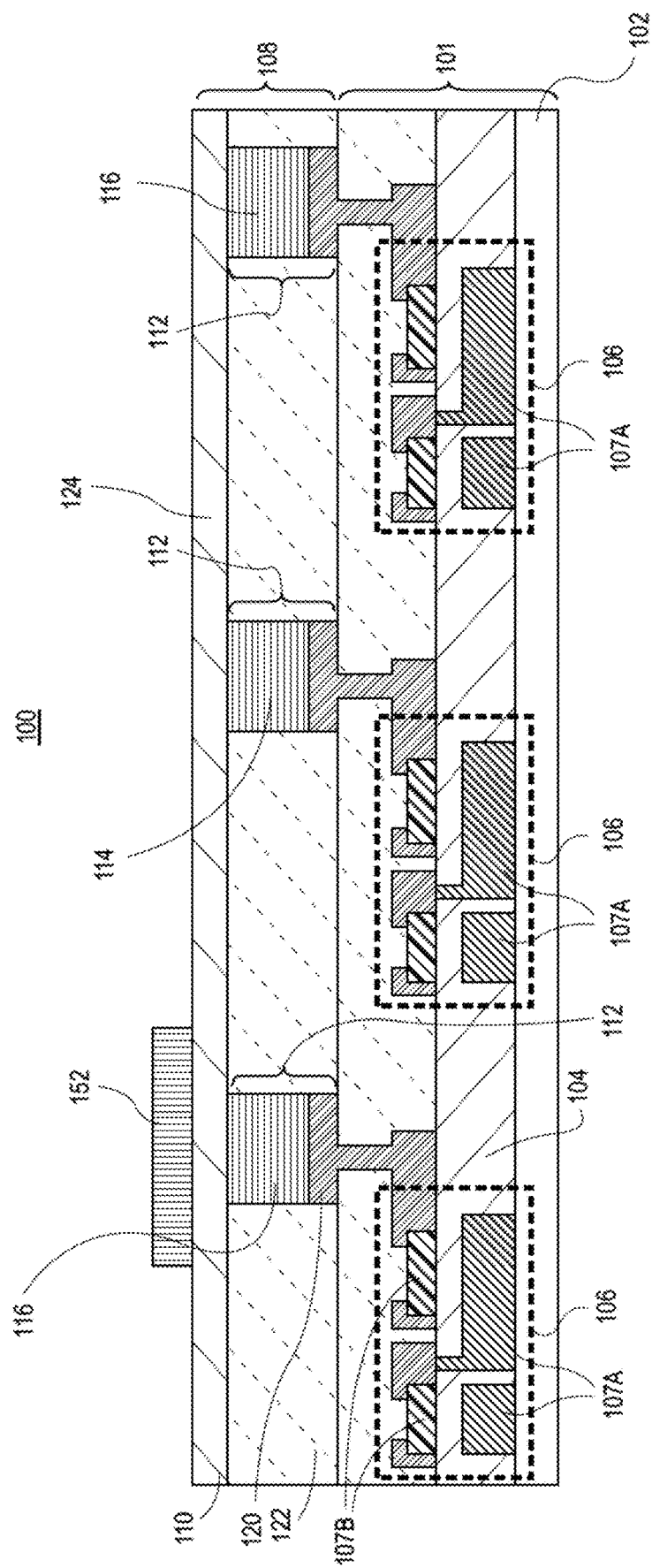

To provide background, FIGS. 1A and 1B illustrate cross-sectional views of various operations in the fabrication of a pixel structure bonded to a display backplane and including a quantum dot layer.

Referring to FIG. 1, a pixel structure 100 includes a backplane 101. The backplane 101 includes a glass substrate 102 having an insulating layer 104 thereon. Pixel thin film transistor (TFT) circuits 106 are included in and on the insulating layer 104. Each of the pixel TFT circuits 106 includes gate electrodes 107A, such as metal gate electrodes, and channels 107B, such as polycrystalline silicon channels or IGZO channels. A portion of the insulating layer 104 may act as a gate dielectric for each of the pixel TFT circuits 106. A conductive mirror 122 is over each of the TFT circuits 106.

Referring again to FIG. 1, the pixel structure 100 includes a front plane 108 on the backplane 101. The front plane 108 includes LEDs in a dielectric layer 122, such as a carbon-doped oxide layer. In the example shown, three micro LEDs 112 are included. Each micro LED includes a corresponding micro light emitting diode device 114, 116 (left) or 116 (right) on a conductive interconnect structure 120, such as a conductive bump. In a particular embodiment, micro light emitting diode devices 114, 116 (left) and 116 (right) are green, blue and blue micro light emitting diode devices, respectively. The front plane 108 also includes a transparent conducting oxide layer 124, such as a layer of indium tin oxide (ITO), as a cathode of the pixel structure 100.

A photoresist film 150 loaded with quantum dots (QDs), i.e., a quantum dot photoresist (QDPR), is spin-coated on the display plane then patterned using lithography. Referring to FIG. 1B, the photoresist film 150 is then patterned to form a layer 152 including color conversion devices (QDs). In this case, the technology can achieve very high resolution but it may be accompanied by wasting approximately 90% of an expensive material.

Figure 2:
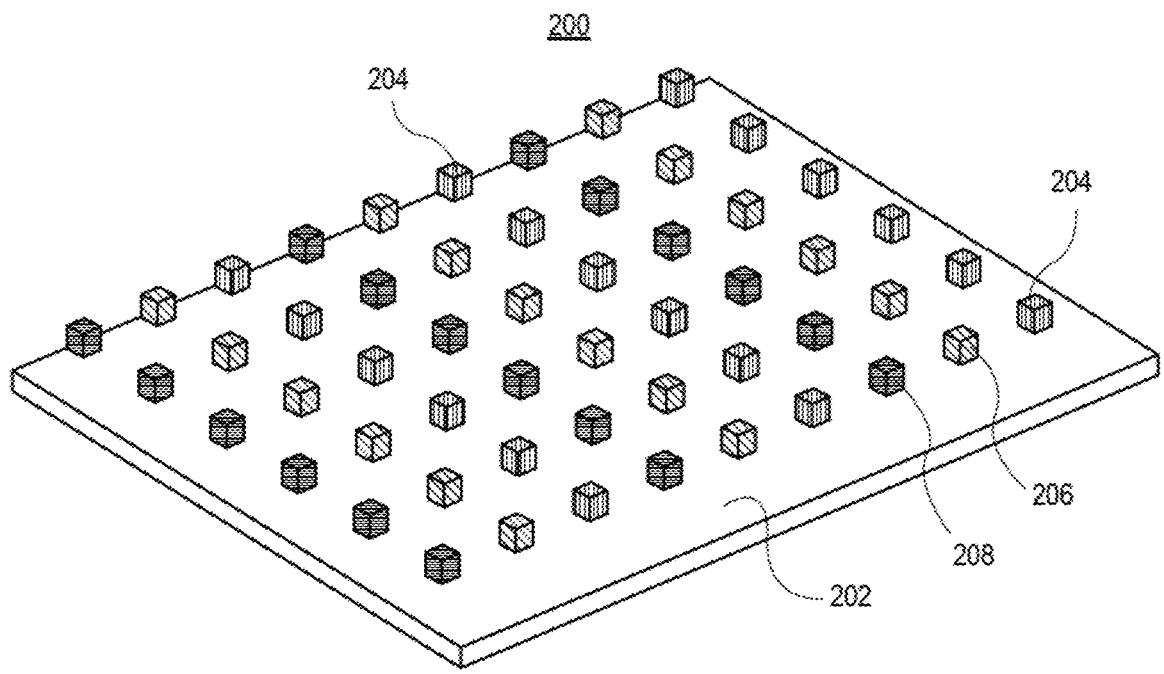
FIG. 2 illustrates a micro LED arrangement on a display backplane using available efficient red, green, and blue micro LEDs, in accordance with an embodiment of the present disclosure.

FIG. 2 illustrates a micro LED arrangement on a display backplane using available efficient red, green, and blue micro LEDs, in accordance with an embodiment of the present disclosure. Referring to FIG. 2, a display 200 includes a backplane 202 having red 204 green 206 and blue 208 micro LEDs thereon. Three micro LEDs per color per pixel are used to guarantee or essentially guarantee that at least one of each color will work, resulting in high production yield.

To provide further context, the phenomenon of superhydrophobicity has evolved over millions of years in nature and manifests itself in examples such as lotus leaves. Superhydrophobic surfaces are defined as those that exhibit water contact angles exceeding 150°. Superhydrophobicity results from a combination of intrinsic hydrophobic properties of the material that forms the surface as well as microscale and nanoscale roughness of that surface. The term "superhydrophobic" as used throughout this specification can infer that a subject superhydrophobic pattern of micro-scale features is not immediately wetted by a liquid having a surface tension greater than about 70 dynes per centimeter (d/cm). While a contact angle with water greater than 150° is called a super hydrophobic surface, a contact angle of less than 10° is called a super hydrophilic surface.

Figure 3:
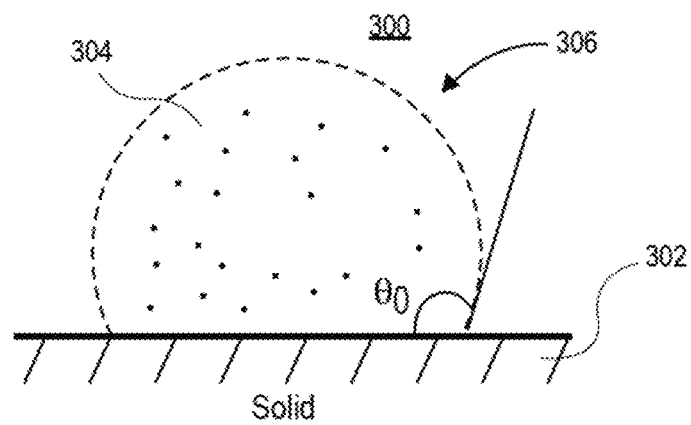
FIG. 3 illustrates the concept of a contact angle, in accordance with an embodiment of the present disclosure.

FIG. 3 illustrates the concept of a contact angle, in accordance with an embodiment of the present disclosure. Referring to FIG. 3, a structure 300 includes a solid 302 having a liquid 304 thereon. A contact angle $\theta_0$ is shown for the liquid 304 to a tangent that is directed through air 306.

In accordance with one or more embodiments described herein, the surface of a layer of $TiO_2$ is caused to become hydrophobic after the treatment with a fluoroalkylsilane (i.e., the contact angle of water may be 100° after treatment). When a film of $TiO_2$ is irradiated with UV light, active oxygen can be generated on the surface of the $TiO_2$ film as a result of a photo redox reaction. The active oxygen, which is a photogenerated chemical species, can have a very strong redox potential. The strong redox potential can be sufficient to decompose the fluoroalkylsilane that is adsorbed on the $TiO_2$ surface. In addition, the UV irradiation can create surface oxygen vacancies on the $TiO_2$ layer, which can render the surface favorable for the adsorption of dissociative water. This in turn can cause the surface of the $TiO_2$ to become superhydrophilic. Consequently, the unique properties of the $TiO_2$ can allow for facile and precise patterning of the $TiO_2$ surface to provide a large contrast in wettability.

Figure 4:
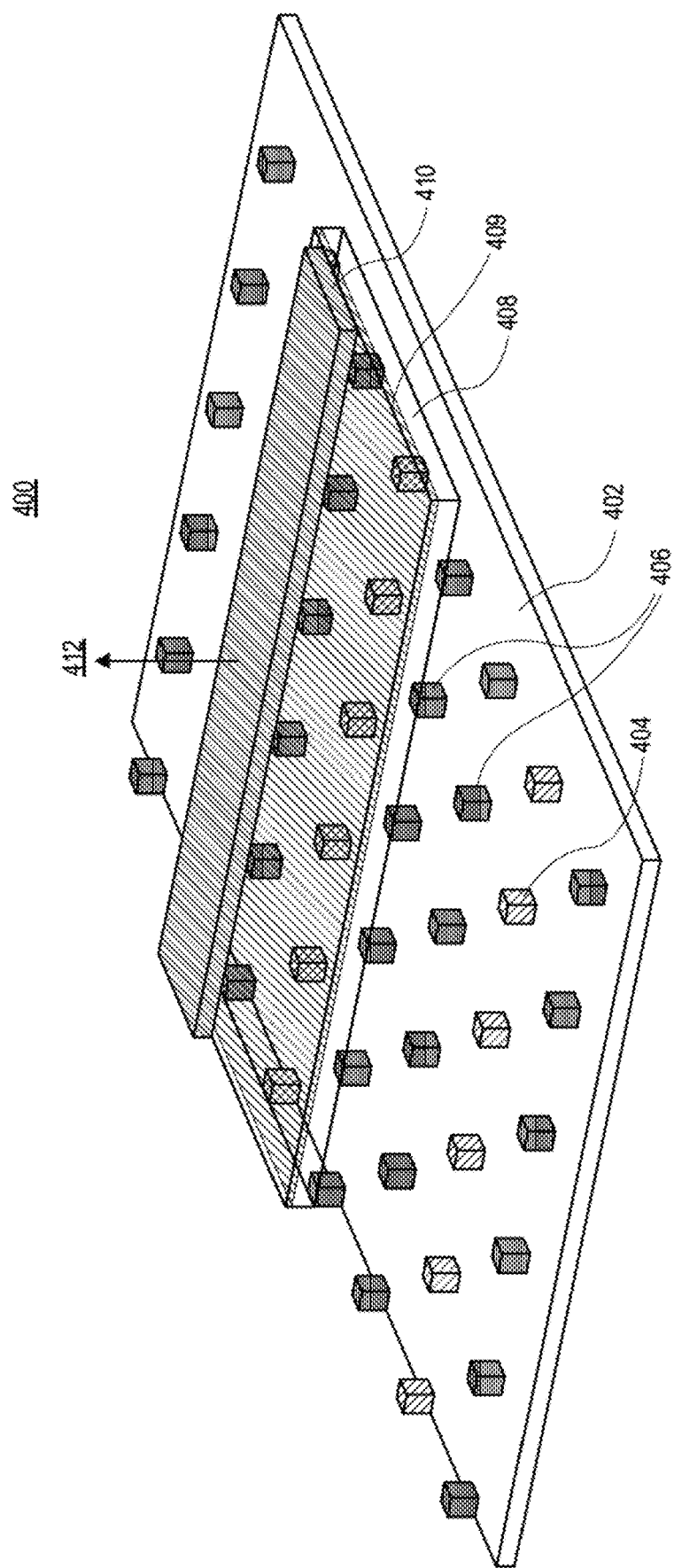
FIG. 4 illustrates a portion of a display assembly structure with a titanium oxide film used to create a hydrophobic-hydrophilic pattern, followed by "wetting" the hydrophilic areas with a quantum dot ink, in accordance with an embodiment of the present disclosure.

FIG. 4 illustrates a portion of a display assembly structure with a titanium oxide (e.g., $TiO_2$) film used to create a hydrophobic-hydrophilic pattern, followed by "wetting" the hydrophilic areas with a quantum dot ink, in accordance with an embodiment of the present disclosure. Referring to FIG. 4, a display assembly 400 includes a backplane 402. The backplane 402 has green micro LEDs 404 and blue micro LEDs 406 thereon. In one embodiment, there are two blue micro LEDs 406 for every green micro LEDs 404. A conductive oxide layer 408, such as an indium tin oxide (ITO) layer, is shown over a portion of the LEDs, however, it is to be appreciated that the conductive oxide layer 408 can be formed over all of the LEDs. A titanium oxide layer 409 (e.g., $TiO_2$) is on the conductive oxide layer 408. In one embodiment, half of the blue micro LEDs 406 have a quantum dot ink 410 there over. In one embodiment, the quantum dot ink 410 is included to convert blue light from the half of the blue micro LEDs 406 to red light 412. It is to be appreciated that a $TiO_2$ film as deposited on top of the conductive oxide layer 408 can be detectable in the final display assembly 400.

As described above, a portion of a display assembly structure can include a $TiO_2$ film to create a hydrophobic-hydrophilic pattern. The structure facilitates "wetting" of the hydrophilic areas with a quantum dot ink (e.g., to convert blue light to red light). As an exemplary pixel architecture, FIG. 5 illustrates a cross-sectional view of a pixel structure bonded to a display backplane and including a layer having a hydrophilic portion and a hydrophobic portion and a quantum dot ink on the hydrophilic portion, in accordance with an embodiment of the present disclosure.

Figure 5:
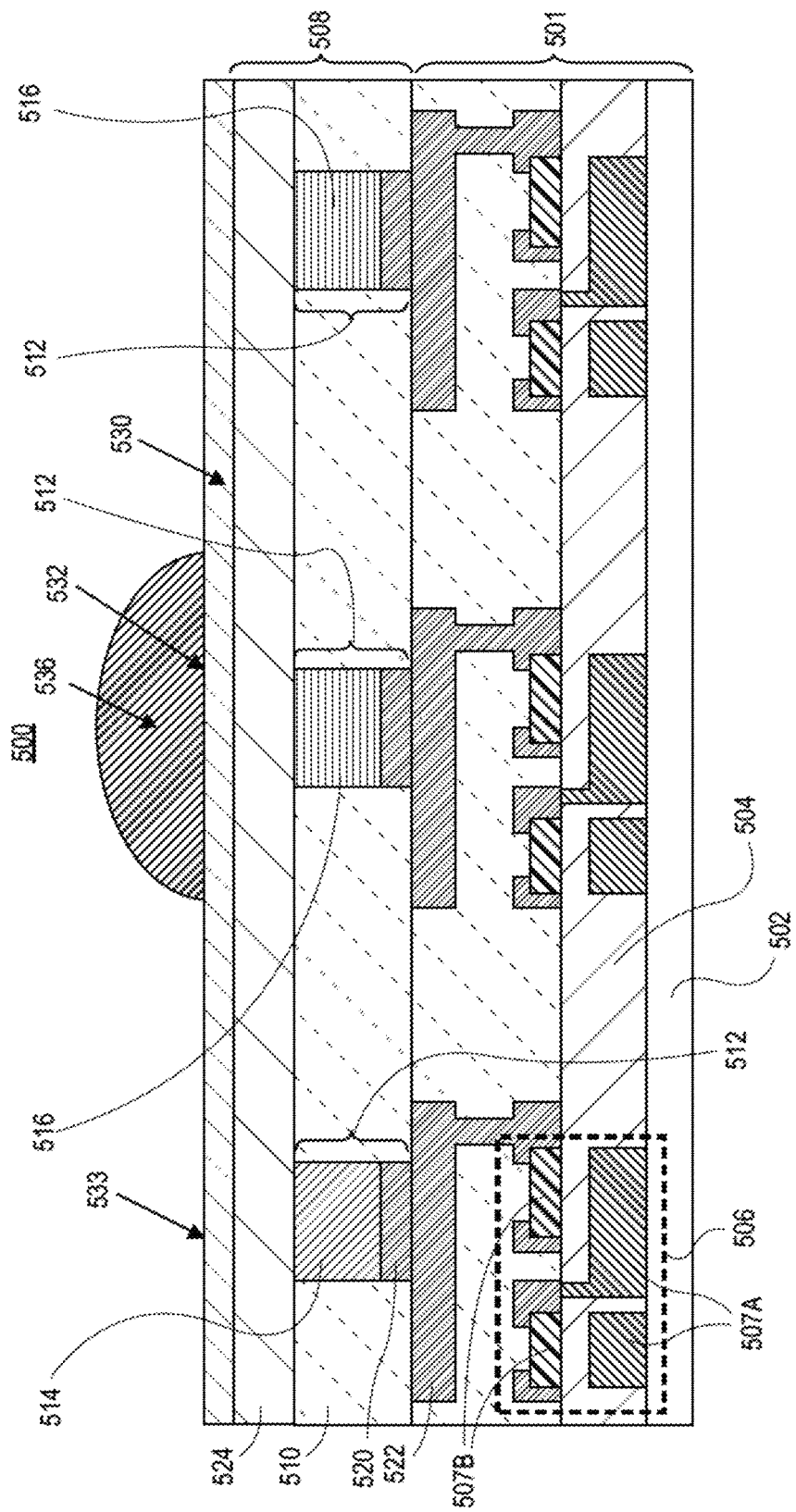
FIG. 5 illustrates a cross-sectional view of a pixel structure bonded to a display backplane and including a layer having a hydrophilic portion and a hydrophobic portion and a quantum dot ink on the hydrophilic portion, in accordance with an embodiment of the present disclosure.

Referring to FIG. 5, a pixel structure 500 includes a backplane 501. The backplane 501 includes a glass substrate 502 having an insulating layer 504 thereon. Pixel thin film transistor (TFT) circuits 506 are included in and on the insulating layer 504. Each of the pixel TFT circuits 506 includes gate electrodes 507A, such as metal gate electrodes, and channels 507B, such as polycrystalline silicon channels or IGZO channels. A portion of the insulating layer 504 may act as a gate dielectric for each of the pixel TFT circuits 506. A conductive mirror 522 is over each of the TFT circuits 506.

Referring again to FIG. 5, the pixel structure 500 includes a front plane 508 on the backplane 501. The front plane 508 includes LEDs in a dielectric layer 510, such as a carbon-doped oxide layer. In the example shown, three micro LEDs 512 are included. Each micro LED includes a corresponding micro light emitting diode device 514, 516 (left) or 516 (right) on a conductive interconnect structure 520, such as a conductive bump. In a particular embodiment, micro light emitting diode devices 514, 516 (left) and 516 (right) are green, blue and blue micro light emitting diode devices, respectively. It is to be appreciated that other arrangements may be used, including variation in number and/or colors of micro LED devices included. The front plane 508 also includes a transparent conducting oxide layer 524, such as a layer of indium tin oxide (ITO), as a cathode of the pixel structure 500. In an embodiment, a titanium oxide layer 530

(e.g., TiO$_2$) is on or above the transparent conducting oxide layer 524. The titanium oxide layer 530 has a portion with a hydrophilic surface 532 and another portion with a hydrophobic surface 533. A quantum dot ink 536 is on the hydrophilic surface 532 but not on hydrophobic surface 533. In one embodiment, the quantum dot ink 536 is a red quantum dot ink and is over the blue light emitting diode device 516 (left). In an embodiment, the light emitting diode device 516 (left) is a blue light emitting diode device, and the quantum dot ink 536 converts blue light from the blue light emitting diode device to red light.

In an embodiment, each of the pixel TFT circuits 506 is a circuit such as circuit 3950, described below. In one embodiment, each of the pixel thin film transistor circuits 506 includes a current mirror and a linearized transconductance amplifier coupled to the current mirror, as described in greater detail below. In an embodiment, the plurality of micro light emitting diode devices 514, 516 (left) and 516 (right) is a plurality of GaN nanowire-based or nanopyramid-based micro light emitting diode devices. Embodiments described herein may be based only on the back plane 501 described above. Embodiments described herein may be based only on the front plane 508 described above.

To provide further context, one potential key to realizing the promised power reductions with micro LED displays is the fabrication of LEDs with high power efficacies for the three color (red, green, and blue) LED emitters. Currently, the efficiency of red GaN based LEDs is about 10 times lower than desired by manufacturers. Color conversion devices (e.g., quantum dot films) are proposed to convert blue light to red light.

However, the efficiency of quantum dot films can be limited by internal reflections due to a high refractive index of InP used to fabricate the quantum dots. The internal reflections can reduce the external quantum efficiency below the required value to produce target display power dissipation. The color conversion efficiency of InP-based quantum dot films may be limited to about 35% for red color due to high refractive index of InP QD films that cause Fresnel reflections that prevent red light from reaching a viewer's eyes. This effect, coupled with an external quantum efficiency for blue micro LEDs limited to only about 14%, can result in external quantum efficiency of a red emitter as limited to 14×35/100=4.9%, which is lower than the desired efficiency of greater than about 6% sought by manufacturers to reduce the display emitter power by two times compared to state-of-the-art organic LED (OLED) displays.

Figure 6:
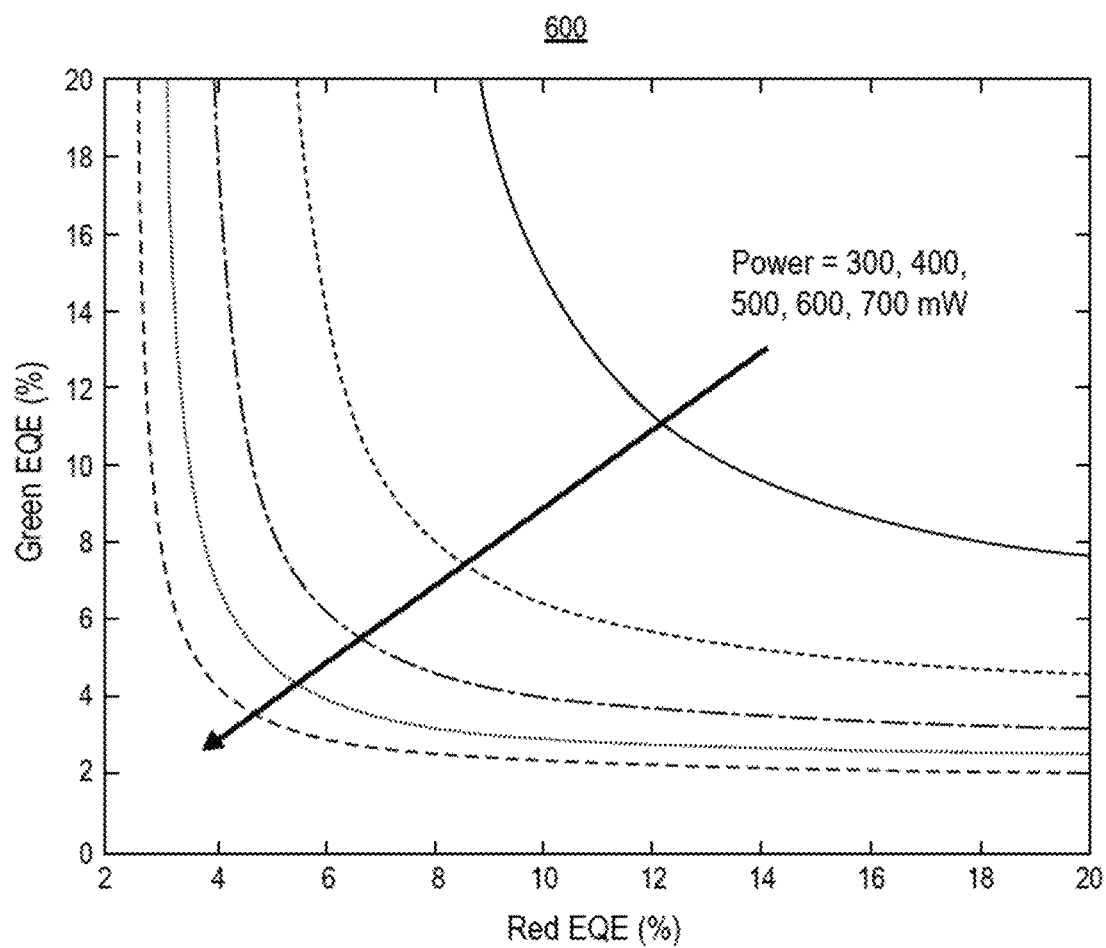
FIG. 6 is a plot showing required red and green external quantum efficiencies for a given target power dissipation, in accordance with an embodiment of the present disclosure.

FIG. 6 is a plot 600 showing required red and green external quantum efficiencies for a given target power dissipation, in accordance with an embodiment of the present disclosure. Referring to plot 600, each curve represents one target power dissipation. For lower power, higher external quantum efficiencies for both red and green emitters are needed. In the simulations of plot 600, the external quantum efficiency for a blue emitter is fixed at 14%.

One or more embodiments described herein can be implemented to provide high efficiency light emitting devices containing quantum dots and a reliable approach for reducing Fresnel reflection. In an embodiment, quantum dot films are fabricated with graded refractive index using a non-uniform volume fraction of InP quantum dots in a hosting matrix film with a low refractive index (e.g., about 1.5). In an embodiment, a laser printing method and apparatus are used to selectively deposit a quantum dot film on pre-specified coordinates on a display area. In one such approach, a pulsed laser beam is directed through a laser-transparent substrate or carrier plate to strike a release layer thin film of material coated on the opposite side of the substrate or carrier plate on which the quantum dot film has been deposited. Not to be bound by theory, but as best understood, the laser vaporizes the release layer material as it absorbs the laser radiation and, due to the transfer of momentum, the quantum dot film is locally removed from the carrier plate and is deposited on a receiving substrate that is placed "in proximity" to the target substrate.

Figure 7:
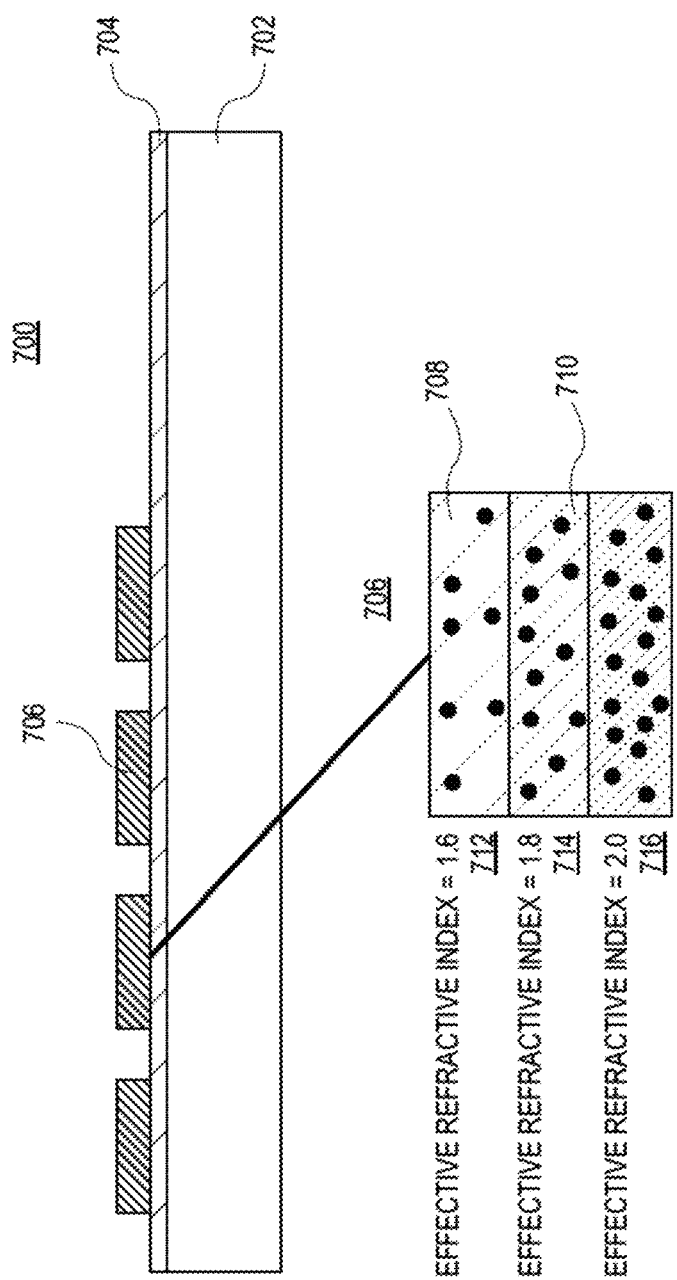
FIG. 7 is a cross-sectional view and associated exploded view of a structure having a graded index quantum dot film, in accordance with an embodiment of the present disclosure.

FIG. 7 is a cross-sectional view and associated exploded view of a structure having a graded index quantum dot film, in accordance with an embodiment of the present disclosure. Referring to FIG. 7, a delivery structure 700 includes a glass plate 702 having a release layer 704 thereon. A plurality of regions of graded index quantum dot film 706 are on the release layer 704.

An exploded view of one of the plurality of regions of graded index quantum dot film 706 shows the host matrix 708 having InP quantum dots 710 therein. An upper portion 712 has an effective refractive index of 1.6, for example. A middle portion 714 has an effective refractive index of 1.8, for example. A lower portion 716 has an effective refractive index of 2.0, for example.

With reference again to FIG. 7, in an embodiment, the volume fraction of QDs 710 is varied from 50% to 20% to achieve an effective refractive index range of 2.0 to 1.6. The host matrix material 708 can have a refractive index of 1.5. The InP quantum dots 710 can have a refractive index of about 4.07. The material of host matrix 708 is preferably a polymer, however, the matrix material may also be, but is not limited to, a silicone, epoxy, acrylic, plastic, or glass. Each individual region of graded index quantum dot film 706 can be referred to as a color conversion device.

Advantages of implementing one or more embodiments described herein may include the fabrication of a low power display. The advantages may be achieved or realized by increasing the external quantum efficiency of red and green emitters.

With respect to an assembly method and device, in an embodiment, an area of about 25 μm×25 μm and thickness between 1 μm-10 μm of a color conversion device 706 can be transferred from a carrier plate 702 to a display backplane. First, a carrier plate composed of a material that is transparent to UV and IR lasers (e.g., a glass carrier plate) is coated with a light (UV or IR) sensitive release layer such as a polymer. A uniform color conversion film is then spin-deposited on the release layer. The color conversion film may be patterned with circular or square shapes, e.g., with area in the range 100 μm$^2$ to 900 μm$^2$. Once the target carrier with the color conversion devices is generated, it is aligned and is placed in closed proximity to a target display substrate with specific sites patterned to have grooves in order to accept the color conversion device. In one embodiment, an external energy source (e.g., heat, UV, IR) with precise application is used to selectively release the color conversion devices 706 into the targeted grooves on the display substrate.

In accordance with an embodiment of the present disclosure, a method for transferring color conversion devices to a display backplane includes providing a laser, providing a receiving backplane, providing a carrier substrate having a laser-transparent support with a back surface and a front surface. The front surface has a release layer composed of, e.g., amorphous silicon or polymer, thereon. The release layer has a color conversion (quantum dot) film thereon. In one embodiment, the release layer is more volatile than the quantum dot film when exposed to laser energy. The laser can be positioned in relation to the carrier substrate. The carrier substrate is then exposed to laser energy from the laser so that the laser energy is directed through the back surface of the laser-transparent support to strike the release layer at a defined carrier location or coordinates with sufficient energy to volatilize the release layer at the location, causing the color conversion device (film) to be released from the surface of the support. The receiving backplane substrate is positioned in a spaced relation to the carrier substrate so that the at least one color conversion device with area of approximately 25 μm×25 μm is deposited at a defined receiving location on the receiving substrate. In one embodiment, the sites requiring color conversion on backplane substrate are designed to have micro size grooves that are slightly larger in size compared to the color conversion device being released, such that color conversion device can be properly accommodated in the grooves. The method further involves depositing a dielectric sealant layer on top of color conversion devices positioned in the micro groove in the backplane so that the quantum dot film is encapsulated by the sealant dielectric material.

In one embodiment, the release layer is amorphous silicon or polymer. In one embodiment, the receiving substrate is configured to have a trench or micro groove for receiving said color conversion device. In one embodiment, the color conversion device is a film containing quantum dots or nanophosphors. In one embodiment, post color conversion device transfer, a thermal/anneal and clean treatment can be applied for the benefit of removing unwanted elements (e.g., carrier liquid) in color conversion film and densify/cure the color conversion device film atop target site. In one embodiment, the quantum dots are composed of an InP-based material system. In one embodiment, the nanophosphors are composed of InGaN-based structures such as nanowires or nanopyramids. In one embodiment, the receiving substrate is configured to have a number of micro grooves that is an integer number of the number of red subpixels on the display. In one embodiment, the receiving substrate is configured to have number of micro grooves that is an integer number of the number of green subpixels on the display. In one embodiment, the color conversion device converts blue light to red light. In one embodiment, the color conversion device converts blue light to green light. In one embodiment, the color conversion device converts blue light to orange light. In one embodiment, the release layer ranges from about 1 nm to about 50 nm in thickness. In one embodiment, the laser energy ranges from about 10 mJ/cm2 and 10 J/cm2. In one embodiment, the color conversion devices have square or circle shapes. In one embodiment, the release layer is uniform in thickness.

Figure 8A:
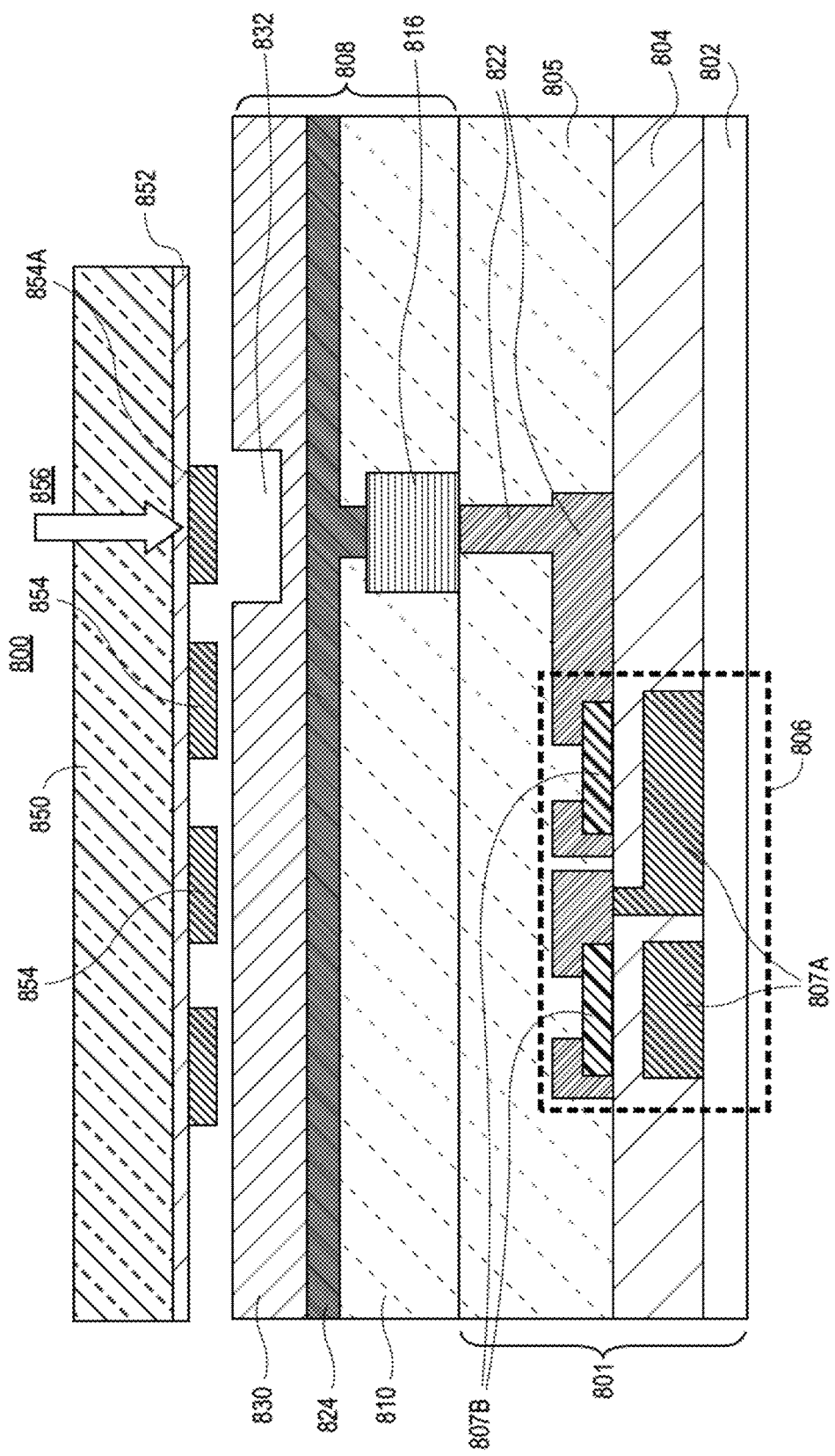
FIGS. 8A and 8B illustrate cross-sectional views of various operations in an align and release process to transfer color conversion devices (CCDs) from a carrier glass plate to a display backplane, in accordance with an embodiment of the present disclosure.
Figure 8B:
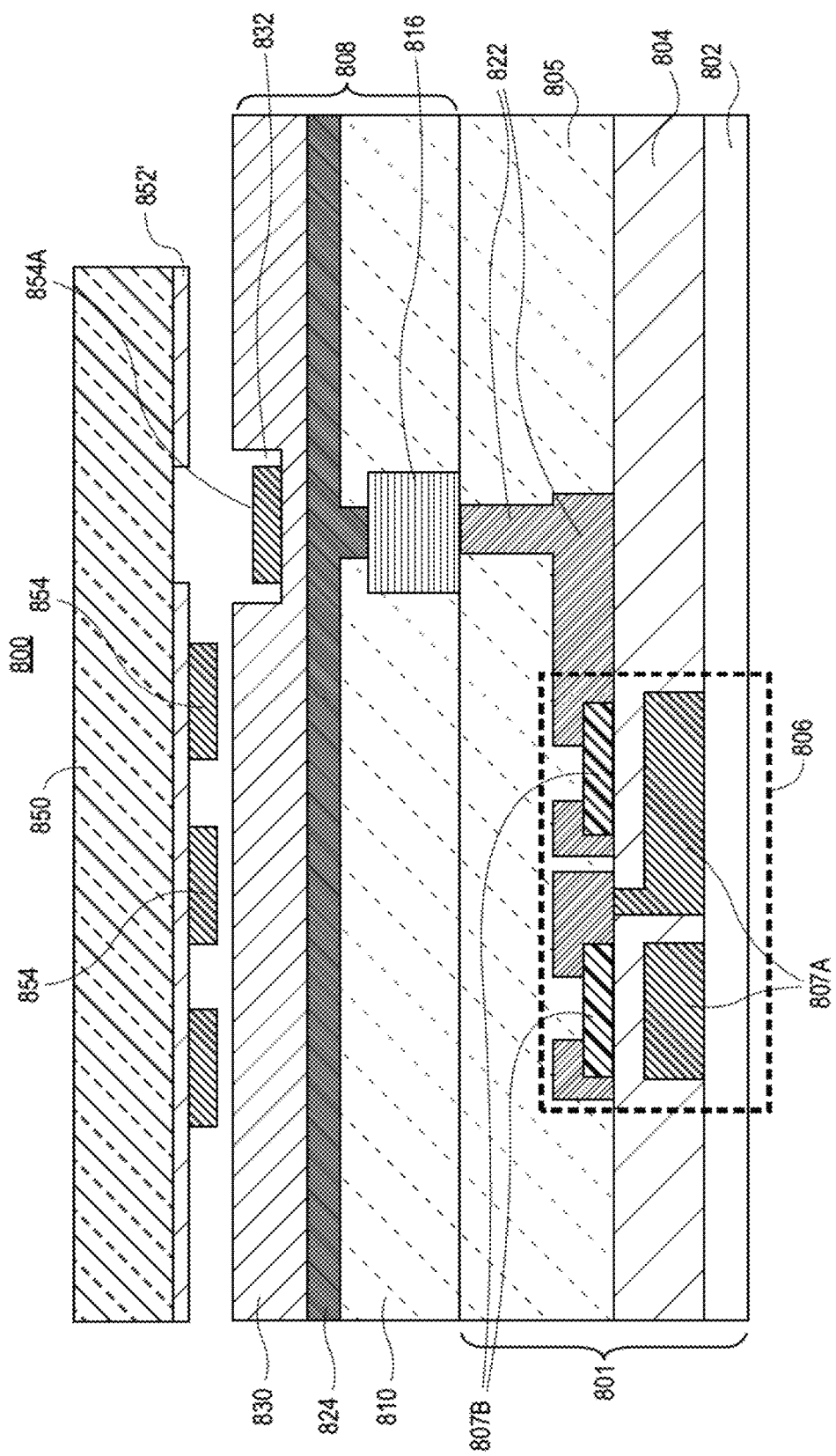

As an example, FIGS. 8A and 8B illustrate cross-sectional views of various operations in an align and release process to transfer color conversion devices (CCDs) from a carrier glass plate to a display backplane, in accordance with an embodiment of the present disclosure.

Referring to FIG. 8A, a starting structure 800 includes a backplane 801. The backplane 801 includes a glass substrate 802 having an insulating layer 804 thereon. A pixel thin film transistor (TFT) circuit 806 is included in the insulating layer 804 and in a dielectric layer 805 (such as a carbon-doped oxide layer) on the insulating layer 804. The pixel TFT circuit 806 includes gate electrodes 807A, such as metal gate electrodes, and channels 807B, such as polycrystalline silicon channels or IGZO channels. A portion of the insulating layer 804 may act as a gate dielectric for the pixel TFT circuit 806. An interconnect 822 is in the dielectric layer 805 and is coupled to TFT circuit 806.

Referring again to FIG. 8A, the starting structure 800 includes a front plane 808 on the backplane 801. The front plane 808 includes an LED 816 in a dielectric layer 810, such as a carbon-doped oxide layer. In the example shown, a single micro LED is included. In a particular embodiment, micro light emitting diode device 816 is a blue micro light emitting diode device. The front plane 808 also includes a transparent conducting oxide layer 824, such as a layer of indium tin oxide (ITO), as a cathode of the starting structure 800.

In an embodiment, the pixel TFT circuit 806 is a circuit such as circuit 3950, described herein. In one embodiment, the pixel thin film transistor circuit 806 includes a current mirror and a linearized transconductance amplifier coupled to the current mirror, as described in greater detail below. In an embodiment, the micro light emitting diode device 816 is a GaN nanowire-based or nanopyramid-based micro light emitting diode device. Embodiments described herein may be based only on the back plane 801 described above. Embodiments described herein may be based only on the front plane 808 described above. With reference again to FIG. 8A, the anode and cathode contacts of the micro LEDs are shown. A common anode electrode (e.g., indium tin oxide) connects all anodes of all micro LEDs as shown. The cathodes are connected to pixel circuits as shown.

Referring again to FIG. 8A, a dielectric layer 830 (such as a SiO$_2$ layer) is on the transparent conducting oxide layer 824. The dielectric layer 830 has a microgroove 832 therein. An "align & release" process of color conversion devices 854 (CCDs) such as quantum dot films is performed from a carrier glass plate 850 to the display starting structure 800 (i.e., 801/808). A particular CCD 854A is first deposited on the carrier glass 850 that has been coated with a "release layer" 852. The release layer 852 is ablated upon exposure to laser irradiation 856 through the glass carrier plate 850, and the CCD 854A is released and deposited inside microgroove 832. It is to be appreciated that the alignment between the blue micro LED 816, the microgroove 832, and the CCD 854A is important. In an embodiment, the size of the microgroove 832 is slightly larger than the size of the CCD 854A. In one embodiment, the size of the microgroove 832 is larger than the size of the micro LED 816. Referring to FIG. 8B, the display backplane is depicted following deposition of the Color Conversion Device (CCD) 854A into microgroove 832. The remaining release layer 852' is depicted with the ablated portion removed. In one embodiment, the CCD 854A is or includes red color converter quantum dots or nanophosphors and, in a particular embodiment, micro LED 816 is a blue micro LED.

In an embodiment, a graded index quantum dot film described herein facilitates fabrication of high efficiency light emitting devices and a reliable approach to reducing Fresnel reflection. In an embodiment, a lighting device includes a light source (e.g., a micro LED emitting blue light), a first luminescent layer disposed on top of the light source, and a second luminescent layer disposed on top of the first luminescent layer. The light source has a source refractive index (e.g., for InGaN/GaN based material system the refractive index is about 2.7). The first luminescent layer includes a first quantum dots composition dispersed in a first matrix material. A first volume fraction of the first quantum dots composition is arranged so that the first effective refractive index of the first luminescent layer is equal to or less than the source refractive index. The second luminescent layer includes a second quantum dots composition dispersed in a second matrix material. A second volume fraction of the second quantum dots composition is arranged so that the second effective refractive index of the second luminescent layer is less than the first effective refractive index of the first luminescent layer. In another embodiment, a plurality of luminescent layers is used with refractive indexes that are gradually decreasing from the value of the light source material to the top luminescent layer.

In accordance with an embodiment of the present disclosure, an arrangement of layers with gradient refractive indices helps minimize the index difference at the layer interfaces. Thus, the Fresnel reflections at the layer interfaces, as well as the overall reflection, can be significantly reduced. The InP quantum dots may be over coated with a ZnS shell to passivate the surface states and to increase the quantum efficiency. In an embodiment, the quantum dots have an average particle diameter of 3 nm and an emission peak at 630 nm. The refractive index of InP quantum dots may be about 4.07 at 450 nm. In an embodiment, the volume fraction of quantum dots in the first luminescent layer is about 30%. In an embodiment, the material of matrix of CCD 854A is preferably a polymer, however, the matrix material may also be, but is not limited to, a silicone, epoxy, acrylic, plastic, or glass. The refractive index of matrix may be about 1.5. If the quantum dots are introduced in liquid phase, the solvent may be removed by evaporation after quantum dots are dispersed in the matrix.

To provide further context, the effective refractive index of a quantum-dots-containing layer may be determined as follows: neff=nQD×c+nmatrix×(1−c), where neff is the effective refractive index, nQD and nmatrix are the refractive indices of the quantum dots and matrix, respectively; and c is the volume fraction of quantum dots in the layer. Thus, the effective refractive index of the first luminescent layer may be about 2.3 at a quantum dots volume fraction of 30%. (nQD=4.07 for InP quantum dots, c=0.3, and nmatrix=1.5). In an embodiment, the effective refractive index of the first luminescent layer is at least 2 so that the critical angle is at least 50° thereby minimizing total internal reflection. The effective refractive index of the first luminescent layer may be equal to, and is preferably less than, the refractive index of light source.

In an embodiment, the quantum dots in the second luminescent layer are CdSe quantum dots. The refractive index of CdSe quantum dots is about 2.5 at 450 nm. In an embodiment, the volume fraction of quantum dots in the second luminescent layer is about 50%. The material of matrix is preferably a polymer, however, the matrix material may also be, but is not limited to, a silicone, epoxy, acrylic, plastic, or glass. The refractive index of matrix may be 1.5. The effective refractive index of the second luminescent layer may be 2.0 at a quantum dots volume fraction of 50%. Preferably, the effective refractive index of the second luminescent layer is at least 1.8 to minimize the Fresnel reflection and the total internal reflection.

Alternatively, in some embodiments, the quantum dots may be the same as quantum dots as in the first luminescent layer, e.g. InP quantum dots. The volume fraction of quantum dots in the second luminescent layer may be about 20%. The effective refractive index of the second luminescent layer may be about 2.0 at a quantum dots volume fraction of 20%. The volume fraction of quantum dots in the second (top) luminescent layer is chosen to be less than the volume fraction of quantum dots in the first (bottom) luminescent layer so that the effective refractive index of the second luminescent layer is less than the effective refractive index of the first luminescent layer.

In another embodiment, the lighting device can further contain a third luminescent layer. The third luminescent layer may be disposed directly on top of the second luminescent layer. The third luminescent layer also contains a composition of quantum dots dispersed in a matrix. The quantum dots can be InP or CdSe based. In an embodiment, the volume fraction of the quantum dots in the third luminescent layer is at least 1.6 to minimize the Fresnel reflection and the total internal reflection.

In a second aspect of the present disclosure, methods to apply color correction films to a display (micro-LED application) are described.

To provide context, micro-LEDs promise high brightness and low power consumption, but manufacturing red, green and blue pixels on the same substrate has not been achieved with acceptable power efficiency. For this reason, quantum dots have been proposed to convert an available efficient LED color to the desired color. Such an approach requires depositing quantum dot material to be applied directly over, for example, a blue LED, to convert its color to red or green. The μLEDs are of the order of 5μ across. Quantum dot color conversion patches may cover a single LED or a group of redundant LEDs. However, quantum dot material is expensive. It has proven difficult to achieve a low-cost method to apply quantum dot material over micro-LEDs to complete a display.

Photoresist containing quantum dots can applied to a display, patterned and etched. Inkjet printing of quantum dots has been described. However, photoresist is a slow, multi-operation process which wastes the majority of the material. Inkjet printing small areas currently requires that the printing surface includes wells to receive the ink droplets, necessitating substrate patterning and etching prior to the printing.

One or more embodiments described herein are directed to an approach that may be characterized as analogous to a hot glue gun. In a particular embodiment, a film containing quantum dots, or another color-correction medium, is applied to a flexible transparent backing film, such as a continuous roll of film. Optionally, a release layer may be included between the quantum dot film and the carrier. To apply the color correction dot patches, the carrier film can be placed over the display and patches of film dots are removed and applied using two primary phenomena. A first phenomenon includes laser ablation applied through the backing film to eject a patch of the material through the physical expansion of the ablated release layer. A second phenomenon includes heating of the color correction layer to melt it sufficiently for to act like "hot glue" and adhere to the surface of the display. In one such embodiment, ablation of a release layer can cause a clean release of the layer, which separates from the rest of the film around the area of the ablation.

In accordance with an embodiment of the present disclosure, an approach described herein facilitates procuring a reel of color correction film. The application of color correction patches transferred to a display can be swift, may not require a clean environment (e.g., since the materials are already sealed in the film), and, by appropriate management of locations where patches are released from the film, minimizes wasted materials. In one embodiment, the film incorporates necessary sealing to project sensitive materials, such as quantum dots, from degradation by air or moisture. An additional feature of such an embodiment is the option to pattern the film, such as described in association with FIG. 9, or to fashion the film in layers as shown in FIG. 7.

Figure 9:
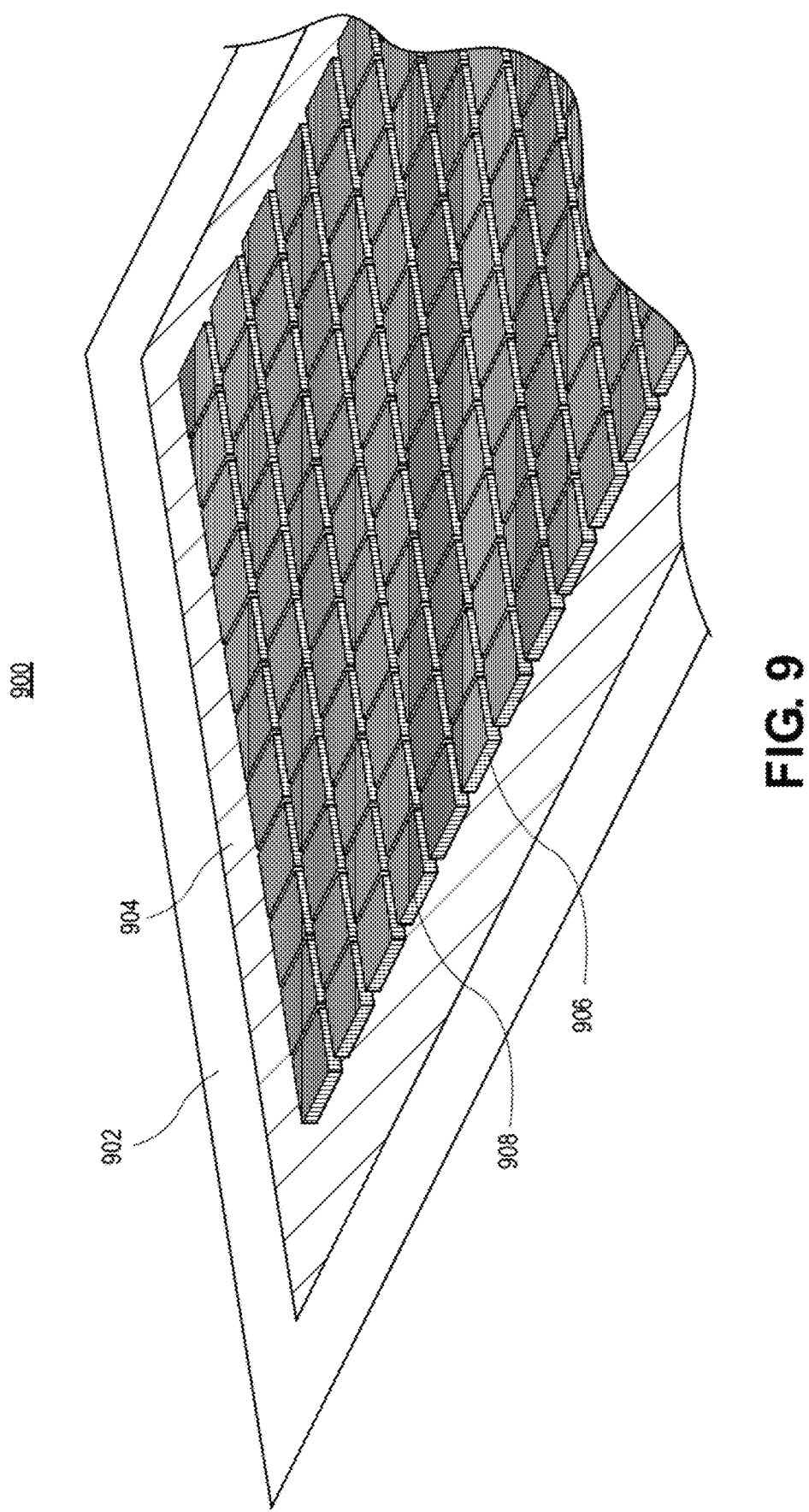
FIG. 9 illustrates an angled view of a structure having separated color correction patches, in accordance with an embodiment of the present disclosure.

FIG. 9 illustrates an angled view of a structure having separated color correction patches, in accordance with an embodiment of the present disclosure.

Referring to FIG. 9, an apparatus 900 includes a flexible backing layer 902 having a release layer 904 thereon. A color correction film 906 is on the release layer 904. An anti-reflective film 908 is on the color correction film 906. In an exemplary embodiment of FIG. 9, a red color conversion film 906 has been pre-cut into square patches. Each patch has been made to include a second anti-reflective layer 908. In one embodiment, a series of layers is present in the color correction film 906. Examples of such layers include, but are not limited to, anti-reflective films, multi-layered color correction devices with layers at gradually changing refractive indexes which mitigate Fresnel reflections at the film surfaces, and/or specific adhesives to assist color correction film 906 to stick to a printed surface.

Figure 10:
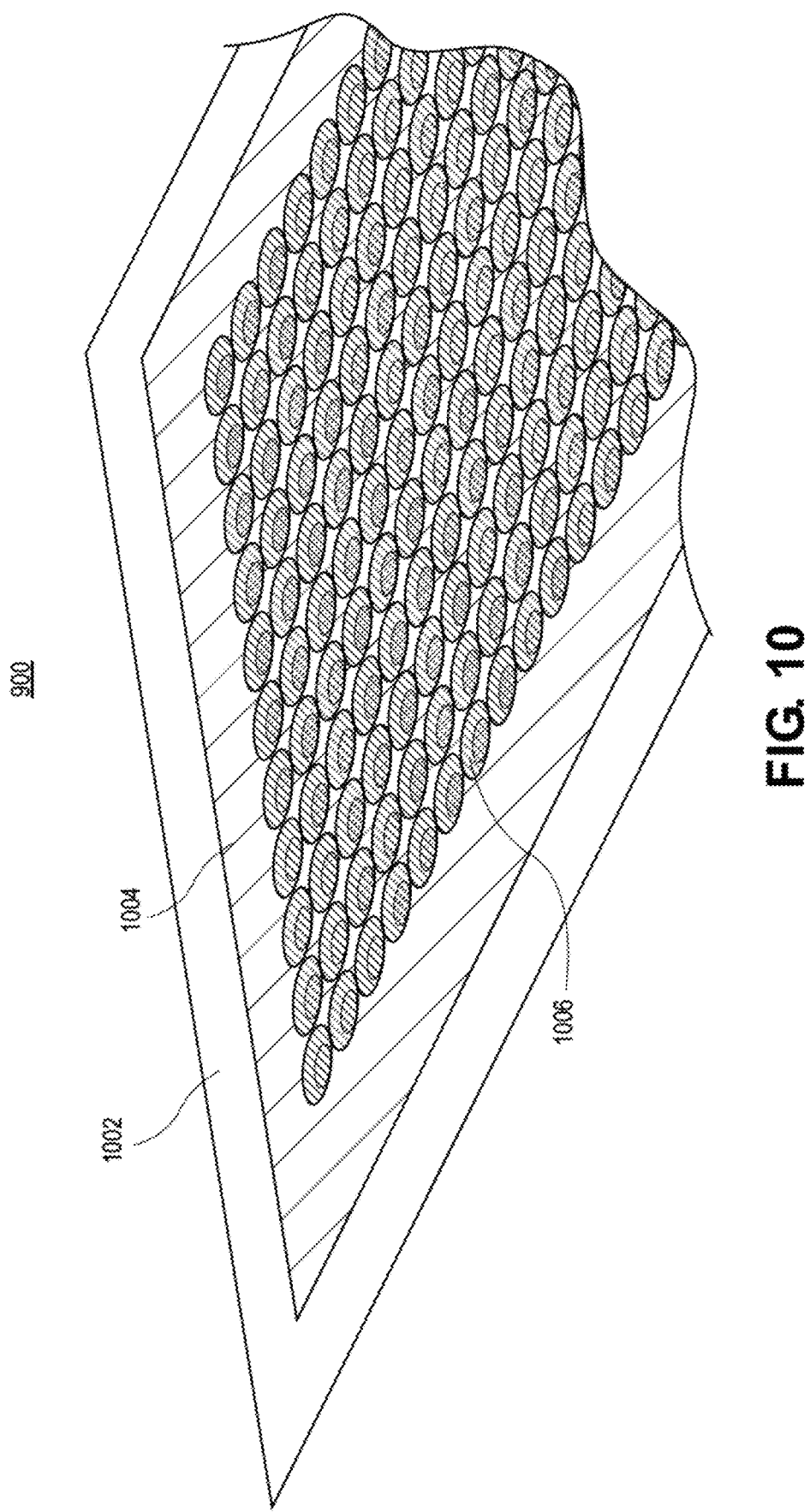
FIG. 10 illustrates an angled view of a structure where films to be transferred have been engineered as round with beveled edges, in accordance with an embodiment of the present disclosure.

In an embodiment, in addition to the possibility of fabricating the patches with multiple films, the patches may also (or instead) be created in shapes designed to focus light, minimize reflections, or take on other beneficial functions. As an example, FIG. 10 illustrates an angled view of a structure where films to be transferred have been engineered as round with beveled edges, in accordance with an embodiment of the present disclosure. Referring to FIG. 10, an apparatus includes a flexible backing layer 1002 having a release layer 1004 thereon. A color correction film 1006 is on the release layer 1004. The color correction film 1006 is round with beveled edges.

In accordance with an embodiment of the present disclosure, the "final" product, in the above case, is a fabrication tool, e.g., as a regular array of quantum-dot patches, which are potentially engineered. It is to be appreciated that material analysis techniques may be used to reveal the composition of the patches and determine that the patented transfer process has been used. Embodiments may be described as rolls of quantum dot film.

Figure 11:
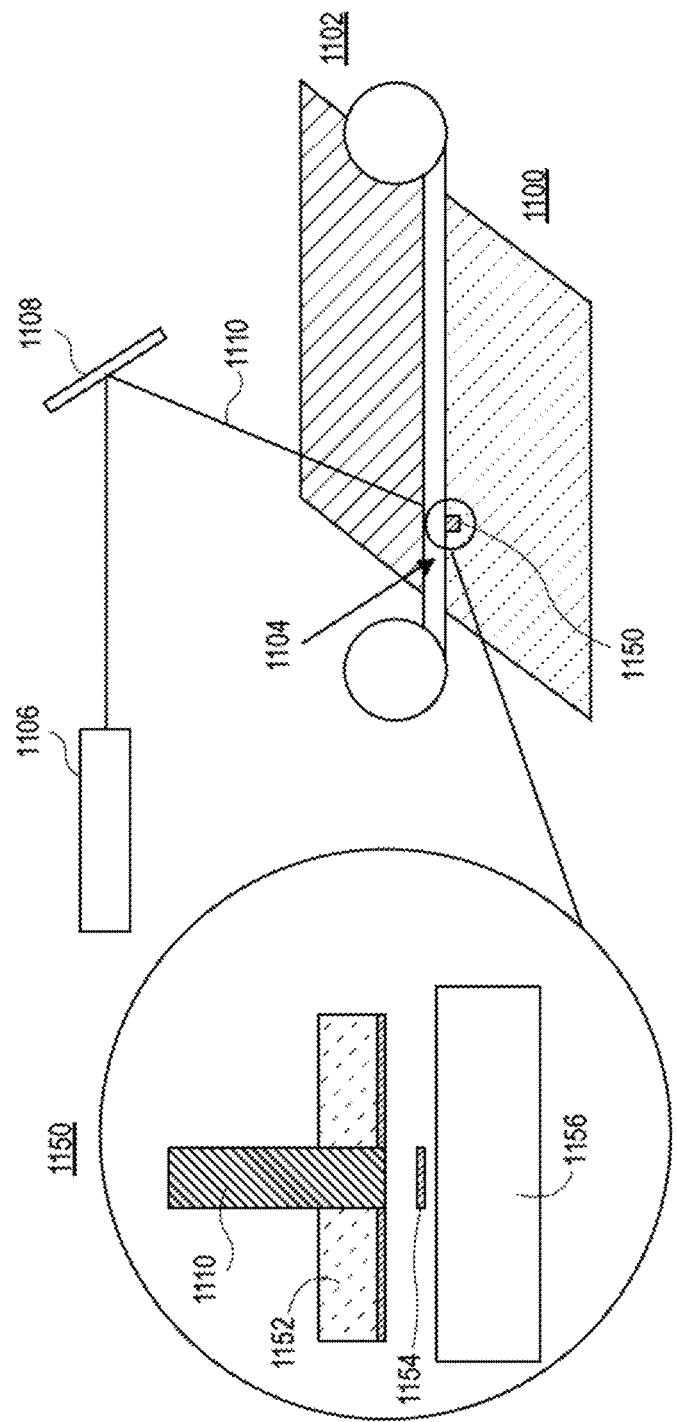
FIG. 11 is a schematic illustrating a transfer process using a quantum dot film, in accordance with an embodiment of the present disclosure.

FIG. 11 is a schematic illustrating a transfer process using a quantum dot film, in accordance with an embodiment of the present disclosure. Referring to FIG. 11, a display 1100 has a quantum dot film 1104 applied thereto to provide a display 1102 with quantum dots. A laser 1106 emits a beam 1110 which may travel over a galvanic mirror 1108. A region 1150 of the quantum dot film 1104 is exploded for detail. The region 1150 of the quantum dot film 1104 includes a transparent carrier 1152 onto which the laser beam 1110 impinges. An ejected quantum dot patch 1154 results from impinging the laser beam 1110 onto the transparent carrier 1152. A location 1156 of a display receives the ejected quantum dot patch 1154.

With reference again to FIG. 11, a color correction film (e.g., a quantum dot film) is provided on a transparent substrate. A laser is scanned through the color correction film, and pulsed to release quantum dot patches directly over the micro-LEDs on the display. The passage of the display under the roll is synchronized with the scanning of the laser to accurately track the passage of the display and place the rows of color correction patches in a correct location.

In an embodiment, by synchronizing laser pulses and a galvanic mirror with a passing display, variants in an absolute X and Y location of the LEDs can be accommodated. By carefully adjusting the speed of the role-to-role feed, the color correction film can be substantially consumed, avoiding material wastage. In an example, a scan #1 releases dots at locations 0, 10, 20, 30 . . . to provide roll tape+1 pixel pitch. A scan #2 releases dots at locations 1, 11, 21, 31 . . . to provide roll tape+1 pixel pitch. A scan #3 releases dots at locations 2, 12, 22, 32 . . . to provide roll tape+1 pixel pitch. This is continued until a scan #10 releases dots at locations 9, 19, 29, 39 . . . , etc.

In an embodiment, control of the tape location, or adjustment of the display positing traveling beneath it allows the film to be fully, or at least substantially, utilized, leaving minimum or no waste on the exhausted carrier film. The solution may have several advantages over other proposals: (1) no possibility of clogging (inkjet), (2) continuous roll-to-roll process of quantum dot supply, (3) continuous application processing onto a display, (4) no liquids involved, (5) no issues with XY alignment due to thermal expansion, (6) the applied film may be pre-engineered for multiple functions via films or shaping of patches, (7) straightforward to test, and/or (8) a reliable outcome. It is to be appreciated that high material utilization may be achieved and that no "capture zone" needs patterning on the display. It is also to be appreciated that ablation can propel layers over the laser ablation area.

In a third aspect of the present disclosure, pixel architectures for facile fabrication of micro LED displays are described. Micro LED displays with efficient color conversion films are also described.

To provide context, micro-LED displays are expected to reduce power consumption by 50% compared to OLED displays. Micro-LED displays exhibit a great color gamut and brightness levels adequate for viewing in bright sunlight. One of the challenges of realizing micro-LED displays is the fabrication of an efficient red pixel. In accordance with an embodiment of the present disclosure, in the absence of an efficient red pixel, an efficient blue pixel is converted to red by implementation of quantum dots. One or more embodiments described herein relate to efficient methods to apply quantum dots to a display.

Currently, the efficiency of red GaN LEDs is about 10 times lower than desired. Although the efficacy of quantum dots has been demonstrated, they are expensive. Methods to deposit quantum dots on the screen have been wasteful of the material. As described above, spin-coating a photoresist containing quantum dots has been proposed. While a reliable process, most of the expensive quantum dot material is etched away and wasted. Addressing such issues, one or more embodiments described herein involve the application of only as much quantum dot material as necessary.

To provide further context, it is expensive to manufacture displays due to cost of material and inefficient material usage. The cost difference is about 10 times higher with previous solutions. The spin/mask/etch process is slow. If no quantum dots (or other color conversion devices) are deployed, then low GaN red LED efficiency can lead to about 10 times higher power consumption than desired. In an effort to minimize such problems, inkjet printing systems have been developed for forming the color conversion patterns on the substrates by depositing them on the substrates in the form of special inks. Such systems deposit the ink on the substrate through an inkjet head. However, the inkjet head includes a plurality of nozzles, and if only one of such nozzles becomes dysfunctional, the number of passes that the inkjet printing head must make increases. For example, if the inkjet head has one hundred nozzles, and the sixtieth nozzle is damaged, only the first to fifty-ninth nozzles and the sixty-first to hundredth nozzles are available and, thus, in order to deposit ink over entire target region of the substrate, the inkjet head must be moved, or offset, by a selected interval so as to deposit ink on the region corresponding to the sixtieth nozzle. As a result, processing time and costs are substantially increased. Additionally, since all of the nozzles of the inkjet head must be kept in good operating condition, downtime increases and process stability margins deteriorate. The flat panel display industry has been attempting to employ inkjet printing to manufacture display devices, in particular, color filters. One issue with effective employment of inkjet printing is that it is difficult to inkjet ink or other material accurately and precisely on a substrate while having high throughput. Structures described herein can be implemented to address this particular problem. In an embodiment, the use of redundant nozzles in printing heads, and fabricating stripes (as opposed to patches) of QD material for red sub pixels can address throughput issues.

In accordance with one or more embodiments of the present disclosure, quantum dots are combined with a photoresist and the mixture is spin-coated onto a display. Photolithography is then used to pattern the quantum dot photoresist film in locations where it is to be retained. In a particular embodiment, at least three redundant micro LEDs per color (blue and green) are used. Inkjet printing (or slot die printing) of quantum dot ink stripes is then performed onto the three blue micro LEDs where red emitters are to be located.

In a particular embodiment, each blue micro LED has an area of about 4 μm by 4 μm. The separation between the micro LEDs is approximately 30-40 μm for 13.3" displays with QHD resolution. As such, it is feasible to use inkjet to form a color conversion coating with dimensions of about 35 μm×115 μm to provide red emitters. The resulting pixel architecture (i.e., with three redundant micro LEDs) can enable facile production of micro LEDs at low manufacturing cost.

Advantages for implementing embodiments described herein can include low manufacturing cost (as accomplished by using a lesser amount of color conversion films, which are very expensive), and/or low power display.

It is to be appreciated that, in a typical display, each pixel includes Red, Green and Blue (RGB) subpixels controlled independently by a matrix of transistors. For μLED displays, individual, small LED chips are used as the sub-pixel. Unlike OLEDs, inorganic LEDs can require high processing temperatures (e.g., greater than 1000° C.) and may not be able to be "grown" and patterned directly on top of a transistor matrix. In most cases, micro LED chips are therefore manufactured separately and then positioned and connected to the transistor matrix via a pick and place process. However, volume production at costs compatible with the applications still faces multiple engineering and manufacturing challenges. Such challenges include LED epitaxy quality and homogeneity, efficiency of very small μLEDs, sidewall effects, massively parallel chip transfer technologies (e.g., pick and place) with position accuracy and high throughput, cost, handling of small die, etc., interconnects, color conversion, defect management, supply chain, and cost of production. Just like OLED, μLED is an emissive display technology. However, because of the inorganic nature of the emitting materials, their efficiency and narrow emission bands, μLED also offer the prospect of significantly improved performance in terms of energy consumption, color gamut, brightness, contrast (High Dynamic Range), long lifetime and environmental stability (not sensitive to air, moisture), and compatibility with flexible backplane technologies to enable curved or flexible displays.

As described above in association with FIGS. 1A and 1B, a process flow for fabricating micro LEDs with color conversion devices (QDs) can involve spin-coating of photoresist film loaded with quantum dots (QDs) onto a display plane, followed by patterning using lithography. The approach can achieve very high resolution but the process can waste about 90% of expensive material. FIG. 2 described above illustrates a micro LEDs arrangement on a display backplane when efficient red, green, and blue micro LEDs are available. In such a case, three micro LEDs per color are used to guarantee than at least one will work, resulting in high production yield. However, efficient red micro LEDs may not be available.

A process flow for fabricating micro LEDs with color conversion devices (QDs) may first involve the transfer of blue and green micro LEDs to a the display backplane. A dielectric layer is then deposited and planarized to hold the micro LEDs on the display backplane. A transparent conductive oxide (e.g., ITO) is then deposited to act as a common cathode electrode. A dielectric is then deposited on the ITO, and lithography is used to make trenches into which the quantum dot ink can be squirted. In one embodiment, the quantum dot film converts blue light from the inorganic blue micro LEDs to red light with efficiency at least 10 lm/W.

Figure 12:
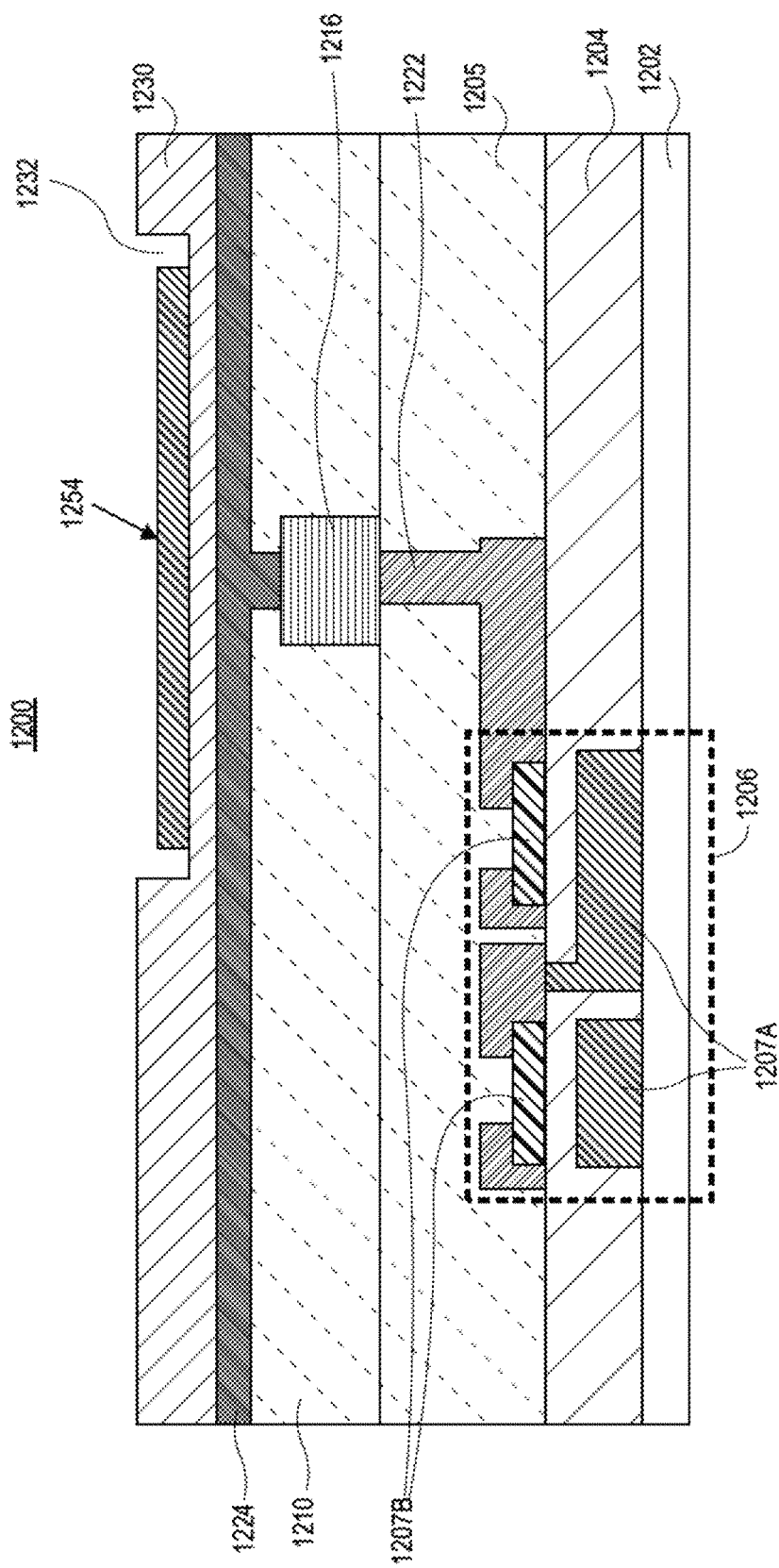
FIG. 12 illustrates a cross-sectional view of a display backplane having a color conversion device (CCD), in accordance with an embodiment of the present disclosure.

As an example, FIG. 12 illustrates a cross-sectional view of a display backplane having a color conversion device (CCD), in accordance with an embodiment of the present disclosure.

Referring to FIG. 12, a pixel structure 1200 includes a backplane 1201. The backplane 1201 includes a glass substrate 1202 having an insulating layer 1204 thereon. A pixel thin film transistor (TFT) circuit 1206 is included in the insulating layer 1204 and in a dielectric layer 1205 (such as a carbon-doped oxide layer) on the insulating layer 1204. The pixel TFT circuit 1206 includes gate electrodes 1207A, such as metal gate electrodes, and channels 1207B, such as polycrystalline silicon channels or IGZO channels. A portion of the insulating layer 1204 may act as a gate dielectric for the pixel TFT circuit 1206. An interconnect 1222 is in the dielectric layer 1205 and is coupled to TFT circuit 1206.

Referring again to FIG. 12, the pixel structure 1200 includes a front plane 1208 on the backplane 1201. The front plane 1208 includes an LED 1216 in a dielectric layer 1210, such as a carbon-doped oxide layer. In the example shown, a single micro LED is included. In a particular embodiment, micro light emitting diode device 1216 is a blue micro light emitting diode device. The front plane 1208 also includes a transparent conducting oxide layer 1224, such as a layer of indium tin oxide (ITO), as a cathode of the pixel structure 1200.

Referring again to FIG. 12, a dielectric layer 1230 (such as a $SiO_2$ layer) is on the transparent conducting oxide layer 1224. In an embodiment, the dielectric layer 1230 is transparent to visible light. In an embodiment, the dielectric layer 1230 has a microgroove or cavity 1232 therein. A quantum dot film 1254 is deposited inside microgroove 1232. It is to be appreciated that the alignment between the blue micro LED 1216, the microgroove 1232, and the quantum dot film 1254 is important. In an embodiment, the lateral width of the microgroove 1232 is greater than the corresponding lateral width of the micro LED 1216, as is depicted. In one embodiment, the quantum dot film 1254 is or includes red color converter quantum dots or nanophosphors and, in a particular embodiment, micro LED 1216 is a blue micro LED. The quantum dot film 1254 may be referred to as a quantum dot ink, and may be deposited using inkjet printing to cover a large area on top of a blue inorganic micro LED to convert blue color into red color efficiently.

In an embodiment, the pixel TFT circuit 1206 is a circuit such as circuit 3950, described herein. In one embodiment, the pixel thin film transistor circuit 1206 includes a current mirror and a linearized transconductance amplifier coupled to the current mirror, as described in greater detail below. In an embodiment, the micro light emitting diode device 1216 is a GaN nanowire-based or nanopyramid-based micro light emitting diode device. Embodiments described herein may be based only on the back plane 1201 described above. Embodiments described herein may be based only on the front plane 1208 described above. With reference again to FIG. 12, the anode and cathode contacts of the micro LEDs are shown. A common anode electrode (e.g., indium tin oxide) connects all anodes of all micro LEDs as shown. The cathodes are connected to pixel circuits as shown.

Figure 13A:
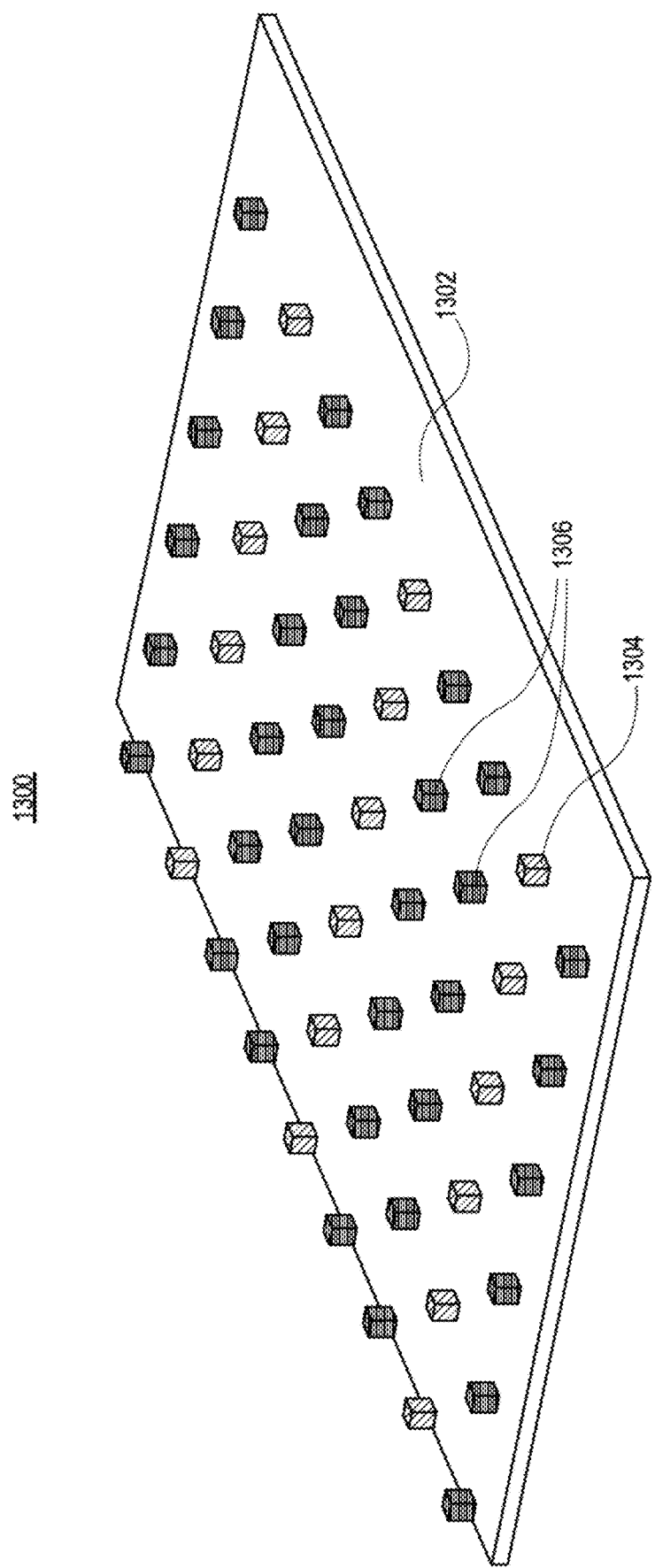
FIGS. 13A-13C illustrate angled views of various operations in a method to fabricate a portion of a display assembly structure, in accordance with an embodiment of the present disclosure.
Figure 13B:
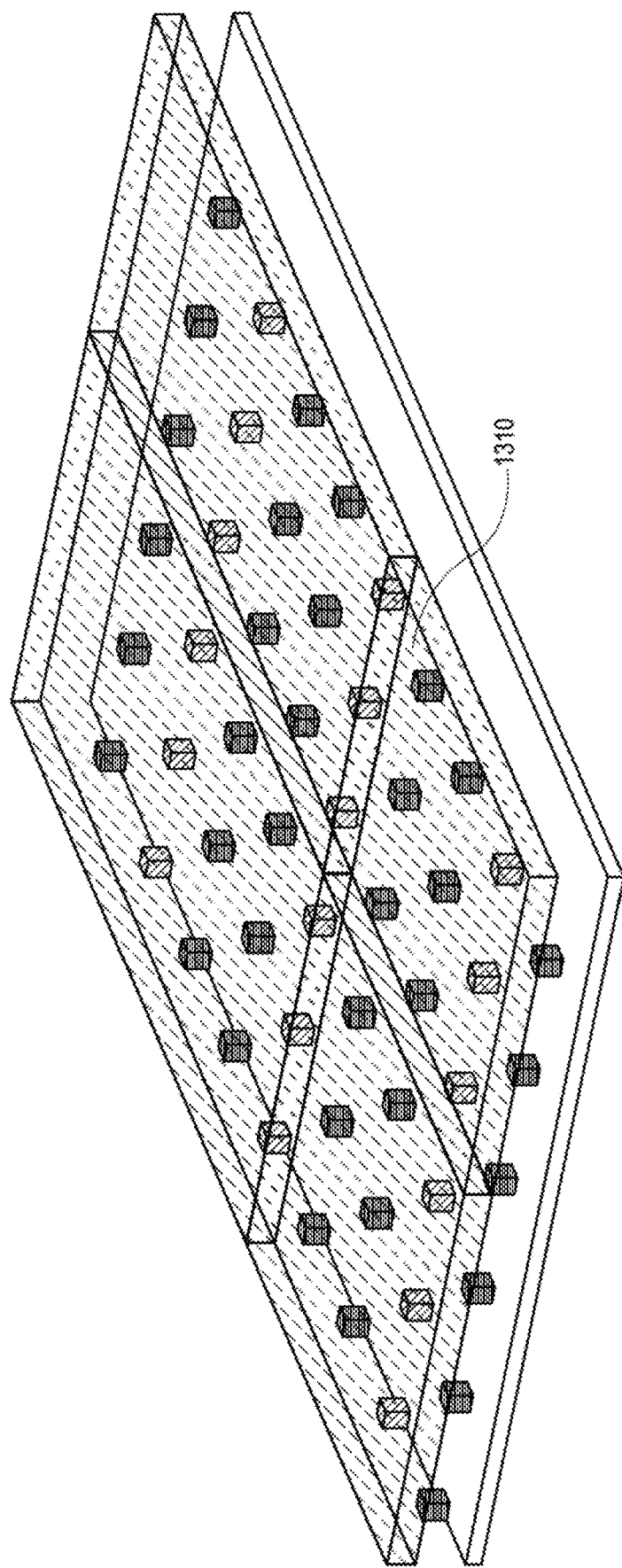
Figure 13C:
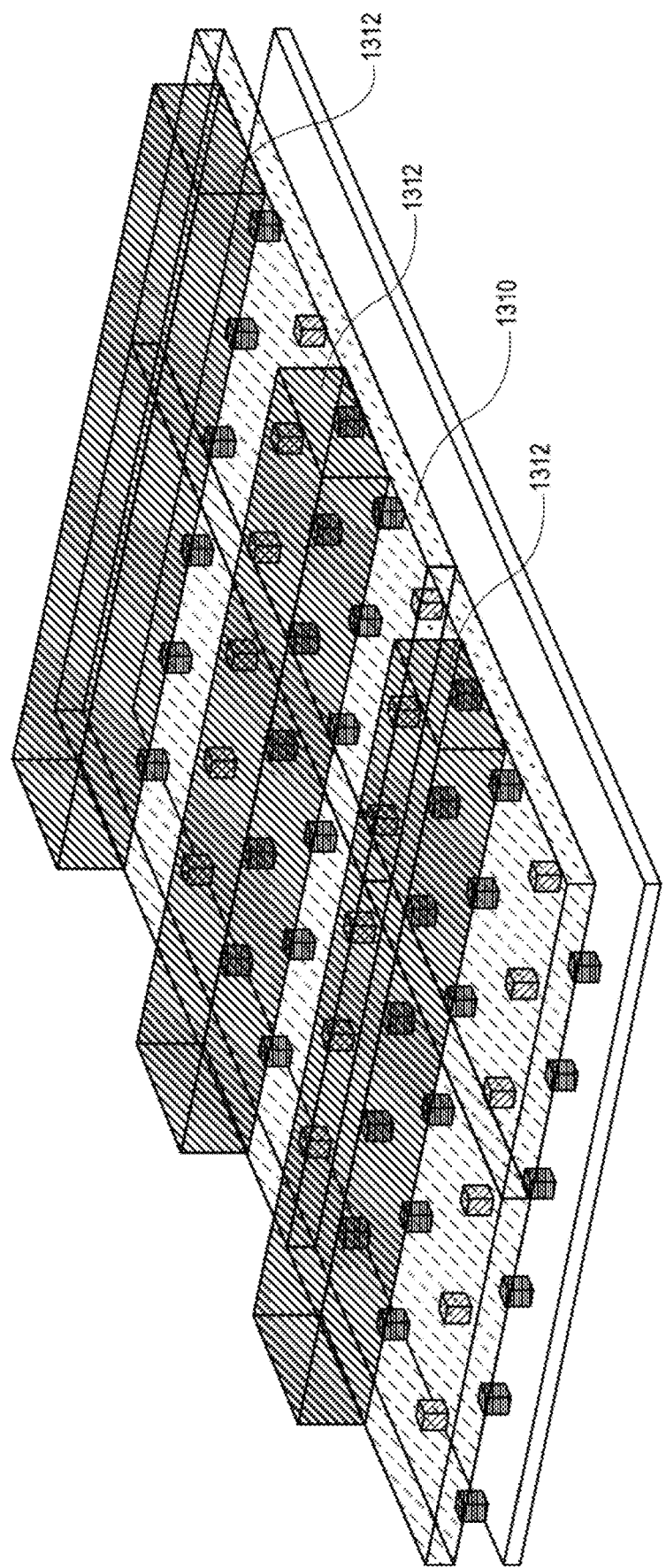

FIGS. 13A-13C illustrate angled views of various operations in a method to fabricate a portion of a display assembly structure, in accordance with an embodiment of the present disclosure. Referring to FIG. 13A, a starting display assembly 1300 includes a backplane 1302. The backplane 1302 has green micro LEDs 1304 and blue micro LEDs 1306 thereon. In one embodiment, there are two blue micro LEDs 1306 for every green micro LEDs 1304. In one embodiment, three redundant LEDs are included for each color (i.e., three for green and three for each blue, where one set of blue is ultimately converted to red).

Referring to FIG. 13B, a conductive oxide layer 1310, such as an indium tin oxide (ITO) layer, is formed over the structure of FIG. 13A. The transparent conductive electrode may be formed on all micro LEDs and therefore may provide a common cathode. It is to be appreciated that a dielectric layer around the LEDs (and on which the conductive oxide layer 1310 is formed, is not depicted for ease of illustration.

Referring to FIG. 13C, inkjet deposition of quantum dot films/stripes 1312 on the conductive oxide layer 1310 and over one set of three blue micro LEDs per pixel is performed to produce red color. In one embodiment, half of the blue micro LEDs 1306 have a quantum dot ink 1312 there over. In one embodiment, the quantum dot ink 1312 is included to convert blue light from the half of the blue micro LEDs 1306 to red light.

With respect to the three-fold redundancy of micro LEDs per color, it is to be appreciated that in micro LED displays, if the whole display is required to be fault-free, the yield will be close to zero. The yield can be increased by adding spare (redundant) subpixels to the design and by accepting those displays that have less than a non-zero number of faulty pixels. The desired yield (cost) level determines the optimal amount of redundancy to be incorporated into the display. Embodiments described herein can include a manufacturing yield model for micro LED displays with redundant sub-pixels taken into consideration. The model is used to estimate the required micro LED wafer yield in order to achieve a specific yield for micro LED displays using a direct transfer approach. In one embodiment, the inputs to the model can include display size, resolution and maximum allowable defective pixels on the display.

In an embodiment, the introduction of redundancy in a micro LED display pixel results in yield improvement and fabrication-cost reduction. The estimation of yield improvement can require a fault-distribution model. Two representative models include a Poisson distribution model and a negative-binomial model, which are often used for the yield analysis of memory LSIs. The Poisson distribution model is often used for yield analysis because of its mathematical simplicity. The approach may be useful for rough yield estimation or the comparison of redundancy techniques.

Regarding the Poisson Distribution Model, consider a display with N "pixels". If faults (bad pixels) are randomly distributed on the display, the probability of a pixel being faulty, p, is independent of the probability of other pixels being faulty or non-faulty. Therefore, the probability that k pixels are faulty and (N–k) pixels are not faulty is expressed as the product of their probabilities. In one example, a display yield calculation is given by setting the micro LED die wafer yield to 99.3% and a direct transfer method (DTM) transfer yield to 99.9%. The calculations are performed for different levels of redundancy (1, 2, 3, 4), QHD display resolution, and different diagonal size (5.5", 8", 11.6", 13.3" and 15.6"). In this case, a reasonably high display yield is obtained when redundancy is 3, and excellent yield when the redundancy is 4. In one embodiment, a redundancy level of 2 is not sufficient to produce displays with acceptable yields for this display with such wafer die yield and micro transfer yield.

Figure 14:
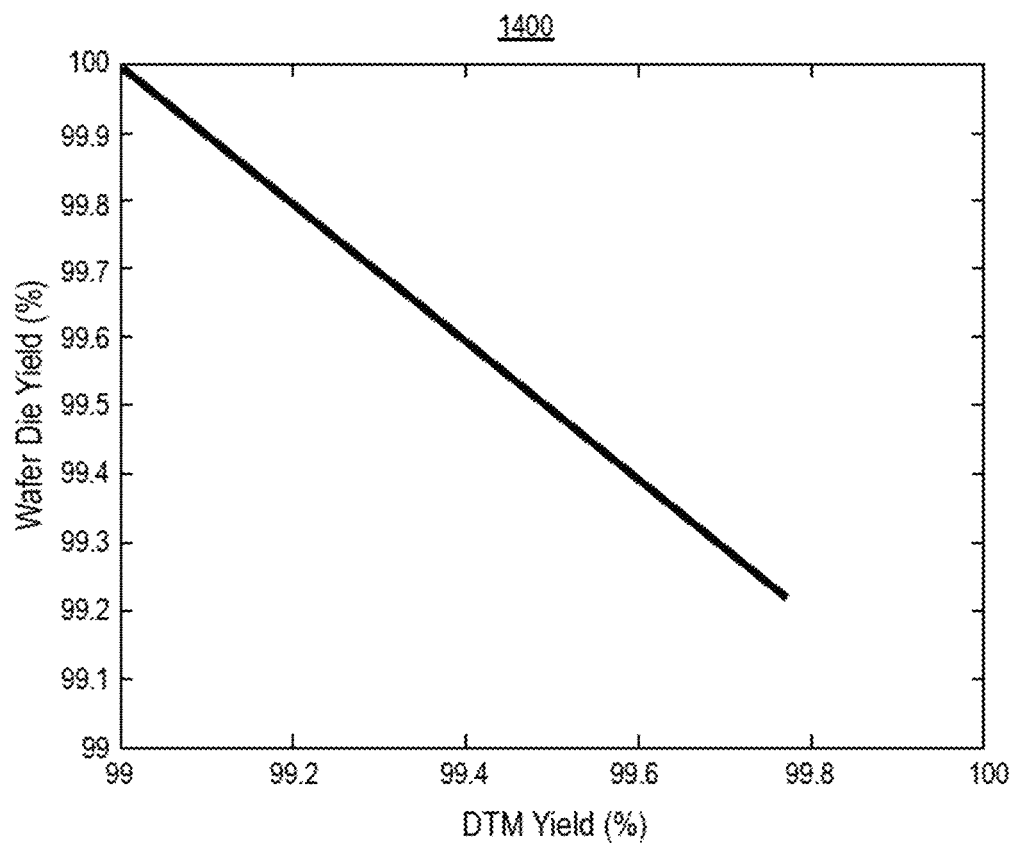
FIG. 14 is a plot of calculated wafer die yield versus DTM yield to achieve a target display yield of 80%, in accordance with an embodiment of the present disclosure.

In another model results example, the wafer die yield and DTM yield to achieve a specific target display yield of 80% are shown in FIG. 14 for a fixed redundancy of 3, DPM=2, QHD resolution, and 13.3" display diagonal. FIG. 14 is a plot 1400 of calculated wafer die yield versus DTM yield to achieve a target display yield of 80%, in accordance with an embodiment of the present disclosure. Referring to plot 1400, the redundancy is fixed at 3. A reasonable target operating point is DTM yield=99.4% and wafer die yield=99.6%. As can be seen, higher DTM yield allows for smaller wafer die yield to meet the desired display yield target.

In an embodiment, regarding pixel structure, issues associated with accurately locating quantum dot patches can be overcome by etching a "well" over the desired area. The approach enables the ink to fill the well and assume the exact shape of the well. Also, in an embodiment, the stripes dimensions (e.g., with three redundant micro LEDs per color) can make it possible to use inkjet or slot die methods (the latter described below) for fabricating displays.

In an embodiment, inkjet systems for manufacturing micro LED displays require inks that can be dispensed by an inkjet without clogging the inkjet, i.e., have good "jettability", and that do not degrade during jetting. In particular, there is a need for inks that are physically and chemically stable before, during, and after jetting and that have a color chromaticity that meets color filter specifications for computer displays, as well as for other devices containing displays. Red ink according to embodiments of the disclosure may have a low viscosity of, e.g., between about 5 cPs (centipoise) and about 25 cPs, preferably between about 10 cPs and about 20 cPs at 100 rpm and 25° C. Red ink according to embodiments of the disclosure may have a surface tension of between about 20 mN/m and about 35 mN/m, preferably between about 25 mN/m and about 30 mN/m, at 25° C.

It is to be appreciated that, although the above discussion focused on red QDs, the same concept may be used to also deposit green (or any other color) QDs. In one such embodiment, only blue micro LEDs are transferred from silicon wafers to a display backplane. In any case, in an embodiment, the micro LEDs are composed of a GaN material system, and the ink color is composed of quantum dot or any other color conversion material.

In an embodiment, another manufacturing option for quantum dot color conversion includes the use of a slot die coating technique, which may involve providing a slot-die coating head arranged over a substrate surface. As an example, FIG. 15A is a schematic illustrating a slot die approach to coating quantum dot films onto a display, in accordance with an embodiment of the present disclosure.

Figure 15A:
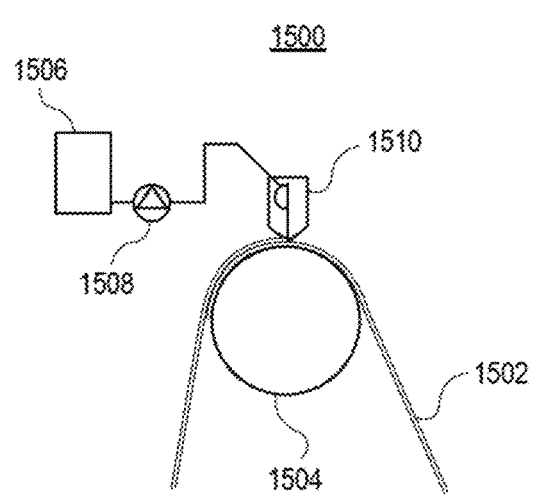
FIG. 15A is a schematic illustrating a slot die approach to coating quantum dot films onto a display, in accordance with an embodiment of the present disclosure.

Referring to FIG. 15A, a slot die approach 1500 includes use of a slot-die coating head 1510 having an outflow opening forming a slit that is arranged in a slit direction over a substrate 1502 surface. A coating fluid, e.g., supplied by a coating fluid supply (e.g., reservoir 1506 and pump 1508), flows through the outflow opening onto the substrate 1502 surface. The substrate 1502 is passing under the head 1510 over a roller 1504 as depicted. However, a flat substrate may also be moving under the head 1510. In an embodiment, the dispensing flow is not continuous if an unbroken line of solution is not required across the width of a display. In an embodiment, the solution is pumped through the slot with a pressure pulse (e.g., analogous to a head of an inkjet printer) to deposit a line of liquid containing quantum dots. In one such embodiment, the line is the stripe of blue-to-red conversion described above. In another embodiment, a mask is used in addition to slot die coating. The slot die head apparatus 1510 may lay on a mask that is patterned with a desired pattern, and may apply, using a pressure, a predetermined printing substance to an opening of the mask so as to print the desired pattern on the substrate. The mask may be a metal mask or a mesh mask.

Another approach for printing a patterned film on a substrate involves screen printing. As an example, FIG. 15B is a schematic illustrating a screen printing assembly 1550, in accordance with an embodiment of the present disclosure.

Figure 15B:
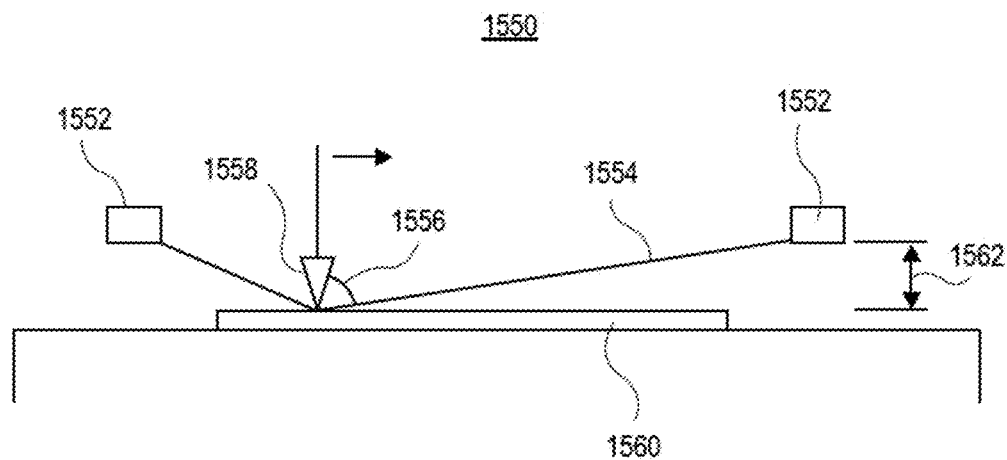
FIG. 15B is a schematic illustrating a screen printing assembly, in accordance with an embodiment of the present disclosure.

Referring to FIG. 15B, a screen printing approach involves use of a printing plate 1554 attached to a screen frame 1552 under prescribed tension. Ink 1556 is applied onto printing plate 1554. A material 1560 to be printed is placed under printing plate 1554 with a gap 1562 there between. A squeegee 1558 is pressed against the top surface of printing plates 1554 and slides thereon, and printing plate 1554 is pressed into contact with the material 1560. While the printing surface is in contact with the surface of material 1560, squeegee 1558 is moved in the direction of arrow. The ink 1556 is squeezed out onto the bottom surface of printing plate 1554 through openings formed in printing plate 1554 to be transferred onto the material 1560, and a desired pattern is formed on the surface of the material 1560. A screen printing plate used for applying quantum dot ink to desired parts of a surface of a display may be produced as follows: a metal thin plate is etched utilizing a mask according to a desired pattern. A metal mask is obtained which has a printing pattern corresponding to the above-described desired parts formed of openings penetrating in the thickness-wise direction of the thin metal plate, and the non-opening part.

It is to be appreciated that micro-LEDs promise high brightness and low power consumption compared to LCDs and OLEDs, but manufacturing red, green and blue pixels on the same substrate has not been achieved with acceptable power efficiency. For this reason, quantum dot containing films are described herein to convert an available efficient blue LED color to the desired red and green colors.

It is to be appreciated that quantum dots radiate in all directions. A quantum dot film may be subject to internal reflections, leading to internal reflections within the film. The amount of light exiting in the desired direction may be as low as one third of the total light produced by the quantum dots. Quantum Dots are typically greater than 90% efficient, but a peak of only 35% efficiency may be achieved for light exiting an inkjet-printed quantum dot film. A similar limit has been observed for quantum dots mixed in photoresist films that are used to be patterned over blue micro LEDs to produce red and green light.

In an embodiment, quantum dots are either deposited as a continuous film and photo-etched into the required islands, or inkjet printed into the appropriate areas over the LEDs selected for color conversions. A patch of quantum dot film is flat, trapping rays which may experience total internal reflection until they are lost to re-absorption. In accordance with one or more embodiments of the present disclosure, nano-particles are deposited to break up internal reflections by deflecting rays at different angles. Advantages for implementing embodiments described herein can include a film that traps less light and becomes more efficient, increasing the light exiting the film to be seen by an observer and so reducing the power requirements of a display using QDs.

In an embodiment, light from an efficient LED (e.g., blue) is down-converted to a more difficult to manufacture color (e.g., red) by using a film of quantum dots to modify the wavelength of the light. In this particular example, blue is turned into red. Such films are generally flat. An example of such a film deposited over a group of redundant same-color LEDs is a patch with dimensions 5µ×35µ×100µ.

Figure 16:
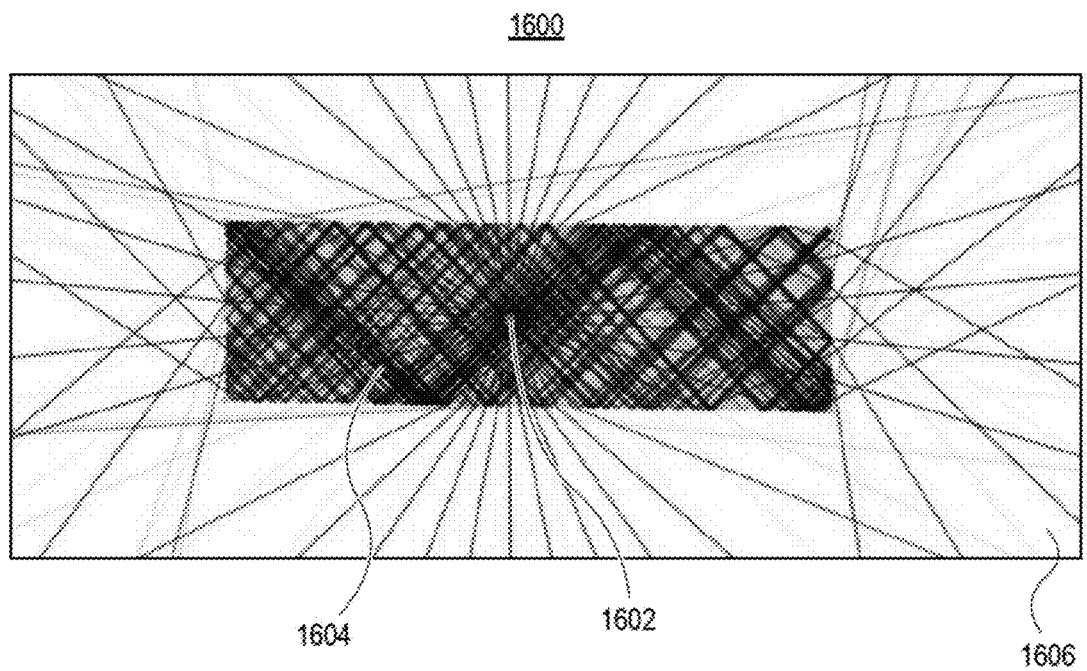
FIG. 16 is a schematic illustrating a single quantum dot inside a film having numerous internal reflections, in accordance with an embodiment of the present disclosure.

FIG. 16 is a schematic 1600 illustrating a single quantum dot 1602 inside a film having numerous internal reflections 1604, in accordance with an embodiment of the present disclosure. Only those rays 1606 at an oblique angle escape the quantum dot film. The illustration is a "worst case" with an exact rectangular cross-section that traps a significant amount of light with internal reflection. This scenario is, however, similar to the actuality of depositing quantum dot inks. The inks may be deposited into a cavity in order to constrain the ink to a well-defined area (e.g., over the pixel) by depositing the ink into a well.

Figure 17:
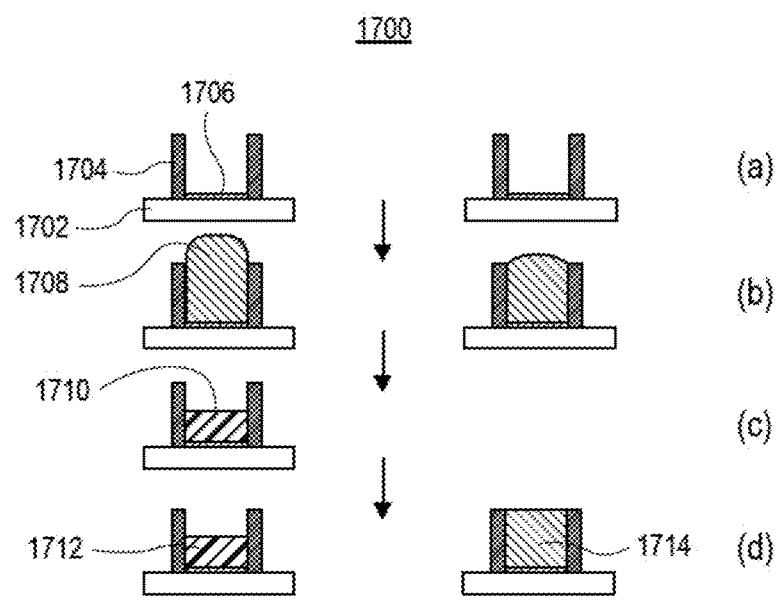
FIG. 17 illustrates two approaches of applying a quantum dot ink to a receiving surface of a substrate having a well, in accordance with an embodiment of the present disclosure.

FIG. 17 illustrates two approaches 1700 of applying a quantum dot ink to (a) a receiving surface 1706 of a substrate 1702 having a well 1704, in accordance with an embodiment of the present disclosure. In (b), ink jet printing of a quantum dot ink 1708. On the left, (c) heat/evaporation curing of the ink 1710 is shown. On the right, (d) UV light is used to cure the film. In both cases, the resultant film approximates a cube with parallel sides and flat top and bottom. The resulting structure facilitates the parasitic internal reflection described in association with FIG. 16. An example of an actual quantum dot film as used in micro-LED applications is 5µ×35µ×100µ (Z*X*Y), a similar aspect ratio to the illustration of FIG. 16.

Figure 18:
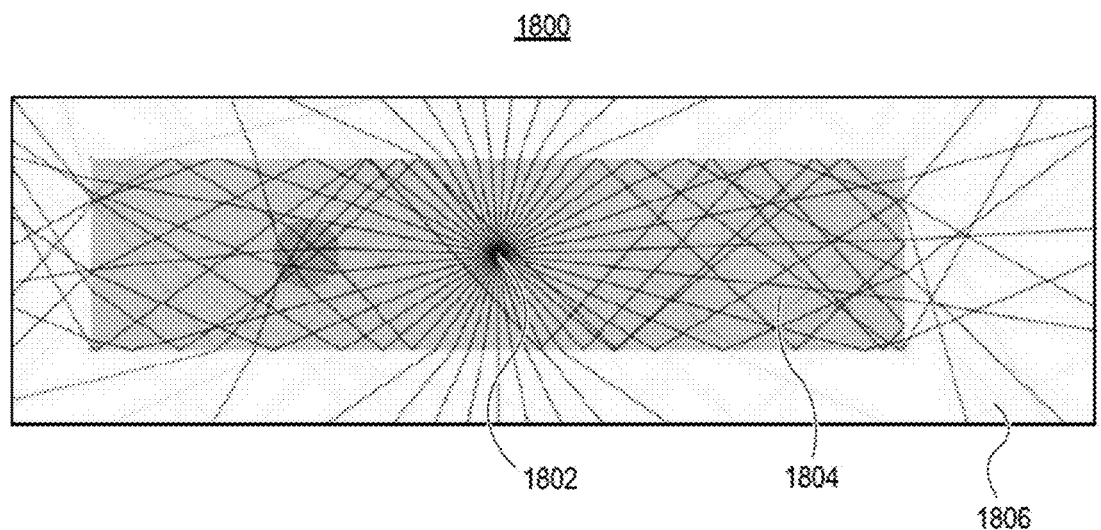
FIG. 18 is a schematic illustrating a single quantum dot inside a film including a diffracting particle and having reduced internal reflections, in accordance with an embodiment of the present disclosure.
Figure 19:
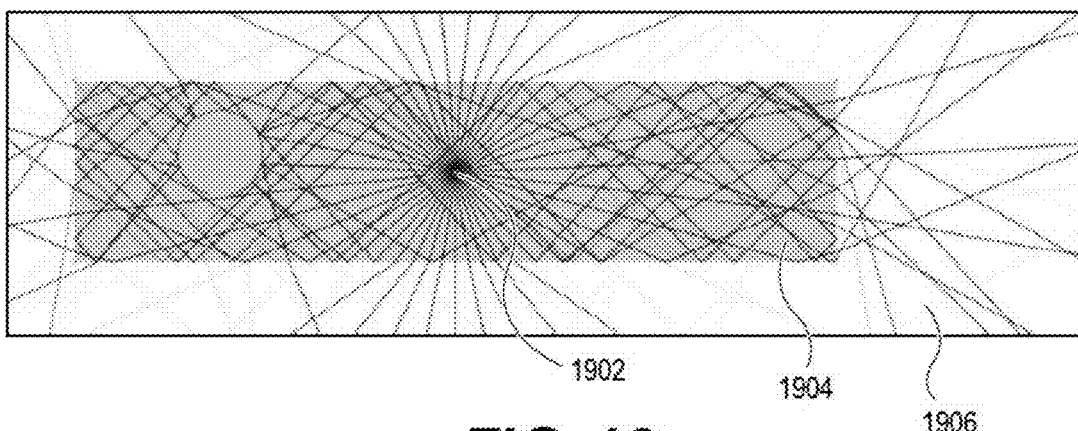
FIG. 19 is a schematic illustrating a single quantum dot inside a film including a reflecting particle and having reduced internal reflections, in accordance with an embodiment of the present disclosure.

In an embodiment, in order to disrupt the internal reflections, particles may be introduced to diffract or reflect the rays. In a first example, FIG. 18 is a schematic 1800 illustrating a single quantum dot 1802 inside a film including a diffracting particle and having reduced internal reflections 1804, in accordance with an embodiment of the present disclosure. In a second example, FIG. 19 is a schematic 1900 illustrating a single quantum dot 1902 inside a film including a reflecting particle and having reduced internal reflections 1904, in accordance with an embodiment of the present disclosure. As compared to the example of FIG. 16, for the FIGS. 18 and 19, the number of internal reflections 1804 or 1904 is much lower, leading to less internal absorption of the light to provide increased emission 1806 or 1906, respectively.

Figure 20:
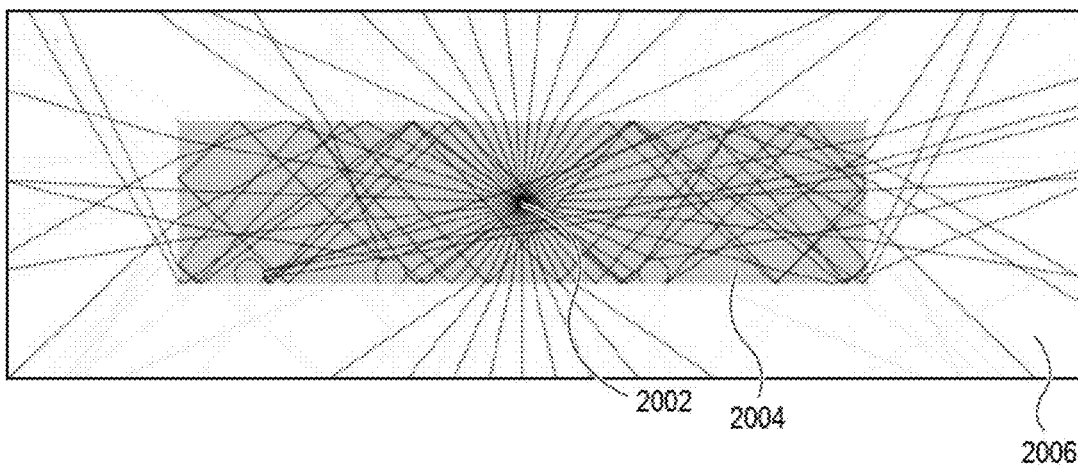
FIG. 20 is a schematic illustrating a single quantum dot inside a film including a particle and having reduced internal reflections and increased emission 2006, in accordance with an embodiment of the present disclosure.

In an embodiment, particles which are both partially reflective and partially transparent can deploy both phenomena of FIGS. 18 and 19. In any case, it is to be appreciated that placement of particles to diffract or reflect the rays may play a significant role in the ability of the particles to do so. In an embodiment, using dimensions of the film as described in association with FIG. 16, the particles are sub-micron such that they do not substantially obstruct light and reflect it back to the LED providing the light. FIG. 20 is a schematic 2000 illustrating a single quantum dot 2002 inside a film including a particle and having reduced internal reflections 2004 and increased emission 2006, in accordance with an embodiment of the present disclosure. In the case of schematic 2000, nano-particles are included at the base of the deposition well of FIG. 17. Such particles may be deposited at the bottom of an ink well using liquid phase atomic layer deposition. In one embodiment, the nanoparticles are composed of a material such as, but not limited to, $TiO_2$, $ZrO_2$, $HfO_2$, etc., such as materials of a general class called "metal oxides".

Figure 21:
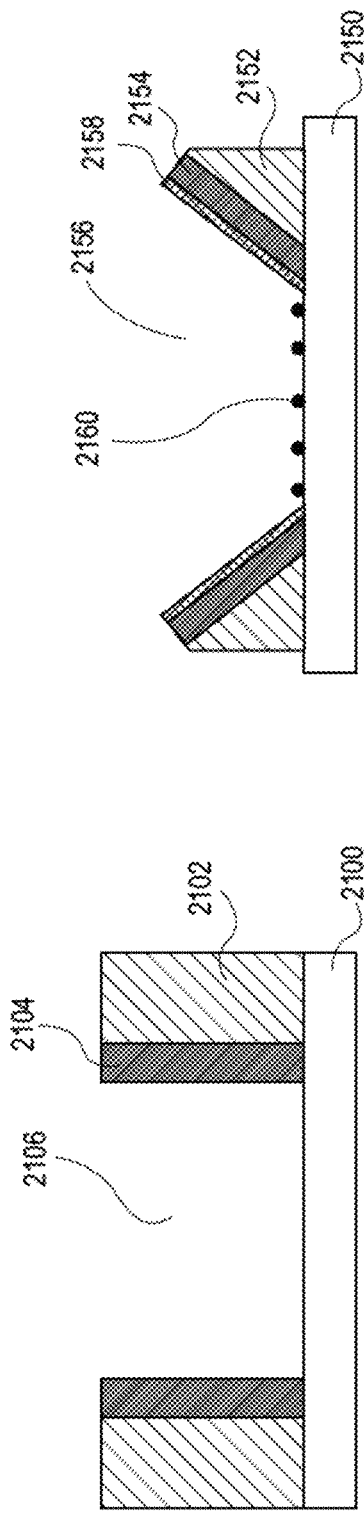
FIG. 21 illustrates possible wells for quantum ink deposition, in accordance with an embodiment of the present disclosure.

FIG. 21 illustrates possible wells for quantum ink deposition, in accordance with an embodiment of the present disclosure. Referring to the left-hand side of FIG. 21, a well includes a dielectric layer 2102 on a layer 2100, such as a conductive oxide layer. An opening 2106 is in the dielectric layer 2102 and sidewall spacers 2104 are along the sides of the opening 2106. Referring to the right-hand side of FIG. 21, a well includes a dielectric layer 2152 on a layer 2150, such as a conductive oxide layer. An opening 2156 is in the dielectric layer 2152 and sidewall spacers 2154 are along the sides of the opening 2156. Mirrored or reflective edges 2158 may be included on the sidewall spacers 2154, as is depicted.

For either well, a quantum dot ink may be deposited in the well, e.g., using an approach described in association with FIG. 17. Also, nano-particles may be formed at the bottom or base of the well prior to deposition of the quantum dot ink, e.g., nano-particles 2160 included in the well of the right-hand side of FIG. 21. The resulting structure may exhibit behavior such as the associated behavior of schematic 2000 of FIG. 20. Additionally, mirrored and sloping sidewalls, such as included in the well of the right-hand side of FIG. 21, can serve to reflect the light out of the top of the quantum dot film.

Figure 22:
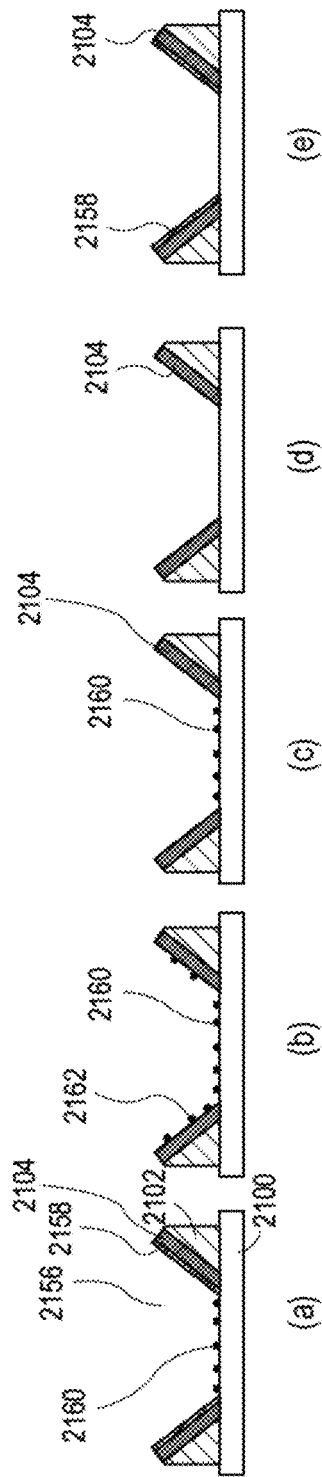
FIG. 22 illustrates cross-sectional views of various wells for receiving quantum dot ink, in accordance with an embodiment of the present disclosure.

FIG. 22 illustrates cross-sectional views of various wells for receiving quantum dot ink, in accordance with an embodiment of the present disclosure. Referring to part (a) of FIG. 22, a well includes a dielectric layer 2102 on a layer 2100, such as a conductive oxide layer. An opening 2156 is in the dielectric layer 2102 and sidewall spacers 2104 are along the sides of the opening 2156. Mirrored or reflective edges 2158 may be included on the sidewall spacers 2104, as is depicted. Nano-particles 2160 are included in the well. The arrangement of part (a) can be referred to as a well having nano-particles distributed across the base of the well, with mirrored sides.

Referring to part (b) of FIG. 22, additional nano-particles 2162 are included on the sides of the well, but mirrored or reflective edges are not included on the sidewall spacers 2104 of the well. The arrangement of part (b) can be referred to as a well having nano-particles distributed throughout the well.

Referring to part (c) of FIG. 22, nano-particles 2160 are included in the well, but mirrored or reflective edges are not included on the sidewall spacers 2104 of the well. The arrangement of part (c) can be referred to as a well having nano-particles on only the base of the well in a structure intermediate to parts (a) and (b). It is to be appreciated that depositing the particles only on the floor of the well may be more difficult than depositing them on the walls also. The sloped walls can reduce the internal reflections shown in FIG. 16 by reflecting light towards the user. Particles on the walls may direct some light back into the film.

Referring to part (d) of FIG. 22, nano-particles are not included in the well, and mirrored or reflective edges are not included on the sidewall spacers 2104 of the well. The arrangement of part (d) can be referred to as a well having walls without nano-particles.

Referring to part (e) of FIG. 22, nano-particles are not included in the well, but mirrored or reflective edges 2158 are included on the sidewall spacers 2104 of the well. The arrangement of part (e) can be referred to as a well without nano-particles but having reflective walls.

Referring again to FIG. 22, each of the implementations (a)-(e) can reduce internal reflections in a quantum dot ink deposited therein. It is to be appreciated that optimal configuration will depend on ease of manufacture and on the aspect ratio of the film. For example, if the film is very shallow, causing many internal reflections across the width of the film, then the nano-particles can disrupt such reflections effectively. If the film is thick, the mirrored sidewalls can be effective on their own.

In a fourth aspect of the present disclosure, hybrid micro LED displays without burn-in are described. Hybrid organic-inorganic micro LED displays are also described.

To provide context, monolithic manufacturing of high efficiency green and blue μLEDs has been demonstrated using nanowire LED technology based on the GaN material system. However, it has been challenging to obtain high efficiency red using the GaN material system. In accordance with one or more embodiments described herein, a solution for a red emitter may include OLED or quantum dot color conversion from a blue micro LED source.

Figure 23:
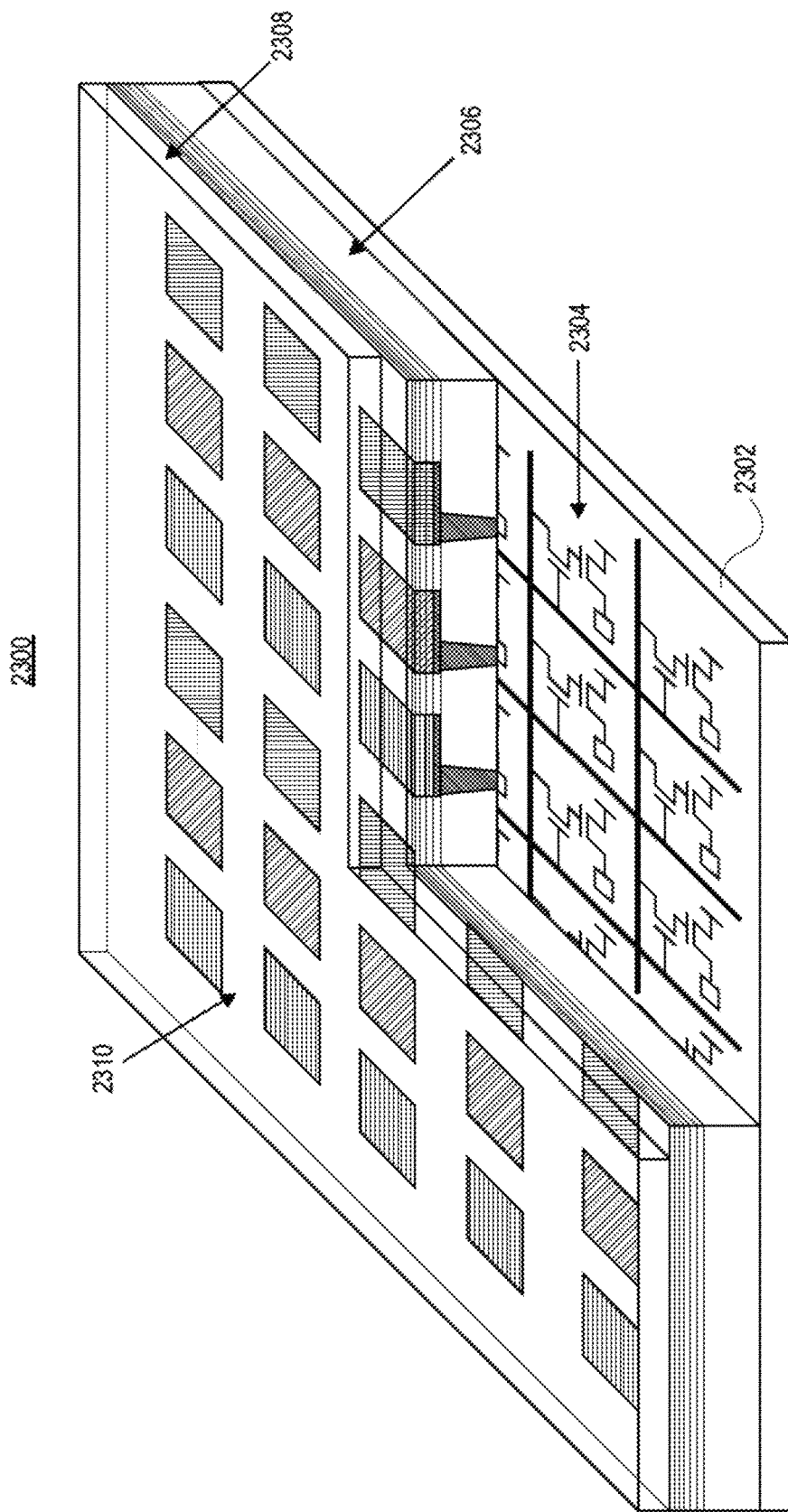
FIG. 23 illustrates a schematic of micro LED display architecture, in accordance with an embodiment of the present disclosure.

As an exemplary display architecture, FIG. 23 illustrates a schematic of micro LED or OLED display architecture, in accordance with an embodiment of the present disclosure. Referring to FIG. 23, a micro LED display 2300 includes a backplane 2302 having pixel circuits 2304 thereon. An insulator 2306 is over the pixel circuits 2304. Micro LED layers 2308 are included over the insulator 2306. A transparent electrode 2310 is over the micro LED layers 2308.

A pixel may be fabricated to have discrete red, green, and blue μLEDs on separate wafers. The micro LEDs are then transferred using a pick and place assembly to the display backplane for each color at a time. A red μLED can be fabricated using an AlInGaP material system, and the green and blue μLEDs can be fabricated using an InGaN material system. As an exemplary such structure, FIG. 24 illustrates a cross-sectional view of a pixel structure having a common anode configuration, in accordance with an embodiment of the present disclosure.

Figure 24:
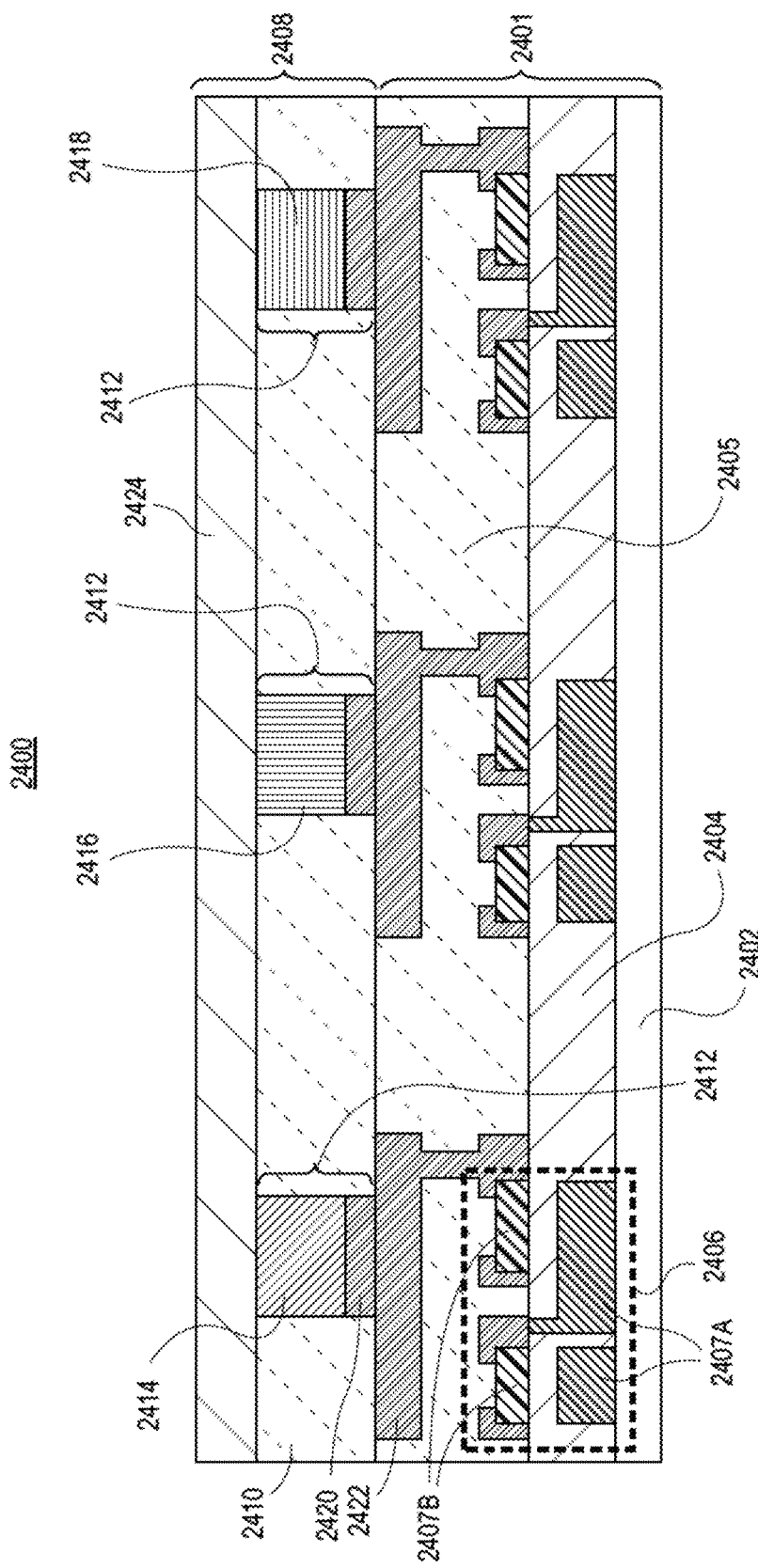
FIG. 24 illustrates a cross-sectional view of a pixel structure having a common anode configuration, in accordance with an embodiment of the present disclosure.

Referring to FIG. 24, a pixel structure 2400 includes a backplane 2401. The backplane 2401 includes a glass substrate 2402 having an insulating layer 2404 thereon. Pixel thin film transistor (TFT) circuits 2406 are included in and on the insulating layer 2404. Each of the pixel TFT circuits 2406 includes gate electrodes 2407A, such as metal gate electrodes, and channels 2407B, such as polycrystalline silicon channels or IGZO channels. A portion of the insulating layer 2404 may act as a gate dielectric for each of the pixel TFT circuits 2406. A conductive mirror 2422 is in the dielectric layer 2405 and over each of the TFT circuits 2406.

Referring again to FIG. 24, the pixel structure 2400 includes a front plane 2408 on the backplane 2401. The front plane 2408 includes LEDs in a dielectric layer 2410, such as a carbon-doped oxide layer. In the example shown, three micro LEDs 2412 are included. Each micro LED includes a corresponding micro light emitting diode device 2414, 2416 or 2418 on a conductive interconnect structure 2420, such as a conductive bump. In a particular embodiment, micro light emitting diode devices 2414, 2416 and 2418 are green, blue and red micro light emitting diode devices, respectively. It is to be appreciated that other arrangements may be used, including variation in number and/or colors of micro LED devices included. The front plane 2408 also includes a transparent conducting oxide layer 2424, such as a layer of indium tin oxide (ITO), as a cathode of the pixel structure 2400.

In an embodiment, each of the pixel TFT circuits 2406 is a circuit such as circuit 3950, described herein. In one embodiment, each of the pixel thin film transistor circuits 2406 includes a current mirror and a linearized transconductance amplifier coupled to the current mirror, as described in greater detail below. In an embodiment, the plurality of micro light emitting diode devices 2414, 2416 and 2418 is a plurality of GaN nanowire-based or nanopyramid-based micro light emitting diode devices. Embodiments described herein may be based only on the back plane 2401 described above. Embodiments described herein may be based only on the front plane 2408 described above. With reference again to FIG. 24, the anode and cathode contacts of the micro LEDs are shown. A common anode electrode (e.g., indium tin oxide) connects all anodes of all micro LEDs as shown. The cathodes are connected to pixel circuits as shown.

It is to be appreciated that disadvantages may be associated with the structures of FIG. 24, such as high manufacturing cost due to the slow transfer rate of three types of µLEDs sequentially from source wafers to backplane. In addition, since three sequential transfers are needed, the probability of missing transfers increases and this results in low yield. This can be particularly important for displays used in smartphones (diagonal=5.1"), converged mobility tablets (diagonal=7"), and mobile notebooks (diagonal=11.6"-13.3").

In another embodiment, green and blue inorganic micro LEDs are used in an arrangement with quantum dots as a color conversion layer on a subset of inorganic blue micro LED to produce red color emission. In an embodiment, the quantum dots are loaded into a photoresist. The loaded photoresist is spin-coated on the display and photoresist is patterned using lithographic methods where red subpixels are needed.

A pixel may be fabricated with inorganic blue, green, and blue micro LEDs transferred from a silicon wafer to a display backplane. A color conversion layer such as quantum dots or organic material is the coated on one of the blue inorganic micro LEDs to produce red subpixel. As an exemplary structure, FIG. 25 illustrates a cross-sectional view of a pixel structure having a color conversion layer, in accordance with an embodiment of the present disclosure.

Figure 25:
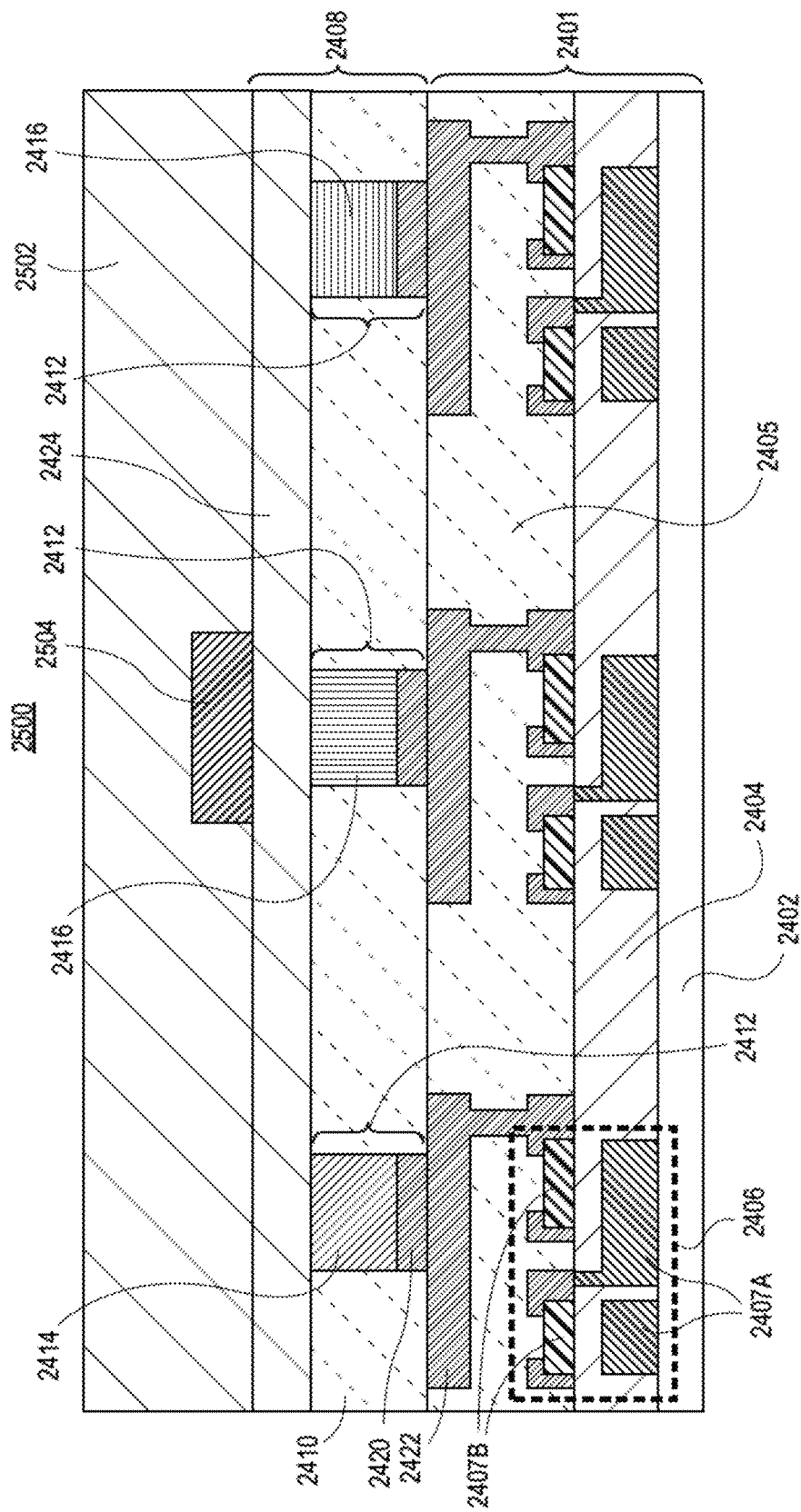
FIG. 25 illustrates a cross-sectional view of a pixel structure having a color conversion layer, in accordance with an embodiment of the present disclosure.

Referring to FIG. 25, a pixel structure 2500 includes a backplane 2401. The backplane 2401 includes a glass substrate 2402 having an insulating layer 2404 thereon. Pixel thin film transistor (TFT) circuits 2406 are included in and on the insulating layer 2404. Each of the pixel TFT circuits 2406 includes gate electrodes 2407A, such as metal gate electrodes, and channels 2407B, such as polycrystalline silicon channels or IGZO channels. A portion of the insulating layer 2404 may act as a gate dielectric for each of the pixel TFT circuits 2406. A conductive mirror 2422 is in a dielectric layer 2405 and over each of the TFT circuits 2406.

Referring again to FIG. 25, the pixel structure 2500 includes a front plane 2408 on the backplane 2401. The front plane 2408 includes LEDs in a dielectric layer 2410, such as a carbon-doped oxide layer. In the example shown, three micro LEDs 2412 are included. Each micro LED includes a corresponding micro light emitting diode device 2414, 2416 (left) or 2416 (right) on a conductive interconnect structure 2420, such as a conductive bump. In a particular embodiment, micro light emitting diode devices 2414, 2416 (left) or 2416 (right) are green, blue and blue micro light emitting diode devices, respectively. It is to be appreciated that other arrangements may be used, including variation in number and/or colors of micro LED devices included.

The front plane 2408 also includes a transparent conducting oxide layer 2424, such as a layer of indium tin oxide (ITO), as a cathode of the pixel structure 2500. A color conversion layer 2504 is included on the transparent conducting oxide layer 2424 and over the 2416 (left) blue micro light emitting diode device. In an embodiment, the color conversion layer 2504 is a quantum dot film or ink, or is an organic material. In one embodiment, the color conversion layer 2504 converts blue light from the 2416 (left) blue micro light emitting diode device to red light. A passivation layer 2502 is formed over the color conversion layer 2504.

In an embodiment, each of the pixel TFT circuits 2406 is a circuit such as circuit 3950, described herein. In one embodiment, each of the pixel thin film transistor circuits 2406 includes a current mirror and a linearized transconductance amplifier coupled to the current mirror, as described in greater detail below. In an embodiment, the plurality of micro light emitting diode devices 2414, 2416 (left) and 2416 (right) is a plurality of GaN nanowire-based or nanopyramid-based micro light emitting diode devices. Embodiments described herein may be based only on the back plane 2401 described above. Embodiments described herein may be based only on the front plane 2408 described above. With reference again to FIG. 25, the anode and cathode contacts of the micro LEDs are shown. A common anode electrode (e.g., indium tin oxide) connects all anodes of all micro LEDs as shown. The cathodes are connected to pixel circuits as shown.

It is to be appreciated that disadvantages may be associated with the structures of FIG. 25, such as burn-in issues. Burn-in occurs when a persistent part of the image on-screen (e.g., navigation buttons on a phone, or a channel logo, news ticker or a scoreboard on a TV, for example) remains as a ghostly background no matter what else appears on-screen. What is colloquially referred to as "burn-in" is actually, with OLEDs, uneven aging. All organic light-emitting diode (OLED) screens can burn-in. However, those same OLED screens produce better image quality than liquid crystal displays (LCDs). The burn-in issue may not be a significant concern in all cases, e.g., since it is likely that a user will replace a phone far sooner than any image retention/burn-in issues become bothersome. For notebook PC displays, however, the burn-in issue could be a problem since consumers are likely to keep PC notebook longer than they keep a smartphone (e.g., 3 years versus 1 year).

One or more embodiments of the present disclosure are directed to a hybrid micro LED-micro OLED display pixel structure. In an example, with reference to FIG. 24 as a foundation, a pixel has a structure where the red LED 2418 of FIG. 24 is substituted with an OLED (referred to herein as OLED-modified FIG. 24). In one such embodiments, a pixel is fabricated by transferring inorganic green and blue micro LEDs from a silicon wafer to a display backplane. An organic red micro LED is then grown monolithically to make a red subpixel. In one embodiment, the green and blue micro LEDs are inorganic and based on a GaN/InGaN material system. The red micro LED is based on organic materials.

In an embodiment, the OLED includes several organic layers. One of the layers is composed of an organic material which is to be able to cause electroluminescence by applying a voltage through the device. Such a device having a structure based on the use of layers of organic optoelectronic materials may generally rely on a common mechanism of light emission. Typically, such a mechanism is based on the radiative recombination of injected electrons and holes. In particular, OLED has at least two thin organic layers separating the anode and cathode of the device. One of the materials can be for injecting and transporting holes, i.e., a "hole transporting layer" (HTL). The material of the other layer may be selected according to its ability to particularly help to inject and transport electrons, i.e., an "electron transporting layer" (ETL). In such a structure, when the potential applied to the anode is more positive than the potential that potential to the cathode, the device can be viewed as a diode with a forward bias. Aluminum tris (8-hydroxyquinolate) (Alq 3) can be used as an ETL material, and other options include oxadiazole, triazole, and triazine.

A cathode can be deposited over the surface of the OLED device. The cathode may be any electronically conducting material, however in one embodiment it is preferable that the cathode be composed of a material having a work function of less than 4 eV. For example, low work function metals may be preferred for the cathode since they readily release electrons into the electron transporting layer. It is to be appreciated that the lowest work function metals are the alkali metals, however, their instability in air can render their use impractical in some situations. A particular example of a suitable material for the cathode is a 10:1 (atomic ratio) magnesium:silver alloy. In another example, the cathode is a bilayer composed of a lower layer of a low work function metal adjacent to the organic electron injecting and transporting zone with an overlying protecting layer that protects the low work function metal from oxygen and humidity. Optionally, a passivation layer can be applied over the cathode layer. Since the cathode needs to be conductive and transmissive, a practical balance of light transmission and technical conductance is typically provided by a film thickness in the thickness range of 5-25 nm. In one embodiment, an OLED includes 7-10 nm Mg:Ag layer capped with a thick layer of sputter-deposited ITO. The Mg:Ag layer can serve both to inject electrons into Alq3 and to protect it from the ITO sputtering. However, although a device with about 70% transmission may be obtained, there can still exist significant reflection from the compound cathode. In another embodiment, the cathode structure is a highly transparent non-metallic cathode composed of a thin film of copper phthalocyanine (CuPc) capped with a film of low-power, radio-frequency sputtered indium-tin-oxide (ITO). The CuPc prevents damage to the underlying organic layers during the ITO sputtering process. Due to the low reflectivity of the non-metallic cathode, a non-antireflection-coated, non-metallic-cathode-containing TOLED may be achieved that is 85% transmissive in the visible. The CuPc film may have a thickness between 3 nm and 15 nm.

One or more embodiments described herein are directed to structures similar to those described in association with FIG. 25 or OLED-modified FIG. 24, but with a display rendering device that minimizes the chance of uneven wear or burn-in. The rendering device and method may be referred to as a "Screen Shift" or "Pixel Shift", which moves the image slightly around the screen. Pixel shifting has been implemented in plasma displays to prevent static images from causing image retention and screen burn-in. The entire video frame is moved periodically (e.g., vertically and/or horizontally) so that there are effectively no static images. In one such example, an image rotates in a circle in a way imperceptible to the viewer with a defined rhythm and pixel interval.

Advantages to implementing embodiments described herein can include low manufacturing cost (e.g., accomplished by transferring green-blue micro LED pixels in one pass from a silicon wafer to a display backplane to provide faster transfer rate and higher yield and lower transfer-related defects on the display), low power consumption (e.g., accomplished by realizing high efficiency green and blue micro LEDs, and high efficiency red micro OLED at the same time), and/or a projected power reduction of about 3-5× compared to stand-alone LCD or OLED technology.

As an exemplary approach to manufacturing a hybrid μLED display, FIGS. 26A-26E illustrate cross-sectional views representing various operations in the method of manufacturing a hybrid micro LED display, in accordance with an embodiment of the present disclosure.

Figure 26A:
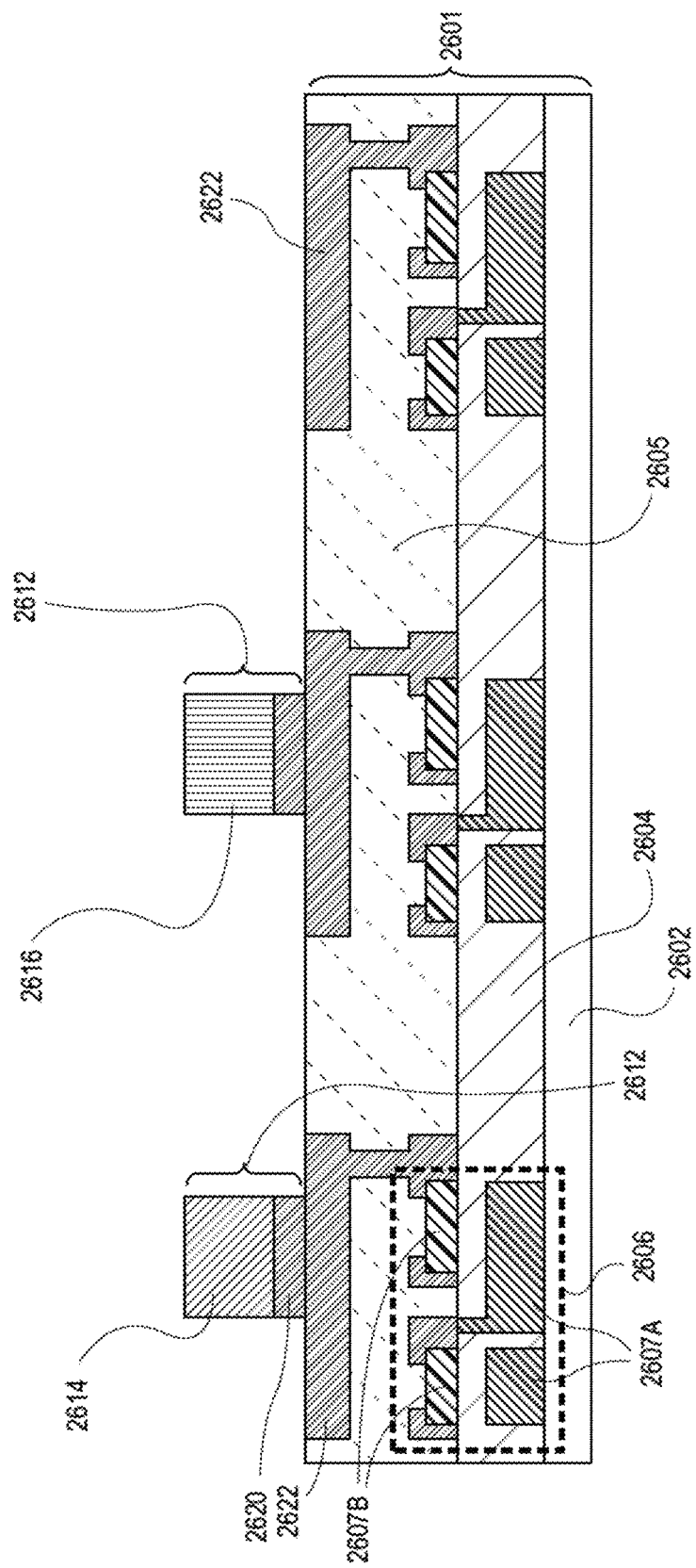
FIGS. 26A-26E illustrate cross-sectional views representing various operations in the method of manufacturing a hybrid micro LED display, in accordance with an embodiment of the present disclosure.

Referring to FIG. 26A, a starting structure includes a backplane 2601 having a glass substrate 2602 with an insulating layer 2604 thereon. Pixel thin film transistor (TFT) circuits 2606 are included in and on the insulating layer 2604. Each of the pixel TFT circuits 2606 includes gate electrodes 2607A, such as metal gate electrodes, and channels 2607B, such as polycrystalline silicon channels or IGZO channels. A portion of the insulating layer 2604 may act as a gate dielectric for each of the pixel TFT circuits 2606. Conductive mirrors 2622 are in a dielectric layer 2605 over each of the TFT circuits 2606. A starting front plane includes LEDs where, in the example shown, two micro LEDs 2612 are included. Each micro LED 2612 includes a corresponding micro light emitting diode device 2614 or 2616 on a conductive interconnect structure 2620, such as a conductive bump. In a particular embodiment, micro light emitting diode devices 2614 and 2616 are green and blue micro light emitting diode devices, respectively. In one embodiment, the green and blue micro LEDs are transferred from a source silicon wafer to a display backplane. It is to be appreciated that other arrangements may be used, including variation in number and/or colors of micro LED devices included.

In an embodiment, each of the pixel TFT circuits 2606 is a circuit such as circuit 3950, described herein. In one embodiment, each of the pixel thin film transistor circuits 2606 includes a current mirror and a linearized transconductance amplifier coupled to the current mirror, as described in greater detail below. In an embodiment, the plurality of micro light emitting diode devices 2614 and 2616 is a plurality of GaN nanowire-based or nanopyramid-based micro light emitting diode devices. Embodiments described herein may be based only on the back plane 2601 described above. Embodiments described herein may be based only on the front plane described above.

Figure 26B:
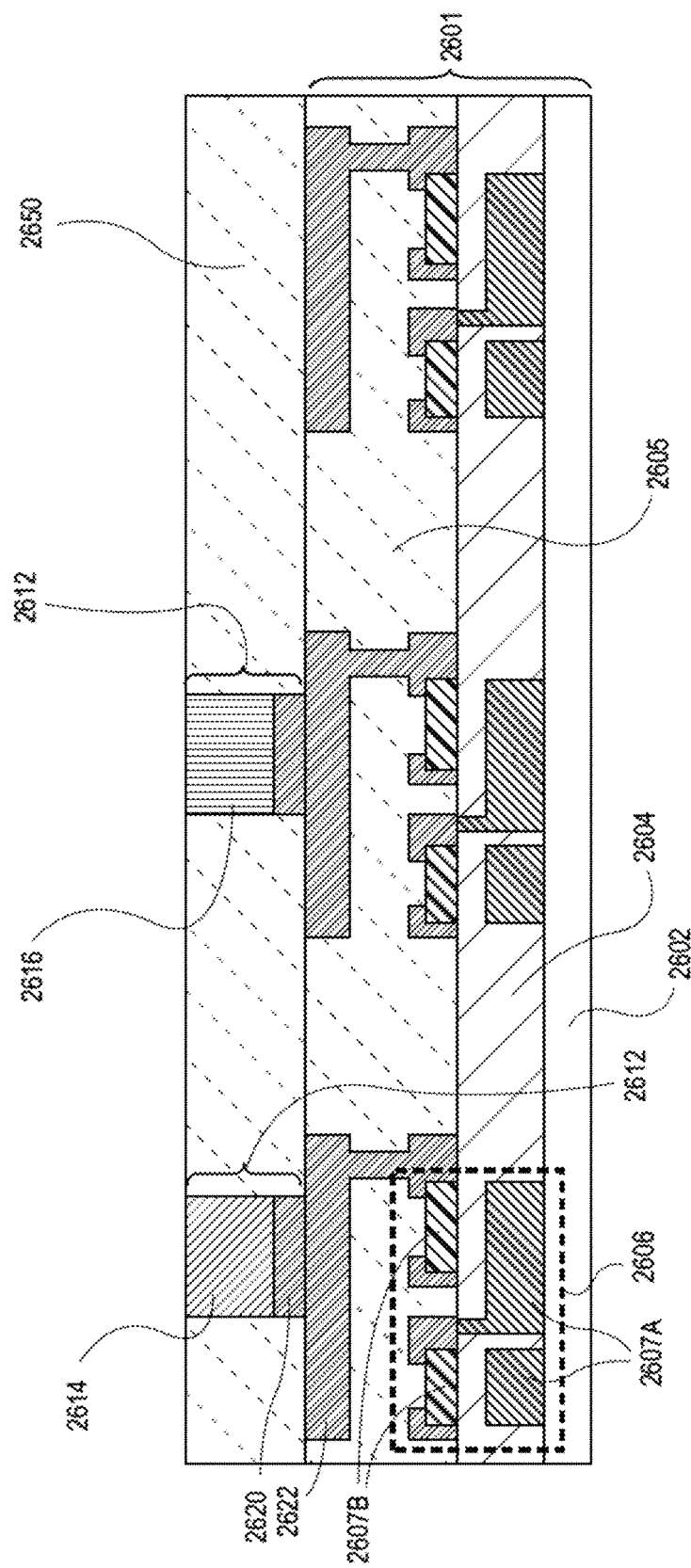
Figure 26C:
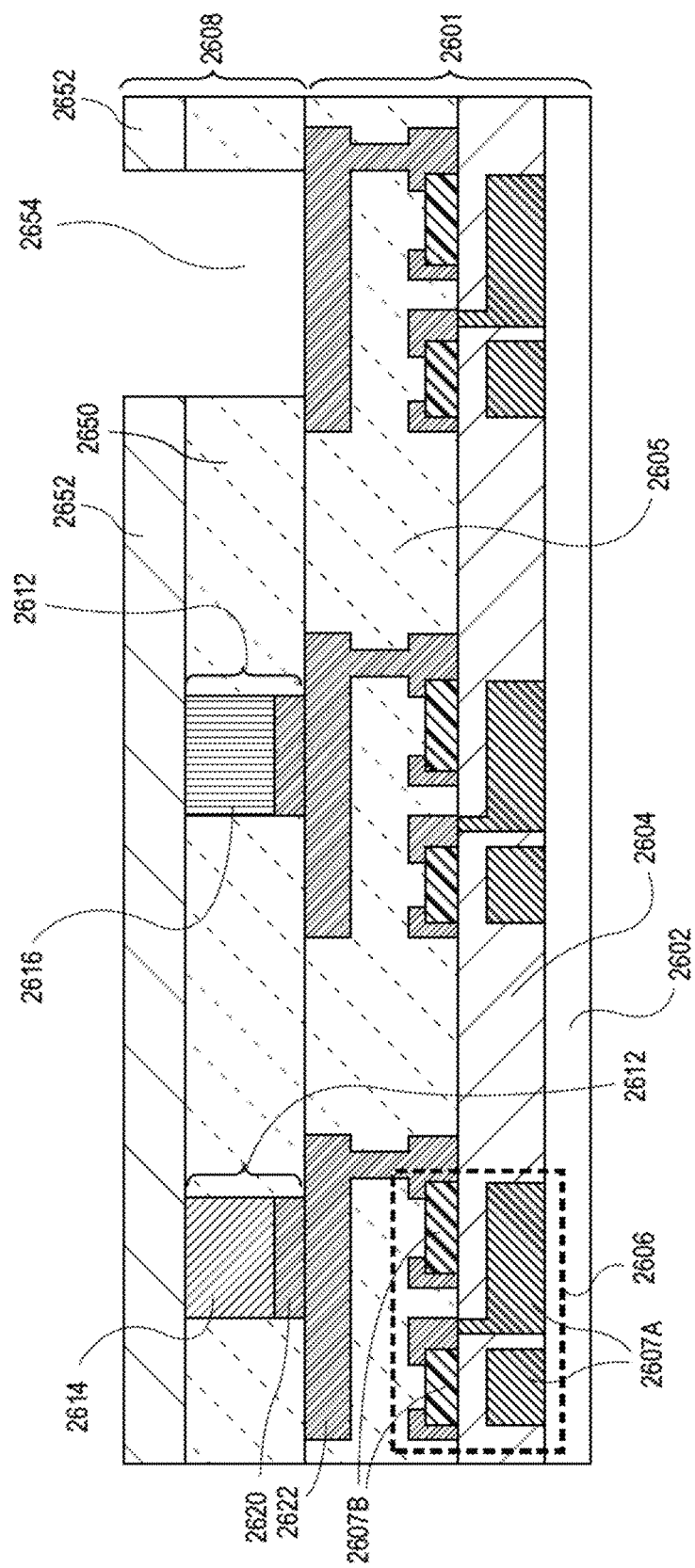

Referring to FIG. 26B, a planarization oxide layer 2650 is formed over the structure of FIG. 26A. A photoresist layer 2652 is then formed on the planarization oxide layer 2650. The photoresist layer 2652 is then patterned and used to etch planarization oxide layer 2650 to form opening 2654 exposing the conductive mirror 2622 that does not have a micro LED thereon, as is depicted in FIG. 26C.

Figure 26D:
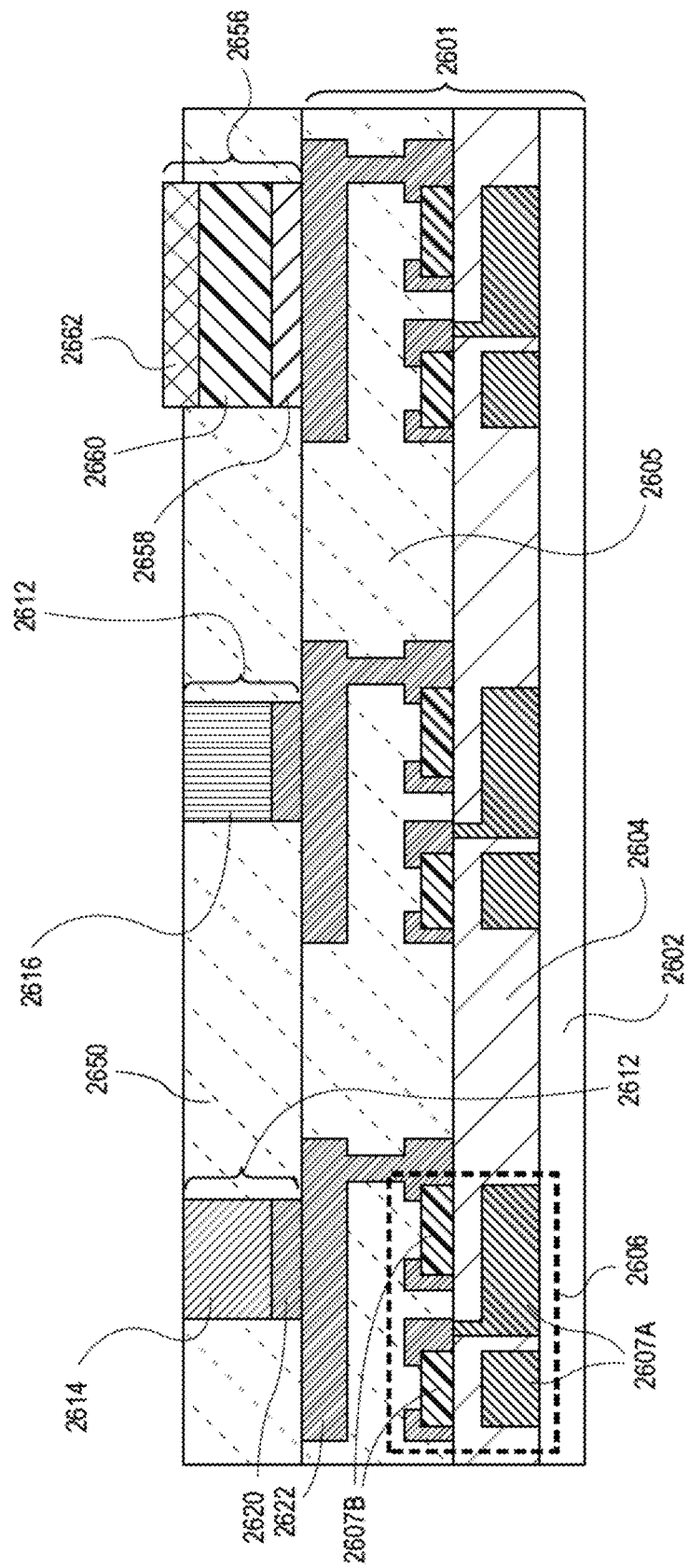
Figure 26E:
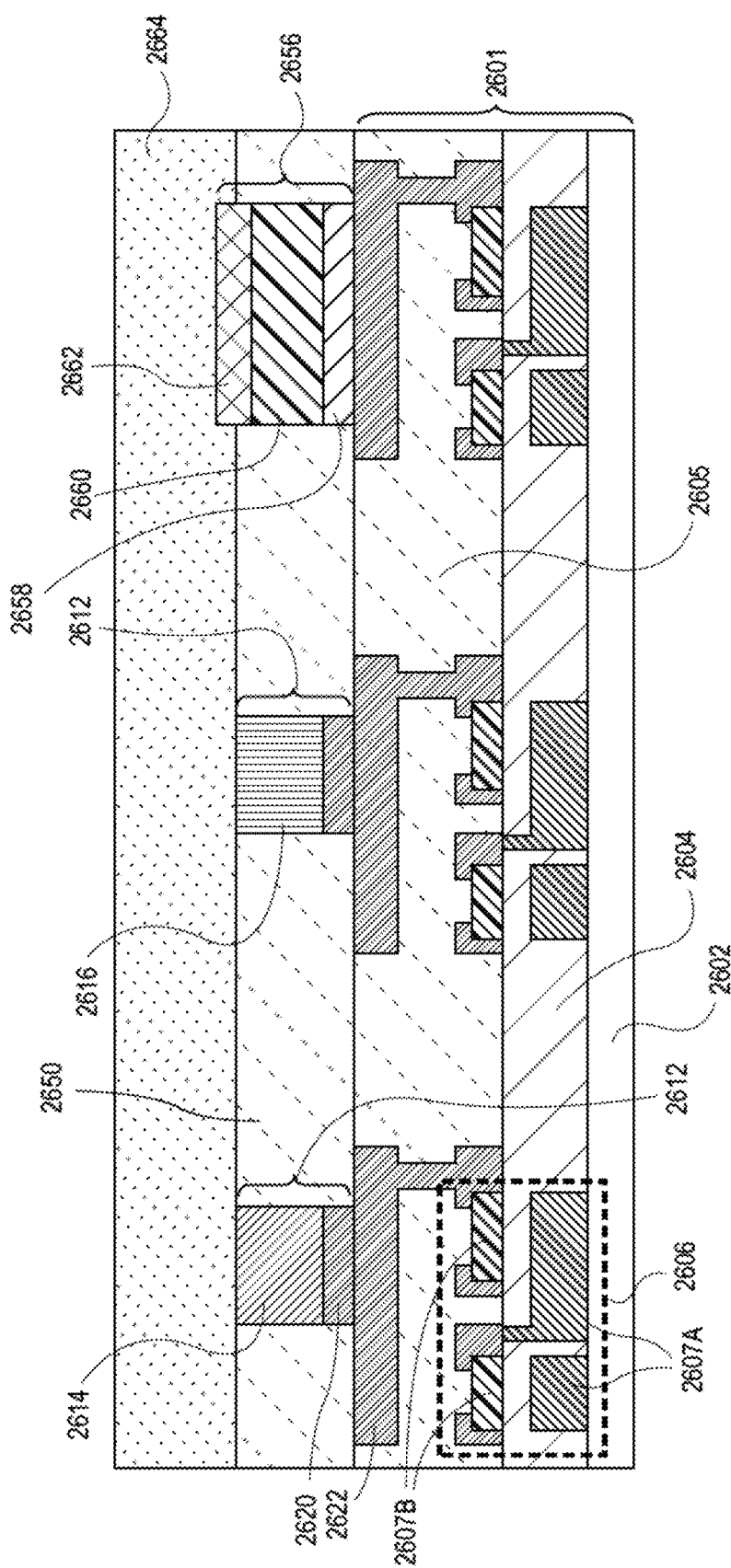

Referring to FIG. 26D, an organic LED (OLED) 2656 is formed in the opening 2654 and on the conductive mirror 2622 that does not have a micro LED thereon. In one embodiment, the OLED 2656 includes an organic anode 2658, an organic emissive layer 2660, and a layer 2662 including an organic ETL and an organic protection layer, examples of which are described above. A common cathode 2664, such as a transparent conducting oxide (CTO) layer, e.g., indium tin oxide (ITO), is then formed on the structure of FIG. 26D, as is depicted in FIG. 26E. In an embodiment, the OLED 2656 is a red micro organic LED.

In an embodiment, regarding the manufacturing of a red micro OLED, red micro OLEDs are fabricated to include a non-metallic cathode layer rather than a metallic cathode layer. In addition, an electron injecting interface layer may be present between the ITO cathode and an Alq3 electron transporting layer. The organic layers may be thermally deposited in a standard bell-jar evaporator at pressures of about $10^{-6}$ torr. The alpha-NPD layer (host material) may be deposited at a thickness of about 35 nm, the Alq3 electron transporting layer may be deposited at a thickness of about 45 nm, and the copper phthalocyanine (CuPc) or zinc phthalocyanine (ZnPc) may be deposited at a thickness of about 6 nm. The top ITO cathode layer may be RF sputter-deposited at low powers and can have a thickness of about 65 nm. Red micro OLEDs may also contain a CBP layer between the CuPc layer and the Alq3 layer. Such OLEDs may display performance characteristics comparable to the OLEDs in which no CBP layer is present.

Figure 27:
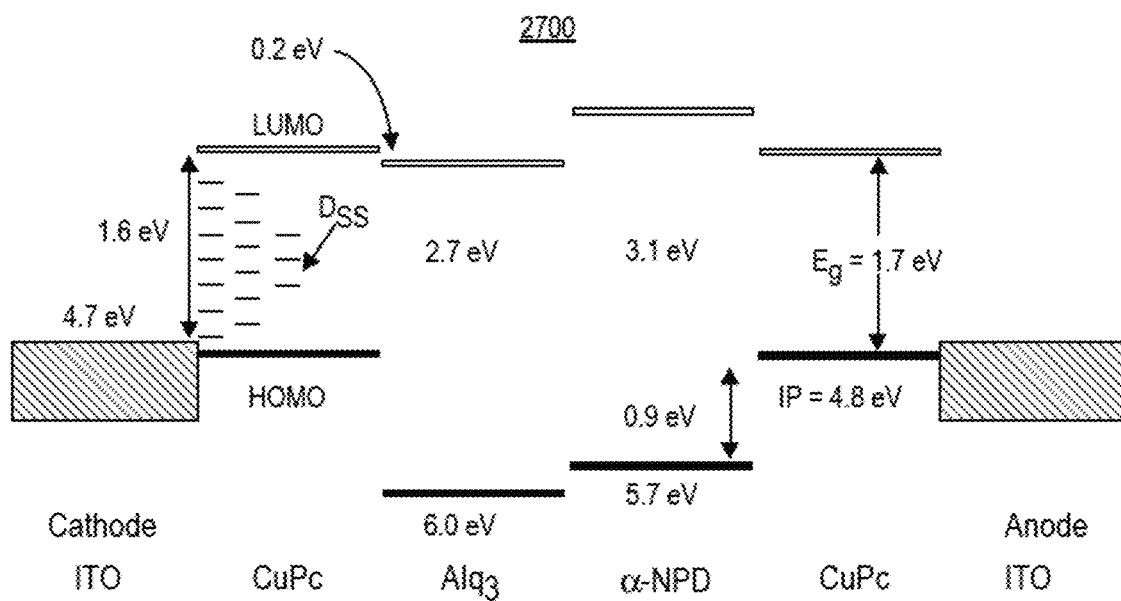
FIG. 27 is an energy band diagram of a red micro OLED, in accordance with an embodiment of the present disclosure.

FIG. 27 is an energy band diagram 2700 of a red micro OLED, in accordance with an embodiment of the present disclosure. The energy band diagram 2700 is representative of a red micro OLED stack used in the hybrid micro LED display of OLED-modified FIG. 24. In an embodiment, a layer of CuPc is used as a protection layer for subsequent deposition of ITO for the cathode of the device.

In an embodiment, regarding minimizing or eliminating burn-in for hybrid micro LED displays, a hybrid micro LED display is used. The display can display an image using a group of pixels. The display can implement a pixel shifting scheme. The pixel shifting scheme can move the display position of the image along an orbit. The orbit can be intended to shift the pixels used to display the image in all directions. By moving the display position of the image, the pixel shifting scheme aims to distribute pixel usage to an extended area outside of the original display area. Further, the pixel shifting scheme can be considered to be a universal pixel shifting scheme as it can be applied to all areas of the display screen, implying that each pixel has equal chance of coverage as a result of the shift.

In various embodiments described herein, historical data for content that has been displayed on hybrid micro LED screen or display is maintained or tracked. As an example, historical data for content that has been displayed by the hybrid micro LED displays can be maintained in a device driver of a graphics processing unit (GPU) (e.g., in a notebook computer) and/or in a memory. In various other embodiments, the pixel usage history could be maintained directly by an Operating System (OS), or through extension middleware or applications provided by independent software vendors. In various embodiments described herein, the historical data for content that has been displayed by the hybrid micro LED displays can be exploited or used by a pixel history generation (PHG) algorithm. The PHG algorithm can analyze the tracked historical data to generate or update a damage signature (DS) that is representative of the damage that has be incurred by the hybrid micro LED display. The PHG can render the damage signature available to the entity (e.g., notebook computer or handheld computer) implementing the history-aware pixel shifting algorithm.

Figure 28:
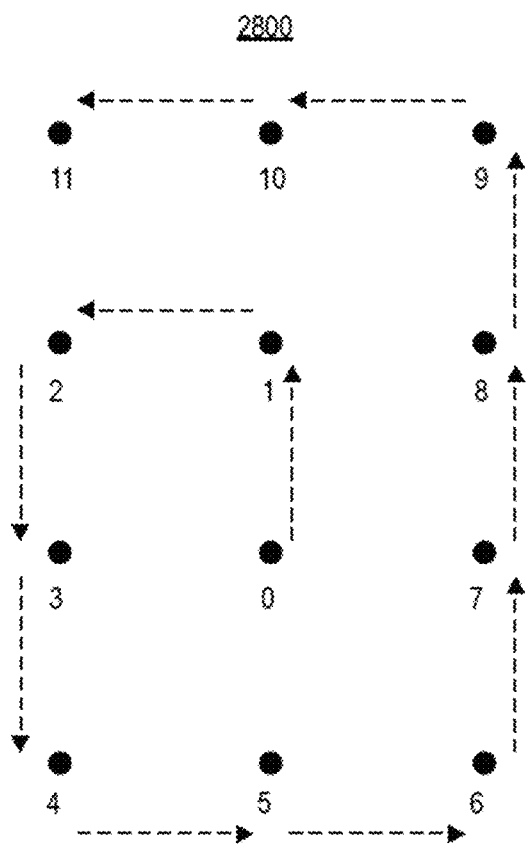
FIG. 28 is a schematic illustrating an exemplary pixel shifting scheme, in accordance with an embodiment of the present disclosure.

FIG. 28 is a schematic 2800 illustrating an exemplary pixel shifting scheme, in accordance with an embodiment of the present disclosure. The shift is performed from positions 0 to 11, in numerical order, following the path of the arrows depicted in FIG. 28.

Figure 29:
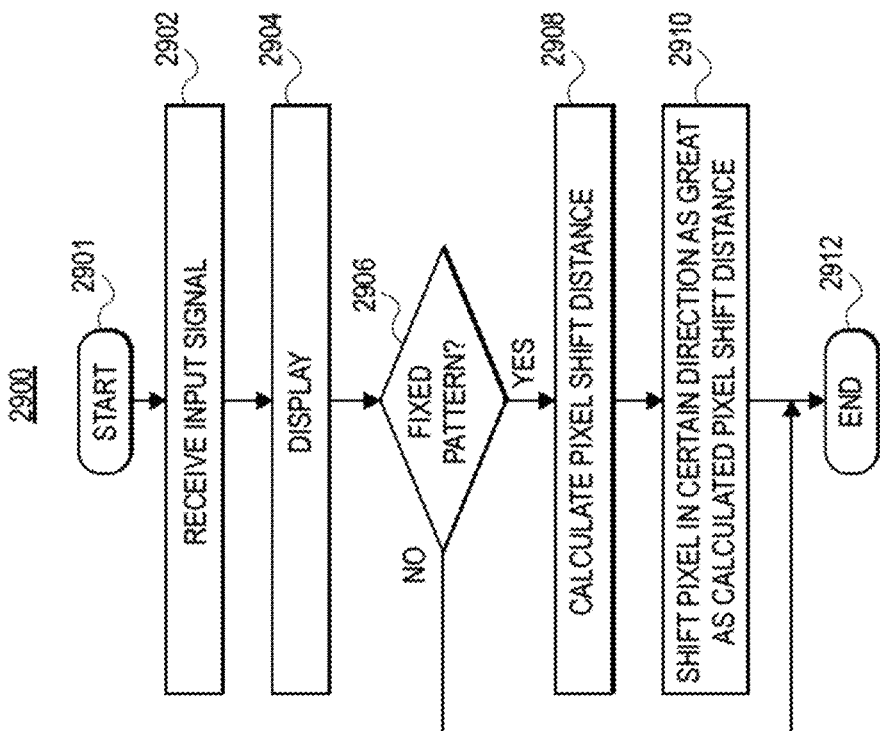
FIG. 29 is a flow diagram of pixel shifting for static images to minimize burn-in for hybrid micro LED displays, in accordance with an embodiment of the present disclosure.

FIG. 29 is a flow diagram 2900 of pixel shifting for static images to minimize burn-in for hybrid micro LED displays, in accordance with an embodiment of the present disclosure. Referring to flow diagram 2900, following a start 2901, an input signal is received at 2902. The input signal transfers to the display at 2904. At 2906, a fixed pattern decision is made to (Y) calculate pixel shift distance 2908, and then shift the pixel in a certain direction as great as a calculated pixel shift distance 2910, and then end 2912, or to (N) not perform operations 2908 and 2910 and to proceed to end 2912.

In another embodiment, a method of minimizing or eliminating burn-in for hybrid micro LED displays is described. When a fixed pattern is displayed at one or more locations on the display panel, resolution toggling between target resolution and lower resolution is used with a predetermined period to display the still image such that high brightness of pixels does not degrade and cause burn-in.

In an embodiment, an input image having an arbitrary resolution is converted to another image having a predetermined resolution of a display device to display the image with the converted resolution. As used herein, the term "resolution" can imply both a number of dots (i.e., a number of pixels) in a horizontal direction of an image and a number of lines (i.e., a number of scanning lines) in a vertical direction. The number of dots in the horizontal direction is referred to as the horizontal (H) resolution, whereas the number of lines in the vertical direction is referred to as the vertical (V) resolution.

The resolution of a given image on a given part of the display is H0×V0. When the image has been displayed for a long (predetermined) time, a circuit IP block is used to temporarily scale down H0×V0 to H1×V1 for a predetermined length of time. A control unit is then used to redisplay the still image at the specific location on the display with the display resolution H0×V0 again. The process is repeated until still image condition changes.

In an embodiment, a display receives image data to be displayed for a user of an electronic device. Display driver circuitry in the display may analyze the data to detect static data. The image data may contain static frames of data or static portions of a frame of data. In response to detection of static data, the display driver circuitry can take actions to avoid display damage due to burn-in effects.

To avoid burn-in effects, display driver circuitry in the display may monitor for the presence of static image content in some or all of a frame of data. When static image data is detected, the display driver circuitry can alter the way in which image data is being displayed on the display. For example, display brightness may be decreased, a peak luminance value associated with a peak luminance control algorithm may be reduced, and display pixel data values may be mapped to reduced brightness levels.

Figure 30:
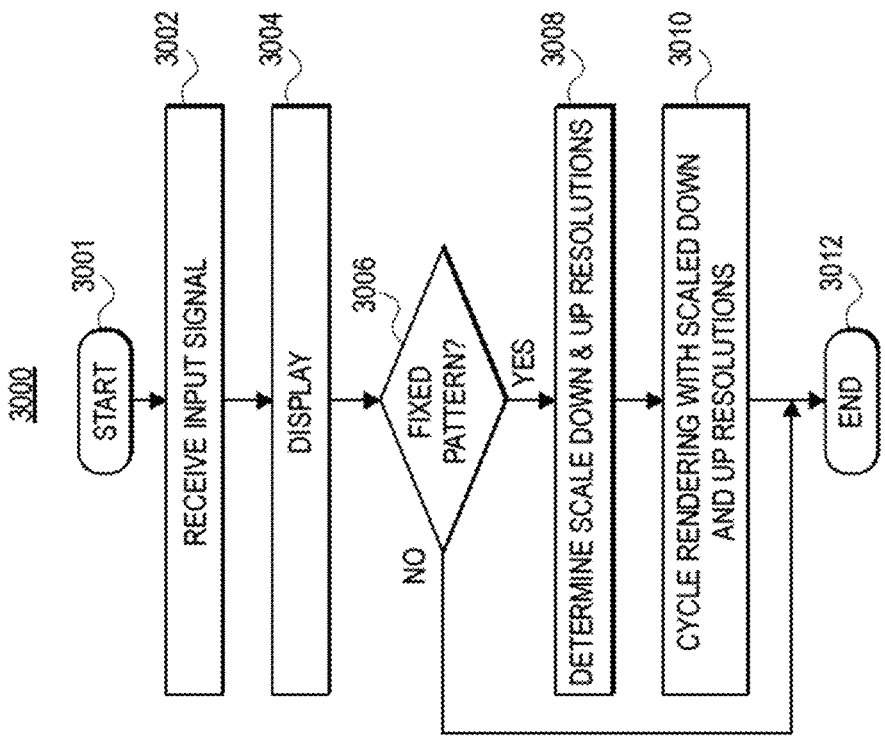
FIG. 30 is a flow diagram of resolution scale up and down for static images to minimize burn-in for hybrid micro LED displays, in accordance with an embodiment of the present disclosure.

FIG. 30 is a flow diagram 3000 of resolution scale up and down for static images to minimize burn-in for hybrid micro LED displays, in accordance with an embodiment of the present disclosure. Referring to flow diagram 3000, following a start 3001, an input signal is received at 3002. The input signal transfers to the display at 3004. At 3006, a fixed pattern decision is made to (Y) determine scale down and up resolutions 3008, and then cycle rendering with scaled down and up resolutions 3010, and then end 3012, or to (N) not perform operations 3008 and 3010 and to proceed to end 3012.

In an embodiment, an apparatus includes a memory and logic. At least a portion of the logic is implemented in circuitry coupled to the memory. The logic is configured to accumulate pixel usage data for a hybrid micro LED display to store in the memory, to receive image data for an image to be displayed, to generate a pixel shifting pattern for the image based on the accumulated pixel usage data and the image data for the image, to apply the pixel shifting pattern to the image to generate modified image data, and to output the modified image data for display.

In one embodiment, the accumulated pixel usage data is based on prior displayed images. In one embodiment, the logic is configured to generate a damage signature for the hybrid micro LED display based on the accumulated pixel usage data, the damage signature to indicate a level of damage incurred by one or more regions of the hybrid micro LED display. In one such embodiment, the level of damage specified by a priority level assigned to each region of the hybrid micro LED display. In one embodiment, the resolution of static images is scaled up and down in given intervals to minimize or eliminate screen burn-in.

One approach to display fabrication involves fabrication of discrete red, green, and blue μLEDs on separate wafers followed by transfer of the μLEDs using pick and place assembly to the display backplane each color at a time. The red μLED is fabricated using an AlInGaP material system, and the green and blue μLEDs are fabricated using the InGaN material system. Disadvantages of such an approach can include high manufacturing cost (due to the slow transfer rate of three types of μLEDs sequentially from source wafers to backplane). In addition, since three sequential transfers are needed, the probability of missing transfers increases and can result in low yield. This is particularly important for displays used in smartphones (e.g., diagonal=5.1"), converged mobility tablets (e.g., diagonal=7"), and mobile notebooks (e.g., diagonal=11.6"-13.3"). Alternatively, green and blue micro LEDs can be used together with quantum dots as a color conversion layer. In an example, the quantum dots are loaded into a photoresist. The loaded photoresist is spin-coated on the display and 90% of it is removed except from the areas where red subpixels are needed. As described above, such an approach can lead to a significant waste of expensive material resulting in higher display fabrication costs.

In accordance with one or more embodiments of the present disclosure, green and blue micro LEDs are fabricated monolithically on one wafer using an InGaN material system. The green and blue micro LEDs are then transferred from a source wafer to a display backplane using a "Direct Transfer Method" (i.e., not pick and bond). A common cathode composed of a transparent conductive material (e.g., ITO) is then deposited. Thermal evaporation is then used to selectively deposit an "organic" emissive layer on top of one of the inorganic blue micro LEDs that had previously been transferred to the display backplane. A thermal evaporation chamber is then used to selectively deposit, e.g., in a vacuum pressure of less than about $6\times10^{-6}$ Torr, a cathode layer on the organic emissive layer. The material stack used may be or include lithium quinolate (Liq) (1 nm)/aluminum (Al) (100 nm). Finally, a transparent dielectric sealant layer may be deposited to protect the organic red emissive layer from interaction with moisture.

Figure 31A:
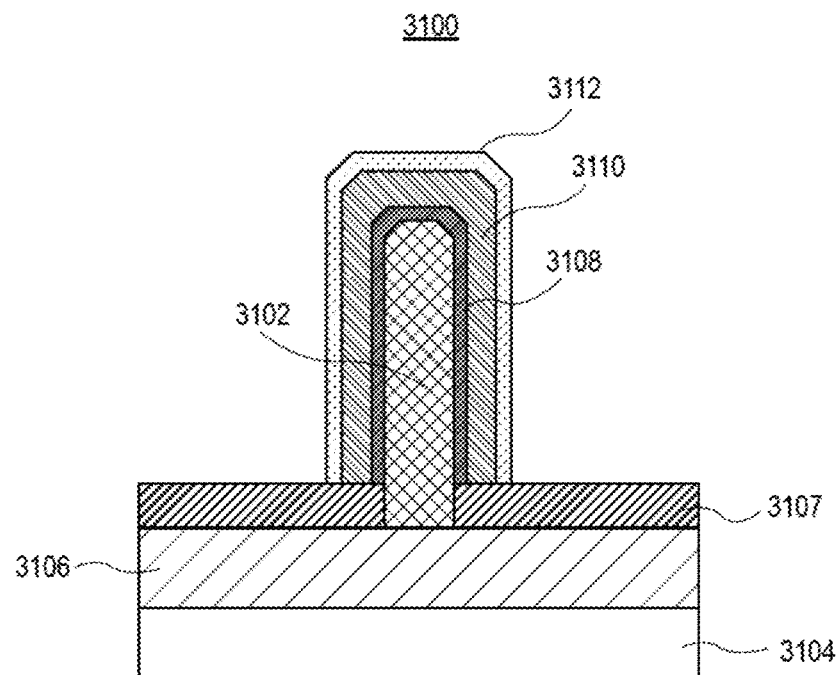
FIG. 31A illustrates a cross-sectional view of a truncated nanopyramid based LED highlighting certain layers of the LED, in accordance with an embodiment of the present disclosure.

To provide further context, FIGS. 31A-31D illustrate options for micro LED structures, in accordance with embodiments described herein. For example, FIG. 31A illustrates a cross-sectional view of a GaN truncated nanopyramid based LED highlighting certain layers of the LED, in accordance with an embodiment of the present disclosure. In a particular embodiment, an LED 3100 includes an n-type GaN truncated nanopyramid 3102. The GaN truncated nanopyramid 3102 is above a substrate 3104, which may be a Si(111) substrate. An intervening nucleation layer 3106 has an opened mask layer 3107 thereon. In one embodiment, the n-type GaN truncated nanopyramid 3102 has a diameter in the range of 25-75 nanometers. In one embodiment, the n-type GaN truncated nanopyramid 3102 is formed on a MN/AlN nucleation layer 3106 layer with MN=metal nitride, and where the metal can be Ti, Hf, Nb, etc. An active layer 3108 of InGaN is on the n-type GaN truncated nanopyramid 3102. A p-GaN cladding layer 3110 is included on the active layer 3108. A conductive electrode layer 3112 may be formed on the p-GaN cladding layer 3110, as is depicted. It is to be appreciated that a micro LED may be composed of multiple truncated nanopyramids connected in parallel. For example, a 5 micron×5 micron micro LED may be composed of, e.g., 20 truncated nanopyramids.

Figure 31B:
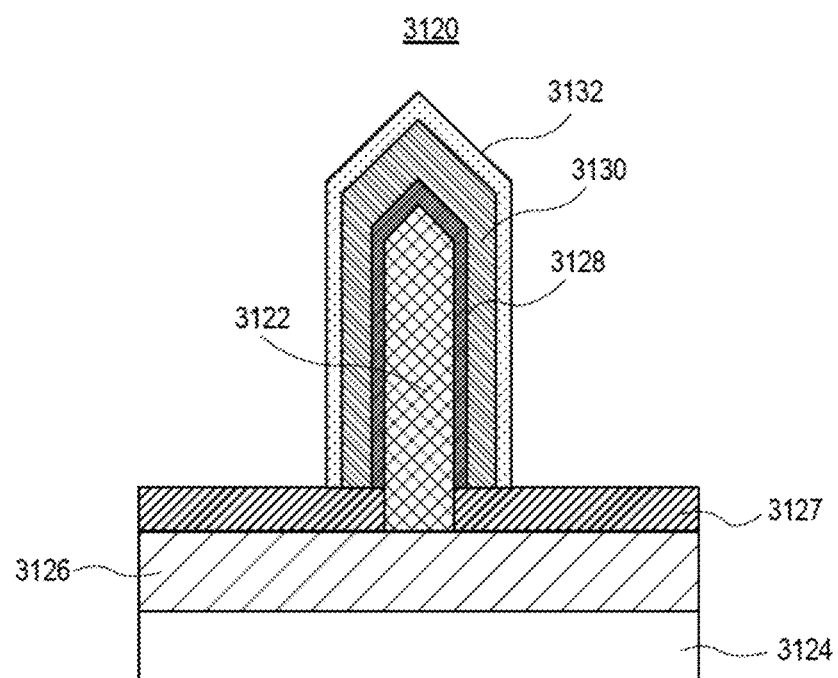
FIG. 31B illustrates a cross-sectional view of a nanowire based LED highlighting certain layers of the LED, in accordance with an embodiment of the present disclosure.

FIG. 31B illustrates a cross-sectional view of a GaN nanowire based LED highlighting certain layers of the LED. In a particular example, an LED 3120 includes, an n-type GaN nanowire 3122. The GaN nanowire 3122 is above a substrate 3124, which may be a Si(111) substrate. An intervening nucleation layer 3126 has an opened mask layer 3127 thereon. In one embodiment, the n-type GaN nanowire 3122 has a diameter in the range of 100-400 nanometers, and a height in the range of 1-10 microns. An active layer 3128 of InGaN is on the n-type GaN nanowire 3122. A p-GaN cladding layer 3130 is included on the active layer 3128. A conductive electrode layer 3132 may be formed on the p-GaN cladding layer 3130, as is depicted. It is to be appreciated that a micro LED may be composed of multiple nanowires connected in parallel. For example, a 5 micron×5 micron micro LED may be composed of, e.g., 20 nanowires.

Figure 31D:
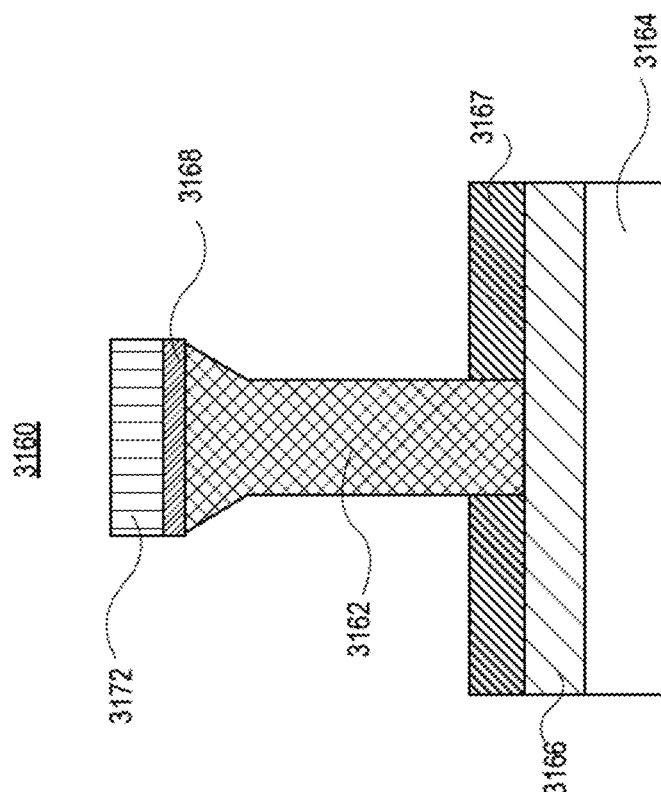
FIG. 31D illustrates a cross-sectional view of an axial nanowire based LED highlighting certain layers of the LED, in accordance with an embodiment of the present disclosure.
Figure 31C:
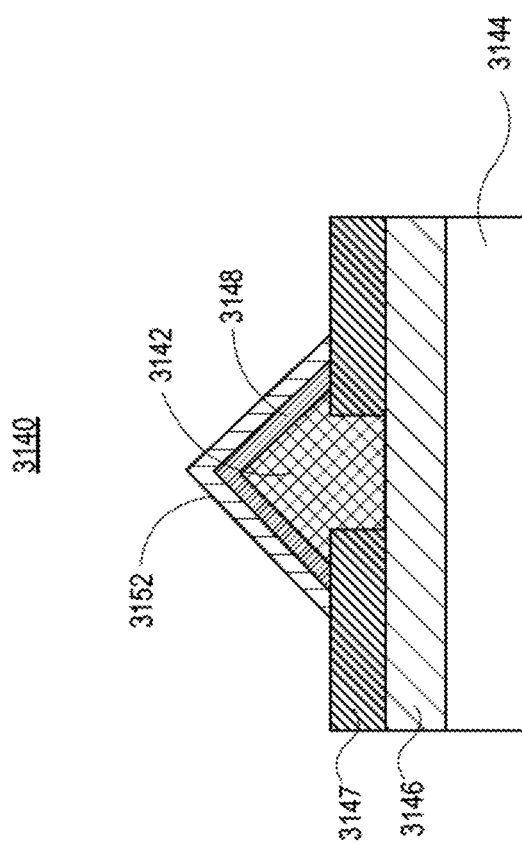
FIG. 31C illustrates a cross-sectional view of a nanopyramid or micropyramid based LED highlighting certain layers of the LED, in accordance with an embodiment of the present disclosure.

FIG. 31C illustrates a cross-sectional view of a nanopyramid or micropyramid based LED highlighting certain layers of the LED. In a particular example, an LED 3140 includes an n-GaN nanopyramid 3142 above a substrate 3144, which may be a Si(111) substrate. An intervening nucleation layer 3146, such as described for FIG. 31A, has an opened mask layer 3147 thereon. An active layer 3148, such as described for FIG. 31A, is included on the n-GaN nanopyramid 3142. A p-type cladding layer 3152, such as described for FIG. 31A, is included on the active layer 3148. It is to be appreciated that a micro LED may be composed of multiple nanopyramids connected in parallel. For example, a 5 micron×5 micron micro LED may be composed of, e.g., 20 nanopyramids.

FIG. 31D illustrates a cross-sectional view of an axial nanowire based LED highlighting certain layers of the LED. In a particular embodiment, an LED 3160 includes an n-GaN axial nanowire 3162 above a substrate 3164, which may be a Si(111) substrate. An intervening active layer 3166, such as described for FIG. 31A, has an opened mask layer 3167 thereon. An active layer 3168, such as described for FIG. 31A, is included on the n-GaN axial nanowire 3162. A p-type cladding layer 3172, such as described for FIG. 31A, is included on the active layer 3168.

In an embodiment, a silicon wafer includes "pixels" with green and blue μLEDs grown monolithically on the silicon wafer using GaN-based nanowire technology. The μLED pixels are transferred to a display backplane using an appropriate transfer method. A transparent conductive oxide (e.g. ITO) is deposited on all μLEDs to provide common cathode contact. Then red organic color conversion films are selectively deposited on some of the blue μLEDs to produce red color emission. A transparent barrier film (e.g., $SiO_2$) is deposited on top of the structure to protect the organic films from exposure to moisture/oxygen which can result in film quality degradation.

Figure 32:
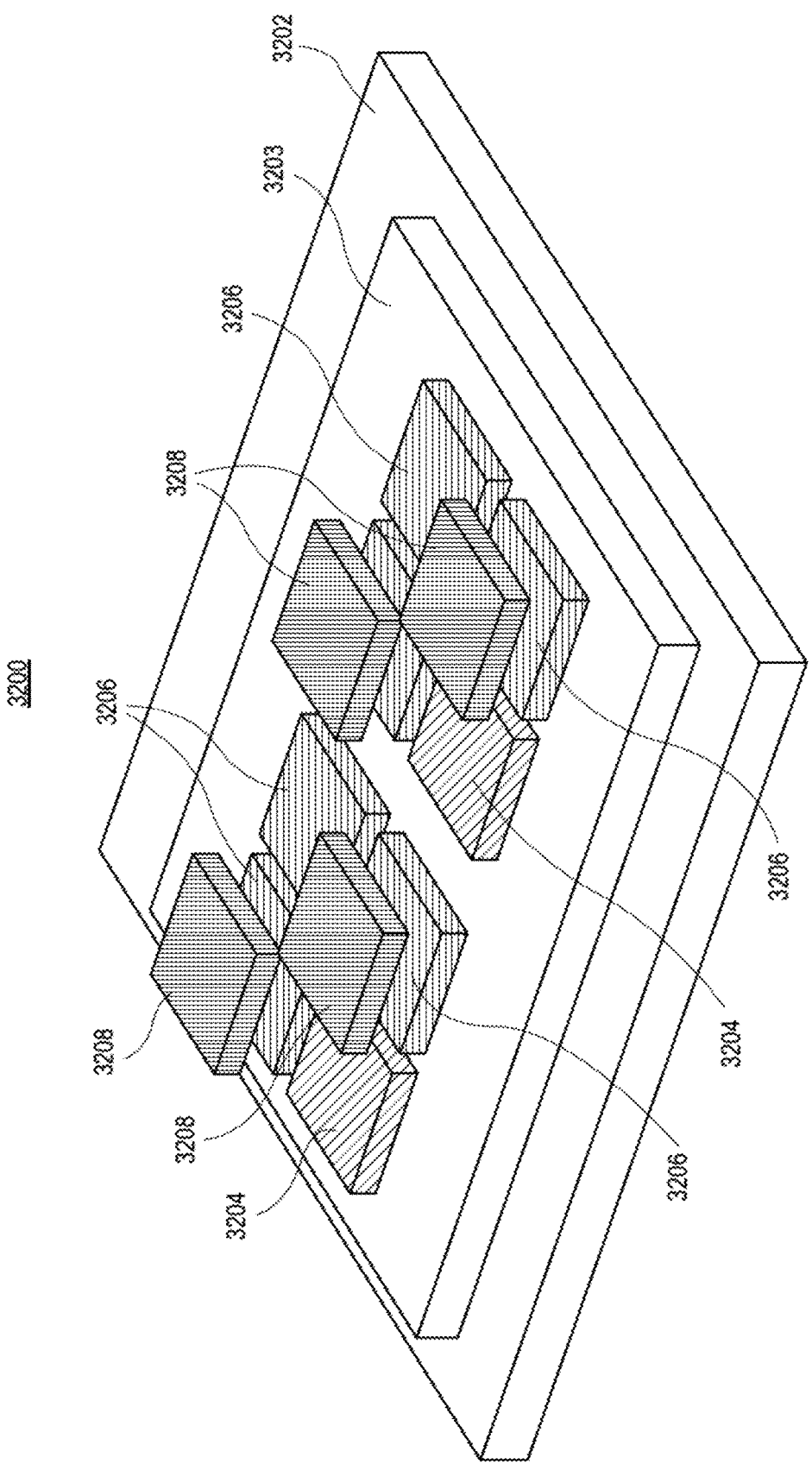
FIG. 32 schematically illustrates an angled cross-sectional view of a display device, in accordance with an embodiment of the present disclosure.

With respect to final display architecture, FIG. 32 schematically illustrates an angled cross-sectional view of a display device, in accordance with an embodiment of the present disclosure. Referring to FIG. 32, a display 3200 includes a backplane 3202 having a TCO layer (common cathode) 3203 thereon. Green LEDs 3204 and blue LEDs 3206 are included within the TCO layer 3203. A color conversion device (CCD) 3208 is included over select ones of the blue LEDs 3206. In one embodiment, the color conversion device (CCD) 3208 ultimately provides a source of red light.

Referring again to FIG. 32, in a particular embodiment, the blue 3206 and green 3204 µLEDs that have been grown monolithically on one wafer are transferred to the display backplane using an appropriate transfer method (e.g., a Direct Transfer Method described herein). A transparent conductive oxide (e.g. ITO) is deposited on all µLEDs to provide common cathode contact. Color Conversion Devices (CCDs) 3208 are prepared on a glass substrate separately. In one embodiment, the CCDs are composed of quantum dot photoresist films sandwiched between two oxide (e.g., $SiO_2$) films on the top and bottom. The CCDs may be transferred to the display backplane using the "Direct Transfer Method" by bonding the CCDs to "oxide pads" that have been patterned on top of the ITO common cathode.

Advantages of implementing one or more embodiments described herein can include (1) low manufacturing cost (accomplished by transferring the red-green-blue micro LED pixels in one pass from silicon wafer to the display backplane, and resulting in faster transfer rate and higher yield, i.e., lower transfer-related defects on the display), and/or (2) low power consumption (accomplished by realizing high efficiency red, green and blue micro LEDs at the same time). The projected power reduction using approaches described herein can be about 3-5 times as compared to purely LCD or purely OLED technology.

Figure 33:
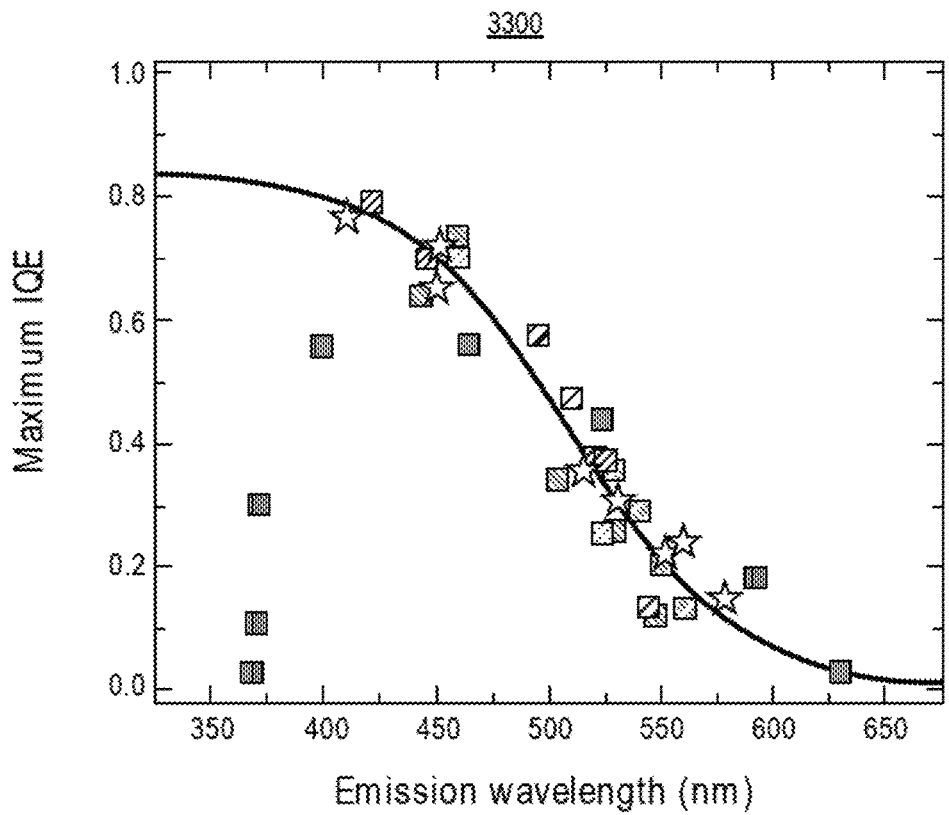
FIG. 33 is a plot of maximum IQE as a function of emission wavelength for a historical survey of experimental data of "planar" InGaN/GaN LED devices over the UV-to-Visible range, in accordance with an embodiment of the present disclosure.

To provide additional context, an issue with efficiency of GaN-based red micro LEDs for light emitting devices, such as light emitting diodes (LED), is that the emission wavelength is determined by the band gap of the active region of the LED together with thickness determined confinement effects. Often, the active region includes one or more quantum wells (QWs). For III-nitride based LED devices, such as GaN based devices, the active region (e.g., quantum well) material is preferably ternary, such as $In_xGa_{1-x}N$, where $0 \leq x \leq 1$. The band gap of such III-nitride can be dependent on the amount of In incorporated in the active region (e.g., in the QW(s)). A higher In incorporation can yield a smaller band gap and thus longer wavelength of the emitted light. InGaN may be a very attractive material for the development of various optical devices in the entire visible spectral range owing to the tenability of the bandgap energy by adjusting the indium content. A low-In-content InGaN-based blue light-emitting diode (LED) has exhibited an internal quantum efficiency (IQE) of approximately 83%. However, the IQEs of long-wavelength LEDs emitting light in the green, yellow, orange, and red regions can be much lower. As an example, FIG. 33 is a plot 3300 of maximum IQE as a function of emission wavelength for a historical survey of experimental data of "planar" InGaN/GaN LED devices over the UV-to-Visible range, in accordance with an embodiment of the present disclosure. Referring to plot 3300, the maximum internal quantum efficiency (IQE) decreases as a function of wavelength.

To provide further context, critical factors causing low efficiency in high-In-content InGaN-based LEDs may include (1) defects in the InGaN active layer due to the lattice mismatch between $In_xGa_{1-x}N$ and GaN (e.g., lattice mismatch between InN and GaN is 11%), and/or (2) the piezoelectric field in the strained InGaN active layers can become very large for high indium content, causing low internal quantum efficiency owing to electron-hole separation in InGaN multiple quantum wells. This can be particularly important for growing InGaN on c-plane GaN. For a/m-planes, however, the effect may be negligible.

Figure 34:
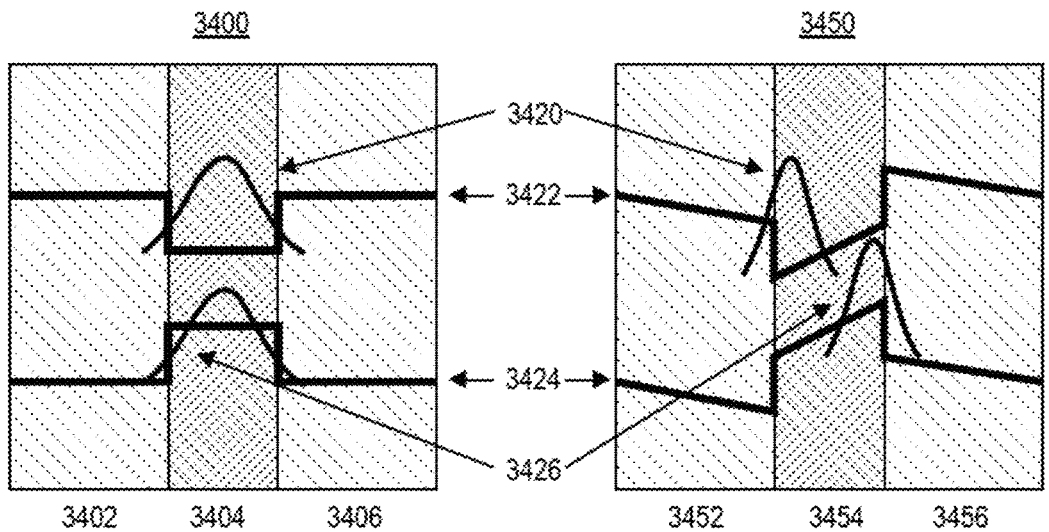
FIG. 34 is a schematic of band diagrams of GaN/InGaN/GaN quantum wells with different growth planes, in accordance with an embodiment of the present disclosure.

As an example, FIG. 34 is a schematic of band diagrams of GaN/InGaN/GaN quantum wells with different growth planes, in accordance with an embodiment of the present disclosure. Referring to FIG. 34, an a/m-plane structure 3400 is shown for GaN 3402, InGaN 3404 and GaN 3406 layers. A c-plane structure 3450 is shown for GaN 3452, InGaN 3454 and GaN 3456 layers. Corresponding parameters shown for the differing structures include electron wave function 3420, conduction band edge 3422, valence band edge 3424 and hole wave function 3426.

To provide further context, photoluminescent (PL) LEDs are unlike an electroluminescent LED (EL-LED), in that a PL light emitting device (or color conversion device (CCD)) does not require an electrical drive current from an external electronic circuit in order to emit light. Instead, as best understood, the PL-LED generates electron-hole pairs by absorption of light at a first wavelength λ1 in an active region of the PL-LED. The electrons and holes then recombine in potential wells in the active region to emit light at a second wavelength λ2 different from the first wavelength λ1. The initiating radiation or "pump light" at the first wavelength λ1 is typically provided by a blue, violet, or ultraviolet emitting EL-LED coupled to the PL-LED. The active region of the PL-LED can be made of a phosphor such as colloidal quantum dots. When a UV or blue light wave hits a phosphor or quantum dot film, several phenomena occur. The light is reflected at the surface (specular and diffuse behavior), selectively absorbed by the phosphor or quantum dot film, scattered by phosphor particles (differently depending on the particle size), converted to different wavelengths or transmitted through the film.

As described above in association with FIGS. 1A and 1B, a process flow for fabricating micro LEDs with color conversion devices (QDs) can involve loading a photoresist film with quantum dots (QDs) and then spin-coating the mixture on a display plane. The film is then patterned using lithography. This approach can achieve very high resolution but can waste about 90% of expensive material.

In accordance with an embodiment of the present disclosure, a process flow is provided for fabricating hybrid organic-inorganic micro LED displays. The final structure may be such as described in association with FIG. 35. The process flow can involve assembly of green and blue micro LEDs from a source wafer (e.g., where the green and blue micro LEDs were grown monolithically) to a display backplane. Deposition of a common cathode electrode composed of a transparent conductive oxide, such as ITO, is then performed. Next, selective deposition (e.g., via thermal evaporation through a fine metal mask) of organic emissive layer that converts blue light from an inorganic micro LED to red light is performed. In one embodiment, the emissive layer is formed from a luminescent film belonging to the class of fluorescent metal chelate complexes. An example of a suitable fluorescent metal chelate complex is tris(8-hydroxyquinoline)aluminum (ALQ3).

Figure 35:
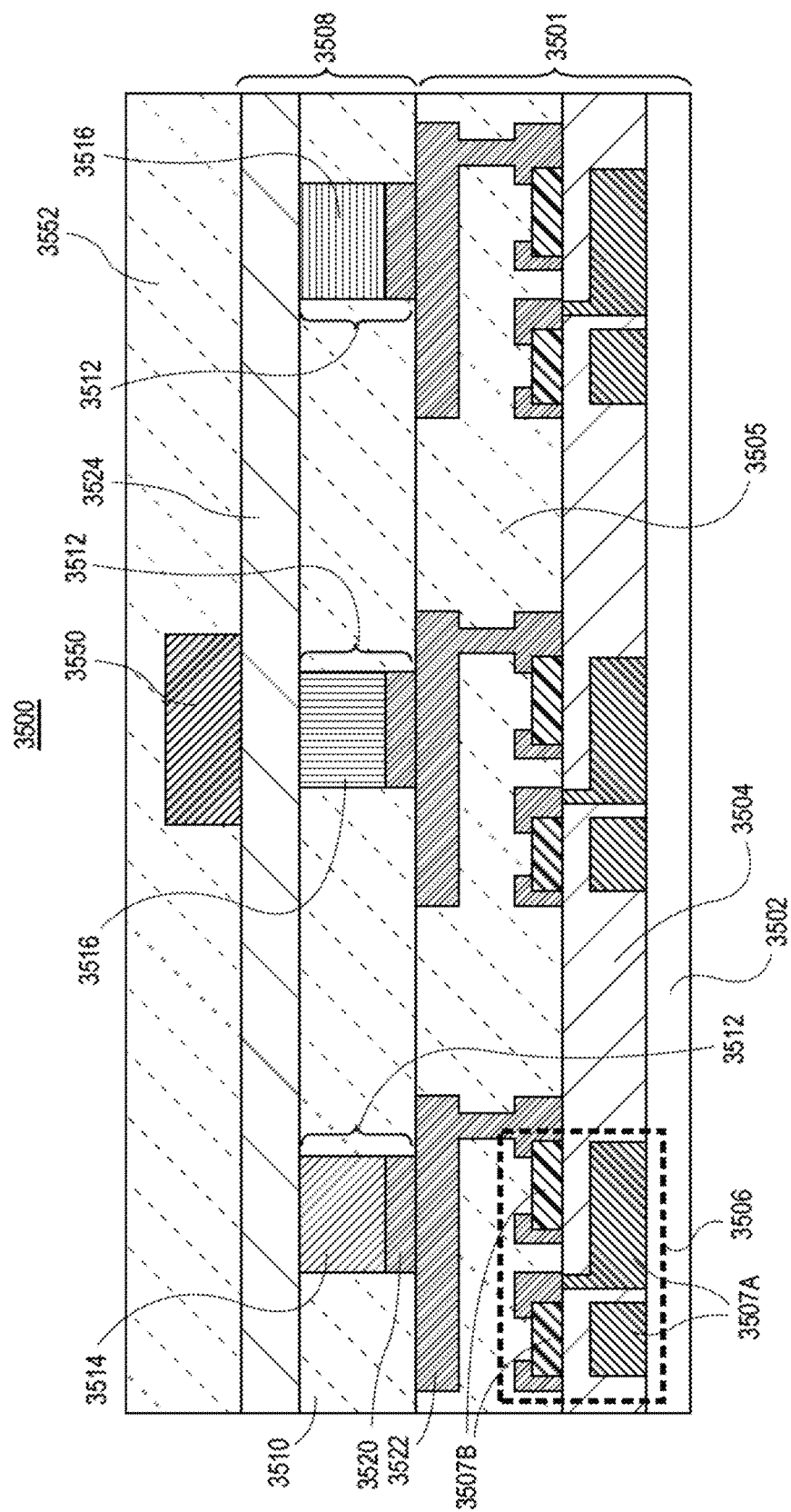
FIG. 35 illustrates a cross-sectional view of a pixel structure having a passivation oxide to protect an organic emissive layer from moisture/oxygen, in accordance with an embodiment of the present disclosure.

As an exemplary structure, FIG. 35 illustrates a cross-sectional view of a pixel structure having a passivation oxide to protect an organic emissive layer from moisture/oxygen, in accordance with an embodiment of the present disclosure.

Referring to FIG. 35, a pixel structure 3500 includes a backplane 3501. The backplane 3501 includes a glass substrate 3502 having an insulating layer 3504 thereon. Pixel thin film transistor (TFT) circuits 3506 are included in and on the insulating layer 3504. Each of the pixel TFT circuits 3506 includes gate electrodes 3507A, such as metal gate electrodes, and channels 3507B, such as polycrystalline silicon channels or IGZO channels. A portion of the insulating layer 3504 may act as a gate dielectric for each of the pixel TFT circuits 3506. A conductive mirror 3522 is in a dielectric layer 3505 and over each of the TFT circuits 3506.

Referring again to FIG. 35, the pixel structure 3500 includes a front plane 3508 on the backplane 3501. The front plane 3508 includes LEDs in a dielectric layer 3510, such as a carbon-doped oxide layer. In the example shown, three micro LEDs 3512 are included. Each micro LED includes a corresponding micro light emitting diode device 3514, 3516 (left) or 3516 (right) on a conductive interconnect structure 3520, such as a conductive bump. In a particular embodiment, micro light emitting diode devices 3514, 3516 (left) or 3516 (right) are green, blue and blue micro light emitting diode devices, respectively. It is to be appreciated that other arrangements may be used, including variation in number and/or colors of micro LED devices included.

The front plane 3508 also includes a transparent conducting oxide layer 3524, such as a layer of indium tin oxide (ITO), as a cathode of the pixel structure 3500. An organic emissive layer or structure 3550 is included on the transparent conducting oxide layer 3524 and over the 3516 (left) blue micro light emitting diode device. In an embodiment, the organic emissive layer or structure 3550 is or includes a luminescent film belonging to the class of fluorescent metal chelate complexes, such as tris(8-hydroxyquinoline)aluminum (ALQ3). In one embodiment, the organic emissive layer or structure 3550 converts blue light from the 3516 (left) blue inorganic micro light emitting diode device to red light. In an embodiment, a passivation layer 3552 is formed over the organic emissive layer or structure 3550.

In an embodiment, each of the pixel TFT circuits 3506 is a circuit such as circuit 3950, described herein. In one embodiment, each of the pixel thin film transistor circuits 3506 includes a current mirror and a linearized transconductance amplifier coupled to the current mirror, as described in greater detail below. In an embodiment, the plurality of micro light emitting diode devices 3514, 3516 (left) and 3516 (right) is a plurality of GaN nanowire-based or nanopyramid-based micro light emitting diode devices. Embodiments described herein may be based only on the back plane 3501 described above. Embodiments described herein may be based only on the front plane 3508 described above. With reference again to FIG. 35, the anode and cathode contacts of the micro LEDs are shown. A common anode electrode (e.g., indium tin oxide) connects all anodes of all micro LEDs as shown. The cathodes are connected to pixel circuits as shown.

In an embodiment, a "pixel" structure is a blue-blue-blue-green monolithic μLED "pixel" structure fabricated on a silicon wafer. The blue or green micro LEDs can have size of 3-10 μm, but preferably about 4 μm. It is to be appreciated that multiple micro LEDs per pixel may be used.

A two-step process for transferring micro LEDs from a silicon wafer to a display backplane may be implemented. First, selective bonding is performed using thermocompression bonding (TCB) or fusion bonding. Prior to bonding, both substrates (Micro-LED wafer and target display backplane) may be subjected to pre-processing operations of plasma treatment and cleans to activate the surface. Surface activation may ensure that the micro-LED will have strong bond with target Cu pads on display backplane. Next, selective release of micro LEDs are performed using backside (silicon side) irradiation with infrared laser, e.g., with a wavelength greater than 1300 nm. Post bond and release, a clean operation may be implemented on the display backplane having the micro-LEDs thereon to clean any residuals from the release layer left on micro-LEDs.

Figure 36A:
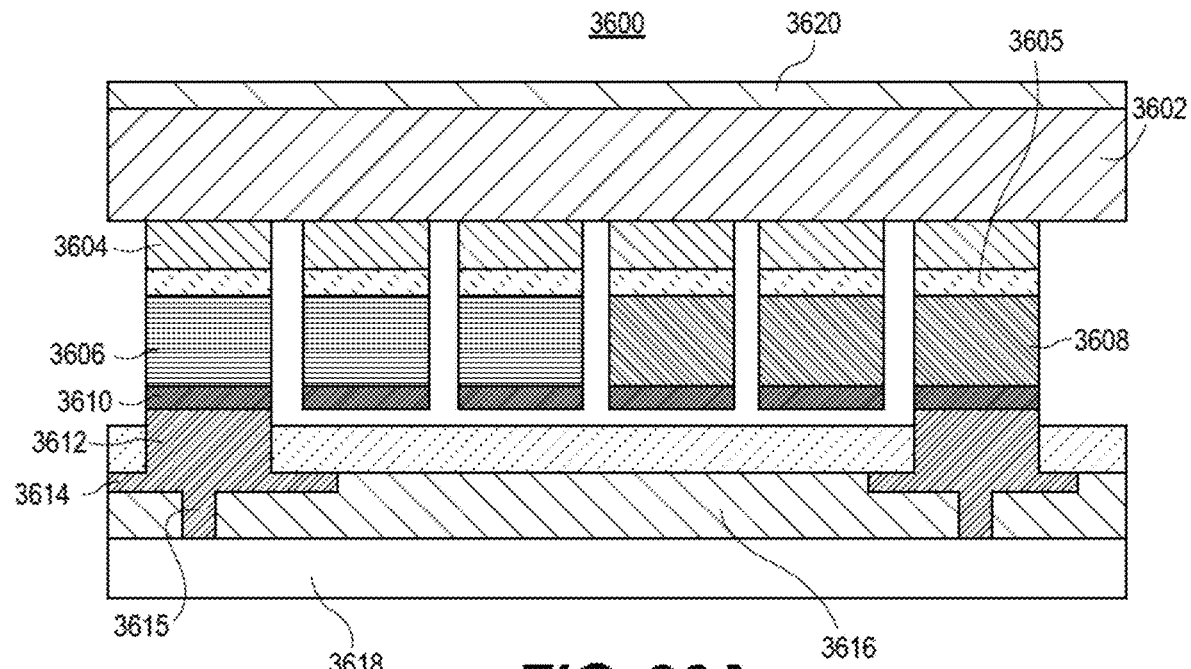
FIG. 36A illustrates a cross-sectional view of assembly components (e.g., micro LED wafer and display backplane) during "selective bonding" of micro LEDs, in accordance with an embodiment of the present disclosure.

As an example, FIG. 36A illustrates a cross-sectional view of assembly components 3600 (e.g., micro LED wafer and display backplane) during "selective bonding" of micro LEDs, in accordance with an embodiment of the present disclosure.

Referring to FIG. 36A, an LED substrate 3602, such as a silicon wafer, has a patterned growth or nucleation layer 3604 thereon, such as a patterned aluminum nitride layer. Individual micro LEDs 3606/3608 are associated with each pattern feature of the patterned growth or nucleation layer 3604. In one embodiment, a first group of one type of micro LEDs 3606, such as blue micro LEDs, is adjacent a second group of micro LEDs 3608, such as green micro LEDs. A release layer 3605, such as a metal nitride layer, may be between the individual micro LEDs 3606/3608 and the associated pattern feature of the patterned growth or nucleation layer 3604, as is depicted. A metal bonding layer 3610, such as a copper or aluminum layer, is on each of the individual micro LEDs 3606/3608. A backplane 3618 is opposite the LED substrate 3602. The backplane 3618 may include a dielectric layer 3616 having conductive features therein. The conductive features may include reflective plates 3614 and associated vias 3615. Metal pads or bumps 3612 are on the reflective plates 3614. In an embodiment, metal bonding layer 3610 is a copper layer and metal pads or bumps 3612 are copper pads or bumps. In another embodiment, metal bonding layer 3610 is an aluminum layer and metal pads or bumps 3612 are aluminum pads or bumps. Selected ones of the individual micro LEDs 3606/3608 are bonded to a corresponding metal pads or bumps 3612 to provide a micro LED wafer bonded to a display backplane. An anti-reflective coating 3620 is formed on the LED substrate 3602.

Figure 36B:
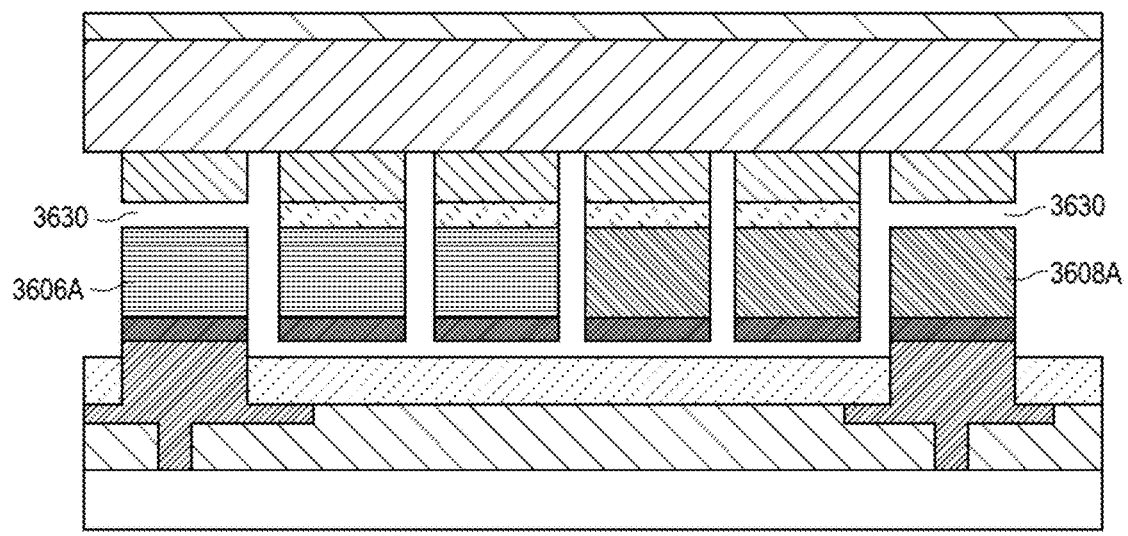
FIG. 36B illustrates a cross-sectional view of assembly components (e.g., micro LED wafer and display backplane) during "selective release" of micro LEDs, in accordance with an embodiment of the present disclosure.

FIG. 36B illustrates a cross-sectional view of assembly components (e.g., micro LED wafer and display backplane) during "selective release" of micro LEDs, in accordance with an embodiment of the present disclosure. The LED substrate 3602 is then released from the display backplane 3618 upon removal of release layer 3605 at locations 3630 of the selected ones of the individual micro LEDs 3606/3608. The selective release leaves micro LEDs 3606A and 3608A remaining as bonded to the display backplane 3618. The remaining micro LEDs on LED substrate 3602 may then be bonded to another display back plane.

As an example of a blanket release approach, FIGS. 37A-37E illustrate cross-sectional views of various operations in a method of assembling a micro LED display, in accordance with an embodiment of the present disclosure.

Figure 37A:
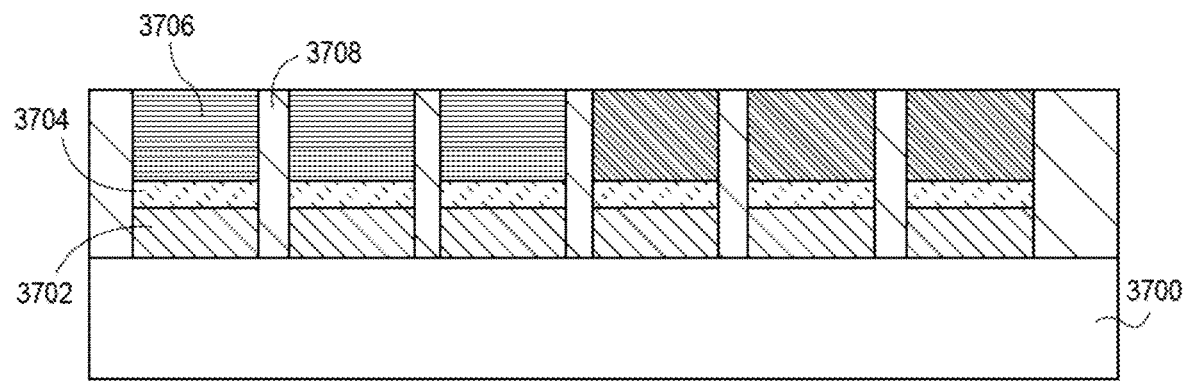
FIGS. 37A-37E illustrate cross-sectional views of various operations in a method of assembling a micro LED display, in accordance with an embodiment of the present disclosure.

Referring to FIG. 37A, an LED substrate 3700, such as a silicon wafer, has a patterned growth or nucleation layer 3702 thereon, such as a patterned aluminum nitride layer. Individual micro LEDs 3706 are associated with each pattern feature of the patterned growth or nucleation layer 3702. A release layer 3704, such as a metal nitride layer, may be between the individual micro LEDs 3706 and the associated pattern feature of the patterned growth or nucleation layer 3702, as is depicted. An insulating layer 3708 surrounds the micro LEDs 3706.

In an embodiment, "blanket release" of micro LEDs is performed by irradiation (e.g., through the wide-bandgap micro LEDs) with infra-red laser with a wavelength greater than approximately 1300 nm. The release layer (transition metal nitride) absorbs the infra-red radiation and bonds between the release layer and micro LEDs become very weak.

Figure 37B:
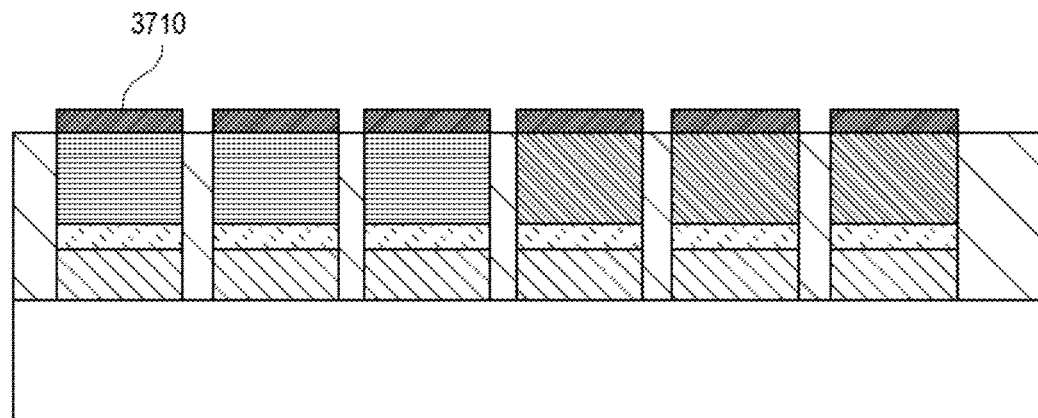
Figure 37C:
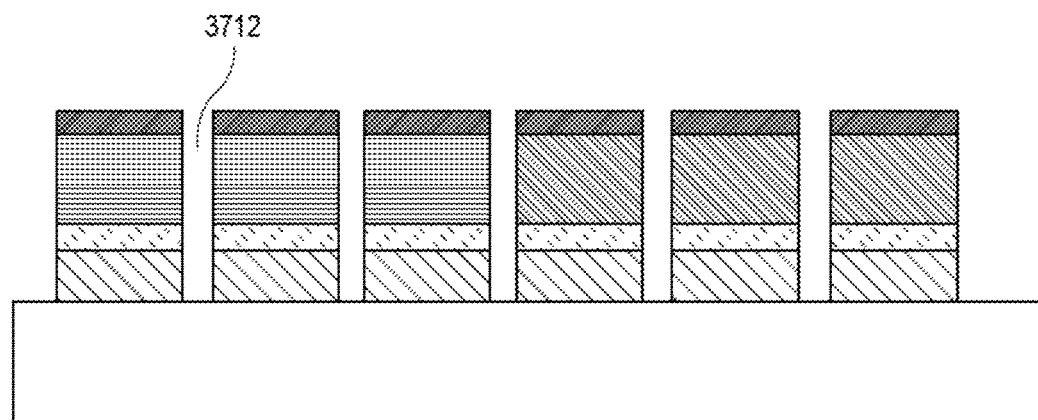

Referring to FIG. 37B, a metal bonding layer 3710, such as a copper or aluminum layer, is formed as a pad on each of the individual micro LEDs 3706. The insulating layer 3708 is then removed, as depicted in FIG. 37C.

Figure 37D:
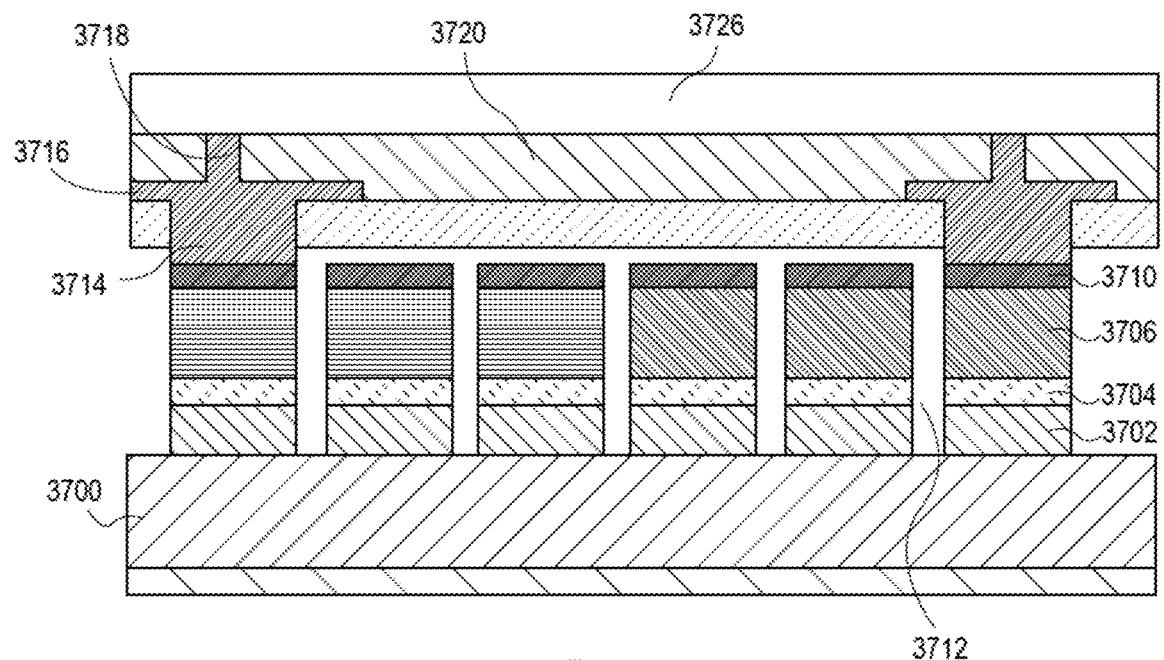
Figure 37E:
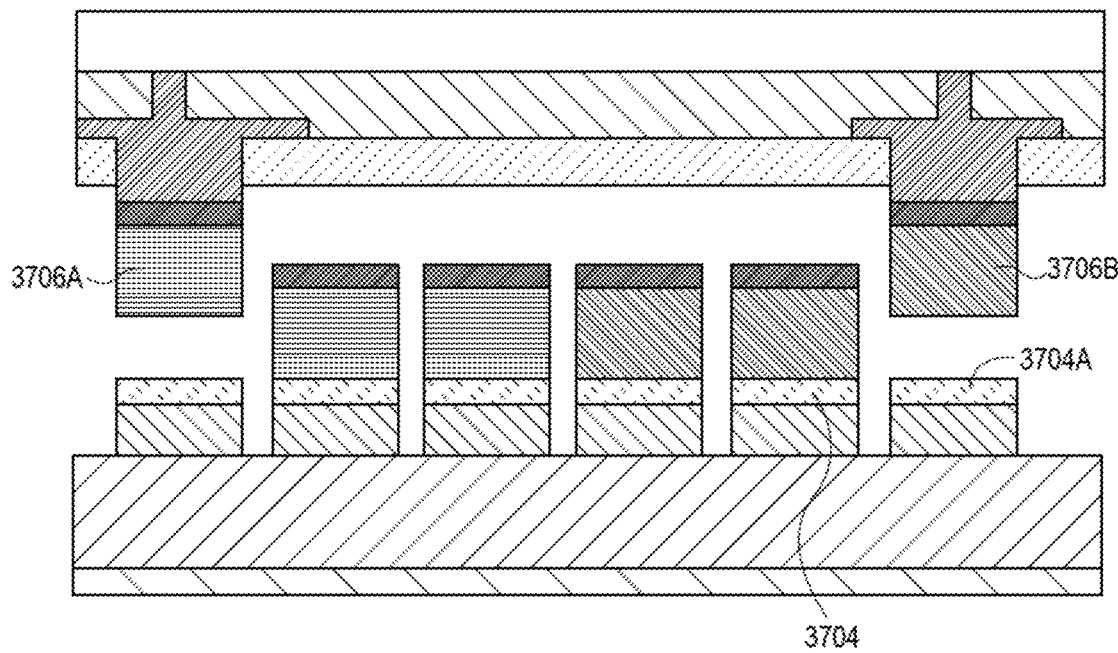

Referring to FIG. 37D, a backplane 3726 is positioned opposite the substrate 3700. The backplane 3726 includes a dielectric layer 3720 having conductive features therein. The conductive features may include reflective plates 3716 and associated vias 3718. Metal pads or bumps 3714 are on the reflective plates 3716. Mechanical separation of the micro LEDs from silicon wafer is then performed, as is depicted in FIG. 37E. Referring to FIG. 37E, release occurs at location labeled 3704A, 3706A and 3706B.

Regarding an organic color conversion layer, as used herein, the term "organic" can include polymeric materials as well as small molecule organic materials that may be used to fabricate organic optoelectronic devices. "Small molecule" refers to an organic material that is not a polymer. Small molecules may also be incorporated into polymers.

Generally, an electroluminescent OLED includes at least one organic layer between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

In an embodiment, an organic emissive layer is deposited by a technique such as thermal evaporation, ink-jet, organic vapor phase deposition (OVPD), or deposition by organic vapor jet printing (OVJP). In an embodiment, an organic emissive layer is used to convert blue light (from an inorganic blue micro LED) to red light. In an embodiment, an iridium (III) complexes is used as a phosphorescent material, e.g., (acac)Ir(btp)2 for red emission. In an embodiment, an iridium complex of 1-phenyl isoquinoline has excellent EL properties exhibits color purity of dark red with high luminous efficiency. In an embodiment, organometallic compounds including a germanium-containing substituent are used as emissive layer for red color. In particular, a suitable compound includes a phenylquinoline or phenylisoquinoline ligand having a germanium-containing substituent on the quinoline or isoquinoline portion of the ligand.

In another aspect, micro LEDs are arranged in a matrix. The micro LEDs are driven through "Data Driver" and "Scan Driver" chips. Thin film transistors are used to make "pixel driver circuits" for each micro LED. The micro LEDs are made on a silicon wafer then transferred to a glass substrate called "backplane" where the "pixel driver circuits" have been fabricated using thin film transistors.

Figure 38:
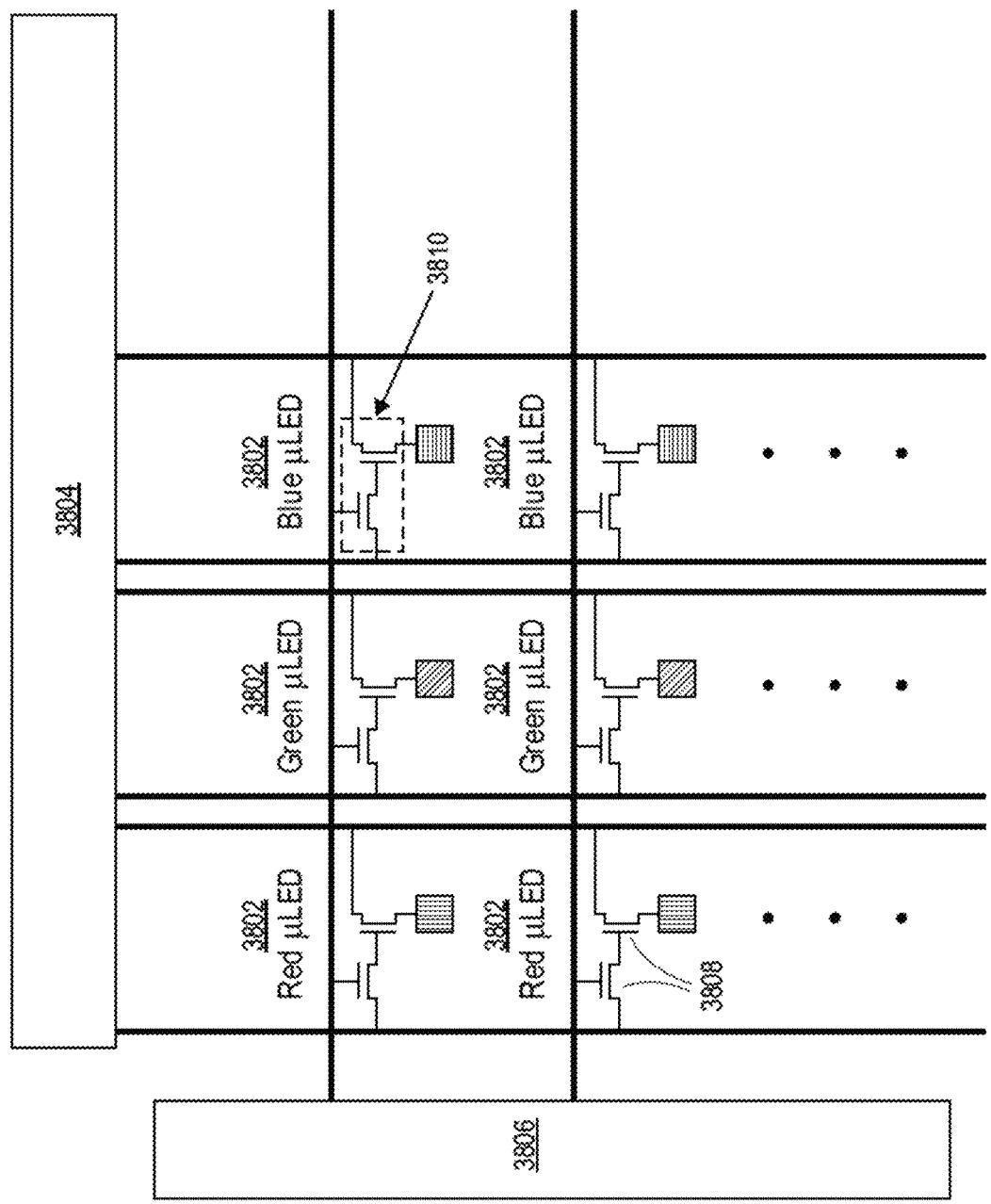
FIG. 38 is a schematic illustration of a micro light emitting diode (LED) display architecture, in accordance with an embodiment of the present disclosure.

As an example, FIG. 38 is a schematic illustration of a micro LED display architecture, in accordance with an embodiment of the present disclosure. Referring to FIG. 38, micro LEDs 3802 are arranged in a matrix. The micro LEDs 3802 are driven through "Data Driver" 3804 and "Scan Driver" 3806 chips. Thin film transistors 3808 are used to make "pixel driver circuits" 3810 for each micro LED 3802. In an embodiment, the micro LEDs 3802 are fabricated on a silicon wafer then transferred to a glass substrate called "backplane" where the "pixel driver circuits" 3810 have been fabricated using thin film transistors.

Figure 39A:
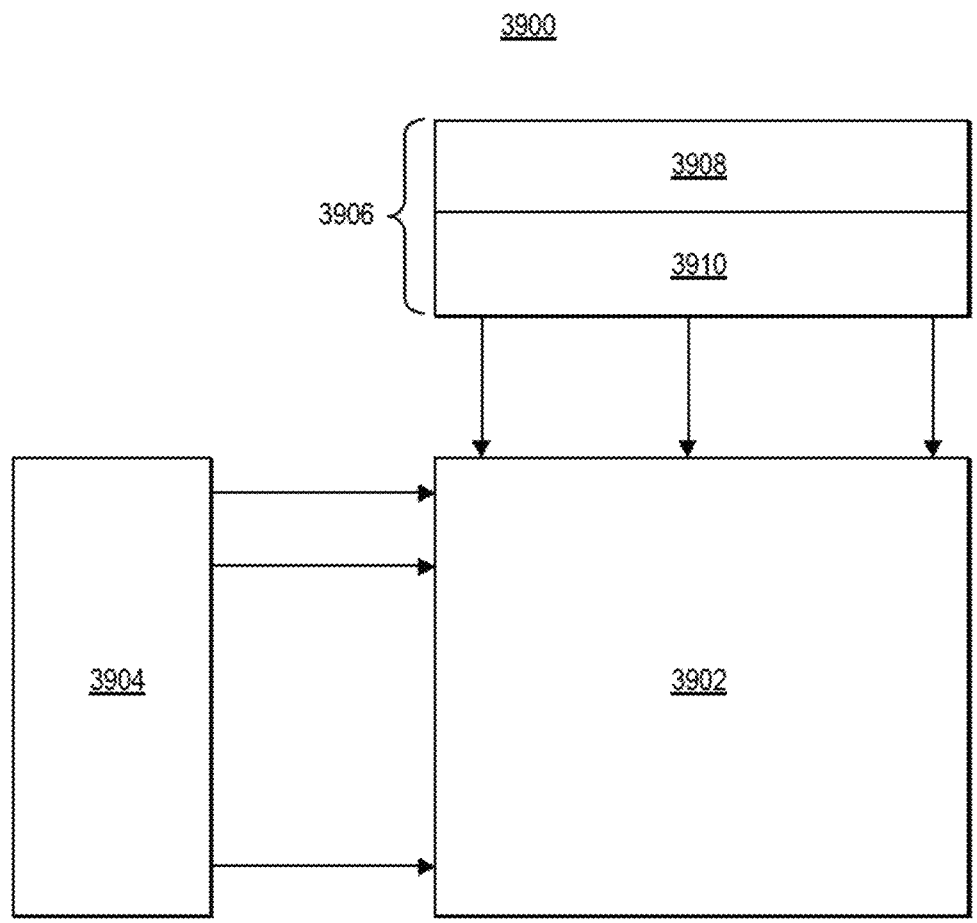
FIG. 39A is a block diagram of driver electronics architecture, in accordance with an embodiment of the present disclosure.

In accordance with one or more embodiments of the present disclosure, a pulse amplitude modulation driving scheme and circuit are described. For example, FIG. 39A is a block diagram 3900 of driver electronics architecture, in accordance with an embodiment of the present disclosure. Referring to the display system schematic of FIG. 39A, a μLED array 3902 (such as LED) is driven by a row driver 3904 and a column driver 3906. Each column driver 3906 has 8 bit SRAM 3908 and a 256 bit DAC or 10 bit PAM 3910. The output of the DAC 3910 is a pulse having an amplitude determined by the current density required to achieve peak power efficacy. The width of the pulse is a function of the integrated current density needed by the micro LED to achieve a desired gray level and brightness.

Figure 39B:
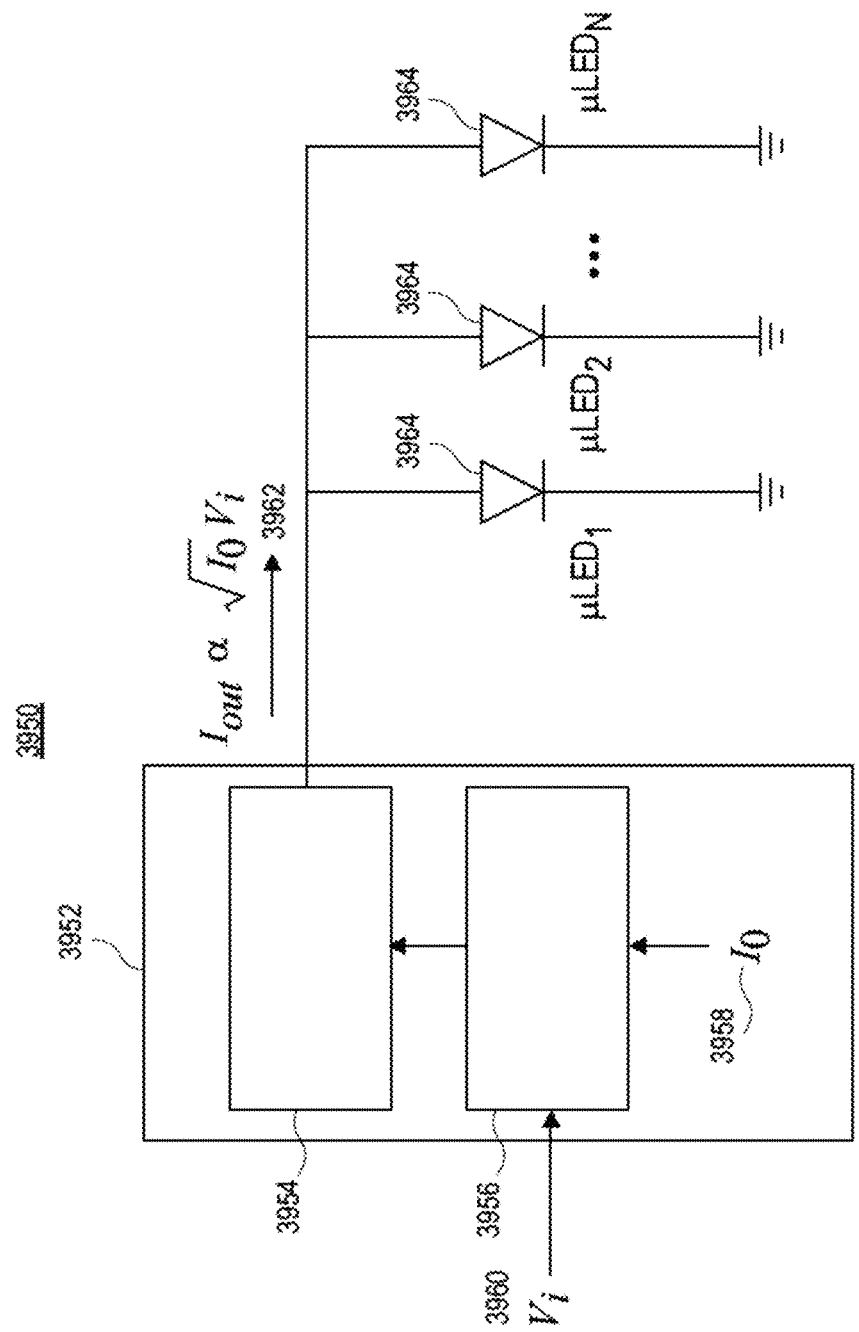
FIG. 39B is a block diagram of a pixel circuit including a linearized transconductance amplifier, in accordance with an embodiment of the present disclosure.

FIG. 39B is a block diagram of a pixel circuit including a linearized transconductance amplifier, in accordance with an embodiment of the present disclosure. Referring to FIG. 39B, a circuit 3950 includes a pixel circuit 3952. Pixel circuit 3952 includes a current mirror 3954 and a linearized transconductance amplifier 3956. A pulsed current source 3958 is provided. Input data 3960 is input to pixel circuit 3952. Output data 3962 is output from pixel circuit 3952 and used to drive one or more micro LED devices 3964.

To provide further context, μLED arrays produce their own light in response to current flowing through the individual elements of the array. A variety of different LED-like luminescent sources have been used for such displays. One or more embodiments described herein utilize electroluminescent materials in μLEDs made of, for example, GaN, InGaN, or AlInGaP materials. Electrically, such devices behave like diodes with forward "on" voltage drops ranging from 1.9 volts (V) to 5 V, depending on the color and electrode quality.

Unlike liquid crystal displays (LCDs), μLEDs are current driven devices. However, they may be similarly arranged in a two-dimensional array (matrix) of elements to form a display. Active-matrix μLED displays typically use current control circuits integrated with the display itself, with one control circuit corresponding to each individual element on the substrate, to create high-resolution color graphics with a high refresh rate. Such a structure results in a matrix of devices, where one (or more) device is formed at each point where a row overlies a column. There will generally be at least MxN devices in a matrix having M rows and N columns. Typical devices function like light emitting diodes (LEDs), which conduct current and luminesce when voltage of one polarity is imposed across them, and block current when voltage of the opposite polarity is applied. To control such individual μLED devices located at the matrix junctions, it may be useful to have two distinct driver circuits, one to drive the columns and one to drive the rows. It is conventional to sequentially scan the rows (e.g., conventionally connected to device cathodes) with a driver switch to a known voltage such as ground, and to provide another driver to drive the columns (which are conventionally connected to device anodes). In operation, information is transferred to the matrix display by scanning each row in sequence. During each row scan period, each column connected to an element intended to emit light is also driven.

In contrast to conventional integral display architecture based on liquid crystal displays (LCDs), one or more embodiments described herein include the use of a micro LED emissive display which results in overall lower power. Monolithic RGB micro LED wafers may provide full color augmented reality display arrays. Wafer-to-wafer bonding approaches described herein provide a unique device structure that can be easily detected (e.g., metal-to-metal bonding structure and the monolithic RGB pixels). A driver circuit described herein may consume relatively very little area to fit into small pixels of high efficiency displays.

Figure 40:
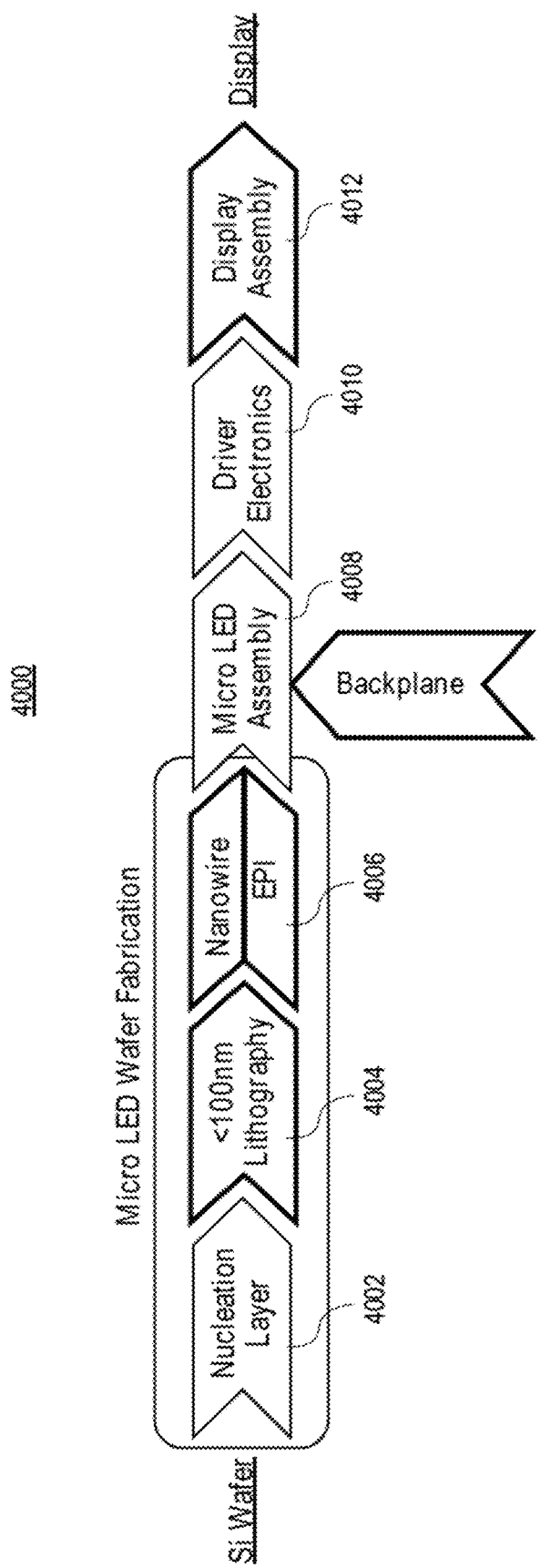
FIG. 40 is a flow diagram illustrating an RGB display production process, in accordance with an embodiment of the present disclosure.

In another aspect, FIG. 40 is a flow diagram 4000 illustrating an RGB display production process, in accordance with an embodiment of the present disclosure. Referring to flow diagram 4000, at operation 4002, a silicon (Si) wafer has a nucleation layer formed thereon, such as a patterned conductive/dielectric nucleation layer. At operation 4004, sub 100 nm lithography is used to pattern a layer on the nucleation layer, or to pattern the nucleation layer. At operation 4006, nanowire growth is performed on the nucleation layer, e.g., by epitaxial deposition. At operation 4008, a backplane is introduced into the micro LED assembly process. At operation 4010, driver electrons are fabricated. At operation 4012, display assembly is performed to finally provide a display.

Figure 41:
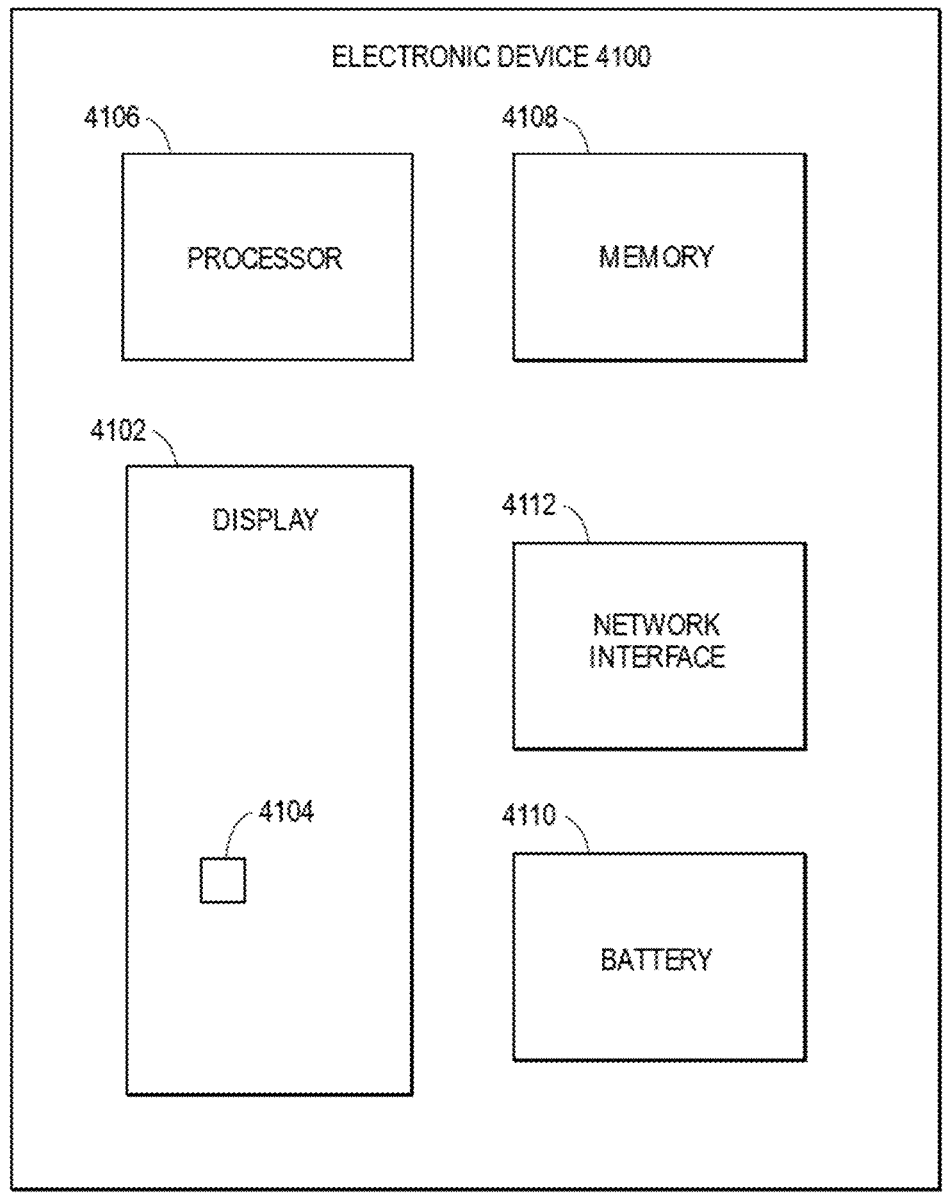
FIG. 41 is an electronic device having a display, in accordance with embodiments of the present disclosure.

FIG. 41 is an electronic device having a display, in accordance with embodiments of the present disclosure. Referring to FIG. 41, an electronic device 4100 has a display or display panel 4102 with a micro-structure 4104. The display may also have glass layers and other layers, circuitry, and so forth. The display panel 4102 may be a micro-LED display panel. As should be apparent, only one microstructure 4104 is depicted for clarity, though a display panel 4102 will have an array or arrays of microstructures including nanowire LEDs.

The electronic device 4100 may be a mobile device such as smartphone, tablet, notebook, smartwatch, and so forth. The electronic device 4100 may be a computing device, stand-alone display, television, display monitor, vehicle computer display, the like. Indeed, the electronic device 4100 may generally be any electronic device having a display or display panel.

The electronic device 4100 may include a processor 4106 (e.g., a central processing unit or CPU) and memory 4108. The memory 4108 may include volatile memory and non-volatile memory. The processor 4106 or other controller, along with executable code store in the memory 4108, may provide for touchscreen control of the display and well as for other features and actions of the electronic device 4100.

In addition, the electronic device 4100 may include a battery 4110 that powers the electronic device including the display panel 4102. The device 4100 may also include a network interface 4112 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 4100 may include additional components including circuitry and other components.

Thus, embodiments described herein include micro light-emitting diode displays having color correction films applied thereto and methods of applying color correction films to a display.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A method of fabricating a micro light emitting diode display includes applying a color correction film to a flexible transparent backing film. The method also includes placing the flexible transparent backing film over a display with the color correction film facing the display. The method also includes applying a laser to a portion of the flexible transparent backing film to eject a patch of the color correction film onto the display.

Example embodiment 2: The method of example embodiment 1, wherein the flexible transparent backing film includes a release layer, and applying the color correction film to the flexible transparent backing film includes applying the color correction film to the release layer.

Example embodiment 3: The method of example embodiment 2, wherein applying the laser to the portion of the flexible transparent backing film includes laser ablating a portion of the release layer to eject the patch of the color correction film onto the display.

Example embodiment 4: The method of example embodiment 1, 2 or 3, wherein the color correction film includes quantum dots.

Example embodiment 5: The method of example embodiment 1, 2, 3 or 4, wherein the flexible transparent backing film is a continuous roll.

Example embodiment 6: The method of example embodiment 1, 2, 3, 4 or 5, wherein the color correction film is pre-shaped into a plurality of patches prior to applying the laser.

Example embodiment 7: The method of example embodiment 1, 2, 3, 4 or 5, wherein the color correction film is a continuous film.

Example embodiment 8: The method of example embodiment 1, 2, 3, 4, 5, 6 or 7, wherein the display includes a pixel structure including a green micro light emitting diode device, a first blue micro light emitting diode device, and a second blue micro light emitting diode device.

Example embodiment 9: The method of example embodiment 8, wherein the patch of the color correction film is ejected onto a portion of the display over the second blue micro light emitting diode device.

Example embodiment 10: The method of example embodiment 9, wherein the patch of the color correction film converts blue light from the second blue micro light emitting diode device to red light.

Example embodiment 11: A method of fabricating a micro light emitting diode display includes applying a color correction film to a flexible transparent backing film. The method also includes placing the flexible transparent backing film over a display with the color correction film facing the display. The method also includes locally heating a portion of the flexible transparent backing film to melt a patch of the color correction film onto the display.

Example embodiment 12: The method of example embodiment 11, wherein locally heating the portion of the flexible transparent backing film includes heating with a laser.

Example embodiment 13: The method of example embodiment 11 or 12, wherein the flexible transparent backing film includes a release layer, and applying the color correction film to the flexible transparent backing film includes applying the color correction film to the release layer.

Example embodiment 14: The method of example embodiment 11, 12 or 13, wherein the color correction film includes quantum dots.

Example embodiment 15: The method of example embodiment 11, 12, 13 or 14, wherein the flexible transparent backing film is a continuous roll.

Example embodiment 16: The method of example embodiment 11, 12, 13, 14 or 15, wherein the color correction film is pre-shaped into a plurality of patches prior to locally heating.

Example embodiment 17: The method of example embodiment 11, 12, 13, 14 or 15, wherein the color correction film is a continuous film.

Example embodiment 18: The method of example embodiment 11, 12, 13, 14, 15, 16 or 17, wherein the display includes a pixel structure including a green micro light emitting diode device, a first blue micro light emitting diode device, and a second blue micro light emitting diode device.

Example embodiment 19: The method of example embodiment 18, wherein the patch of the color correction film is ejected onto a portion of the display over the second blue micro light emitting diode device.

Example embodiment 20: The method of example embodiment 19, wherein the patch of the color correction film converts blue light from the second blue micro light emitting diode device to red light.

Example embodiment 21: An apparatus for fabricating a micro light emitting diode display includes a module for placing a flexible transparent backing film over a display, the flexible transparent backing film having a color correction film facing the display. The apparatus also includes a laser to eject a patch of the color correction film onto the display.

Example embodiment 22: The apparatus of example embodiment 21, wherein the flexible transparent backing film is provided as a continuous roll.

Example embodiment 23: An apparatus for fabricating a micro light emitting diode display includes a module for placing a flexible transparent backing film over a display, the flexible transparent backing film having a color correction film facing the display. The apparatus also includes a laser to melt a patch of the color correction film onto the display.

Example embodiment 24: The apparatus of example embodiment 23, wherein the flexible transparent backing film is provided as a continuous roll.

What is claimed is:

1. A method of fabricating a micro light emitting diode display, the method comprising:
   applying a color correction film to a flexible transparent backing film;
   placing the flexible transparent backing film over a display with the color correction film facing the display, the display having a microgroove; and
   applying a laser to a portion of the flexible transparent backing film to eject a patch of the color correction film into the microgroove of the display, the microgroove larger than the patch of the color correction film.

2. The method of claim 1, wherein the flexible transparent backing film comprises a release layer, and applying the color correction film to the flexible transparent backing film comprises applying the color correction film to the release layer.

3. The method of claim 2, wherein applying the laser to the portion of the flexible transparent backing film comprises laser ablating a portion of the release layer to eject the patch of the color correction film onto the display.

4. The method of claim 1, wherein the color correction film comprises quantum dots.

5. The method of claim 1, wherein the flexible transparent backing film is a continuous roll.

6. The method of claim 1, wherein the color correction film is pre-shaped into a plurality of patches prior to applying the laser.

7. The method of claim 1, wherein the color correction film is a continuous film.

8. The method of claim 1, wherein the display comprises a pixel structure comprising a green micro light emitting diode device, a first blue micro light emitting diode device, and a second blue micro light emitting diode device.

9. The method of claim 8, wherein the patch of the color correction film is ejected onto a portion of the display over the second blue micro light emitting diode device.

10. The method of claim 9, wherein the patch of the color correction film converts blue light from the second blue micro light emitting diode device to red light.

11. A method of fabricating a micro light emitting diode display, the method comprising:
    applying a color correction film to a flexible transparent backing film;
    placing the flexible transparent backing film over a display with the color correction film facing the display, the display having a microgroove; and
    locally heating a portion of the flexible transparent backing film to melt a patch of the color correction film into the microgroove of the display, the microgroove larger than the patch of the color correction film.

12. The method of claim 11, wherein locally heating the portion of the flexible transparent backing film comprises heating with a laser.

13. The method of claim 11, wherein the flexible transparent backing film comprises a release layer, and applying the color correction film to the flexible transparent backing film comprises applying the color correction film to the release layer.

14. The method of claim 11, wherein the color correction film comprises quantum dots.

15. The method of claim 11, wherein the flexible transparent backing film is a continuous roll.

16. The method of claim 11, wherein the color correction film is pre-shaped into a plurality of patches prior to locally heating.

17. The method of claim 11, wherein the color correction film is a continuous film.

18. The method of claim 11, wherein the display comprises a pixel structure comprising a green micro light emitting diode device, a first blue micro light emitting diode device, and a second blue micro light emitting diode device.

19. The method of claim 18, wherein the patch of the color correction film is ejected onto a portion of the display over the second blue micro light emitting diode device.

20. The method of claim 19, wherein the patch of the color correction film converts blue light from the second blue micro light emitting diode device to red light.

* * * * *